(12) United States Patent
Lee et al.

(10) Patent No.: US 7,020,372 B2
(45) Date of Patent: Mar. 28, 2006

(54) OPTICAL DEVICES WITH ENGINEERED NONLINEAR NANOCOMPOSITE MATERIALS

(75) Inventors: Howard Wing Hoon Lee, Fremont, CA (US); Alan Hap Chin, Milpitas, CA (US); William Matthew Pfenninger, Fremont, CA (US)

(73) Assignee: UltraDots, Inc., Fremont, CA (US)

( * ) Notice: Subject to any disclaimer, the term of this patent is extended or adjusted under 35 U.S.C. 154(b) by 26 days.

(21) Appl. No.: 10/893,719

(22) Filed: Jul. 16, 2004

(65) Prior Publication Data

US 2005/0058416 A1    Mar. 17, 2005

Related U.S. Application Data

(62) Division of application No. 10/211,991, filed on Aug. 2, 2002, now Pat. No. 6,819,845.
(60) Provisional application No. 60/309,898, filed on Aug. 2, 2001, provisional application No. 60/309,905, filed on Aug. 2, 2001, provisional application No. 60/309,979, filed on Aug. 2, 2001, provisional application No. 60/310,090, filed on Aug. 2, 2001, provisional application No. 60/310,095, filed on Aug. 2, 2001.

(51) Int. Cl.
*G02B 6/10* (2006.01)
*G02B 6/00* (2006.01)

(52) U.S. Cl. ............... 385/129; 385/122; 65/386
(58) Field of Classification Search ............... 385/5, 385/16, 122, 129–132; 65/386
See application file for complete search history.

(56) References Cited

U.S. PATENT DOCUMENTS

| | | | |
|---|---|---|---|
| 3,995,311 A | 11/1976 | Taylor | |
| 4,211,467 A | 7/1980 | Cross et al. | |
| 4,332,974 A | 6/1982 | Fraas | |
| 4,557,551 A | 12/1985 | Dyott | |
| 4,688,882 A | 8/1987 | Failes | |
| 4,693,547 A | 9/1987 | Soref et al. | |
| 4,818,050 A | 4/1989 | Duthie | |
| 4,856,859 A | 8/1989 | Imoto | |
| 4,894,818 A | 1/1990 | Fujioka et al. | |
| 4,906,064 A | 3/1990 | Cheung | |
| 4,962,987 A | 10/1990 | Doran | |
| 4,973,122 A | 11/1990 | Cotter et al. | |
| 5,079,594 A | 1/1992 | Mitsuyu et al. | |
| 5,113,473 A | 5/1992 | Yoshida et al. | |
| 5,136,669 A | 8/1992 | Gerdt | |
| 5,147,841 A | 9/1992 | Wilcoxon | |
| 5,191,630 A | 3/1993 | Tajima | |
| 5,253,103 A | 10/1993 | Boyd et al. | |

(Continued)

FOREIGN PATENT DOCUMENTS

EP        0 254 509 A1    1/1988

(Continued)

OTHER PUBLICATIONS

Bley et al., "Characterization of silicon nanoparticles prepared from porous silicon," *Chem. Mater.* 8:1881-1888, 1996.

(Continued)

*Primary Examiner*—John D. Lee
*Assistant Examiner*—James D. Stein
(74) *Attorney, Agent, or Firm*—Cooley Godward LLP

(57) ABSTRACT

The invention relates to an optical device. The optical device comprises a waveguide core and a nanocomposite material optically coupled to the waveguide core. The nanocomposite material includes a plurality of quantum dots. The nanocomposite material has a nonlinear index of refraction $\gamma$ that is at least $10^{-9}$ cm$^2$/W when irradiated with an activation light having a wavelength $\lambda$ between approximately $3\times10^{-5}$ cm and $2\times10^{-4}$ cm.

21 Claims, 35 Drawing Sheets

U.S. PATENT DOCUMENTS

| | | |
|---|---|---|
| 5,260,957 A | 11/1993 | Hakimi et al. |
| 5,262,357 A | 11/1993 | Alivisatos et al. |
| 5,291,034 A | 3/1994 | Allam et al. |
| 5,307,428 A | 4/1994 | Blow et al. |
| 5,406,407 A | 4/1995 | Wolff |
| 5,432,873 A | 7/1995 | Hosoya et al. |
| 5,449,561 A | 9/1995 | Golding et al. |
| 5,449,582 A | 9/1995 | Hsieh et al. |
| 5,452,123 A | 9/1995 | Asher et al. |
| 5,459,801 A | 10/1995 | Snitzer |
| 5,460,701 A | 10/1995 | Parker et al. |
| 5,474,591 A | 12/1995 | Wells et al. |
| 5,477,377 A | 12/1995 | Golding et al. |
| 5,491,114 A | 2/1996 | Goldstein |
| 5,493,433 A | 2/1996 | Prucnal et al. |
| 5,496,503 A | 3/1996 | Kurihara et al. |
| 5,500,054 A | 3/1996 | Goldstein |
| 5,505,928 A | 4/1996 | Alivisatos et al. |
| 5,508,829 A | 4/1996 | Freeouf et al. |
| 5,527,386 A | 6/1996 | Statz |
| 5,535,001 A | 7/1996 | Tajima |
| 5,537,000 A | 7/1996 | Alivisatos et al. |
| 5,546,480 A | 8/1996 | Leonard |
| 5,559,057 A | 9/1996 | Goldstein |
| 5,559,825 A | 9/1996 | Scalora et al. |
| 5,576,248 A | 11/1996 | Goldstein |
| 5,580,655 A | 12/1996 | El-Shall et al. |
| 5,592,319 A | 1/1997 | Lee et al. |
| 5,594,818 A | 1/1997 | Murphy |
| 5,636,309 A | 6/1997 | Henry et al. |
| 5,642,453 A | 6/1997 | Margulis et al. |
| 5,646,759 A | 7/1997 | Lichtman et al. |
| 5,647,040 A | 7/1997 | Modavis et al. |
| 5,670,279 A | 9/1997 | Goldstein |
| 5,686,351 A | 11/1997 | Golding et al. |
| 5,690,807 A | 11/1997 | Clark, Jr. et al. |
| 5,695,617 A | 12/1997 | Graiver et al. |
| 5,710,845 A | 1/1998 | Tajima |
| 5,711,803 A | 1/1998 | Pehnt et al. |
| 5,728,195 A | 3/1998 | Eastman et al. |
| 5,737,102 A | 4/1998 | Asher |
| 5,740,287 A | 4/1998 | Scalora et al. |
| 5,811,030 A | 9/1998 | Aoki |
| 5,825,519 A | 10/1998 | Prucnal |
| 5,834,378 A | 11/1998 | Kurtz et al. |
| 5,840,111 A | 11/1998 | Wiederhöft et al. |
| 5,840,562 A | 11/1998 | Diep et al. |
| 5,850,064 A | 12/1998 | Goldstein |
| 5,854,868 A | 12/1998 | Yoshimura et al. |
| 5,881,200 A | 3/1999 | Burt |
| 5,888,885 A | 3/1999 | Xie |
| 5,897,331 A | 4/1999 | Sopori |
| 5,909,614 A | 6/1999 | Krivoshlykov |
| 5,932,309 A | 8/1999 | Smith et al. |
| 5,959,753 A | 9/1999 | Duling, III et al. |
| 5,963,360 A | 10/1999 | Sato et al. |
| 5,963,571 A | 10/1999 | Wingreen |
| 5,990,479 A | 11/1999 | Weiss et al. |
| 6,005,707 A | 12/1999 | Berggren et al. |
| 6,026,205 A | 2/2000 | McCallion et al. |
| 6,049,090 A | 4/2000 | Clark, Jr. |
| 6,058,127 A | 5/2000 | Joannopoulos et al. |
| 6,060,026 A | 5/2000 | Goldstein |
| 6,064,506 A | 5/2000 | Koops |
| 6,074,742 A | 6/2000 | Smith et al. |
| 6,075,203 A | 6/2000 | Wang et al. |
| 6,075,915 A | 6/2000 | Koops et al. |
| 6,084,176 A | 7/2000 | Shiratsuchi et al. |
| 6,086,794 A | 7/2000 | Nobutoki et al. |
| 6,094,273 A | 7/2000 | Asher et al. |
| 6,101,300 A | 8/2000 | Fan et al. |
| 6,139,626 A | 10/2000 | Norris et al. |
| 6,144,779 A | 11/2000 | Binkley et al. |
| 6,147,080 A | 11/2000 | Bemis et al. |
| 6,174,424 B1 | 1/2001 | Wach et al. |
| 6,179,912 B1 | 1/2001 | Barbera-Guillem et al. |
| 6,207,229 B1 | 3/2001 | Bawendi et al. |
| 6,207,392 B1 | 3/2001 | Weiss et al. |
| 6,225,198 B1 | 5/2001 | Alivisatos et al. |
| 6,225,647 B1 | 5/2001 | Kurtz et al. |
| 6,229,633 B1 | 5/2001 | Roberts et al. |
| 6,239,355 B1 | 5/2001 | Salafsky |
| 6,268,014 B1 | 7/2001 | Eberspacher et al. |
| 6,268,041 B1 | 7/2001 | Goldstein |
| 6,277,740 B1 | 8/2001 | Goldstein |
| 6,306,736 B1 | 10/2001 | Alivisatos et al. |
| 6,313,015 B1 | 11/2001 | Lee et al. |
| 6,316,715 B1 | 11/2001 | King et al. |
| 6,319,426 B1 | 11/2001 | Bawendi et al. |
| 6,322,901 B1 | 11/2001 | Bawendi et al. |
| 6,344,082 B1 | 2/2002 | Furuya et al. |
| 6,344,272 B1 | 2/2002 | Oldenburg et al. |
| 6,361,660 B1 | 3/2002 | Goldstein |
| 6,366,392 B1 | 4/2002 | Tokushima |
| 6,369,405 B1 | 4/2002 | Canham et al. |
| 6,404,940 B1 | 6/2002 | Tsuyama et al. |
| 6,407,439 B1 | 6/2002 | Hier et al. |
| 6,416,818 B1 | 7/2002 | Aikens et al. |
| 6,440,213 B1 | 8/2002 | Alivisatos et al. |
| 6,444,143 B1 | 9/2002 | Bawendi et al. |
| 6,444,897 B1 | 9/2002 | Luque-Lopez et al. |
| 6,452,092 B1 | 9/2002 | Han et al. |
| 6,456,423 B1 | 9/2002 | Nayfeh et al. |
| 6,468,808 B1 | 10/2002 | Nie et al. |
| 6,476,312 B1 | 11/2002 | Barnham |
| 6,501,014 B1 | 12/2002 | Kubota et al. |
| 6,501,091 B1 | 12/2002 | Bawendi et al. |
| 6,503,831 B1 | 1/2003 | Speakman |
| 6,514,446 B1 | 2/2003 | Smith et al. |
| 6,515,314 B1 | 2/2003 | Duggal et al. |
| 6,558,995 B1 | 5/2003 | Gilliland et al. |
| 6,560,006 B1 * | 5/2003 | Sigalas et al. ............... 359/321 |
| 6,585,947 B1 | 7/2003 | Nayfeh et al. |
| 6,631,236 B1 * | 10/2003 | Yamada ...................... 385/129 |
| 6,640,034 B1 * | 10/2003 | Charlton et al. ............ 385/122 |
| 6,819,692 B1 * | 11/2004 | Klimov et al. ................ 372/39 |
| 2001/0005495 A1 | 6/2001 | O'Brien |
| 2001/0028055 A1 | 10/2001 | Fafard et al. |
| 2001/0033371 A1 | 10/2001 | Lawandy |
| 2001/0040232 A1 | 11/2001 | Bawendi et al. |
| 2001/0055764 A1 | 12/2001 | Empedocles et al. |
| 2002/0006723 A1 | 1/2002 | Goldstein |
| 2002/0031783 A1 | 3/2002 | Empedocles et al. |
| 2002/0045045 A1 | 4/2002 | Adams et al. |
| 2002/0070121 A1 | 6/2002 | Nayfeh et al. |
| 2002/0071952 A1 | 6/2002 | Bawendi et al. |
| 2002/0074543 A1 | 6/2002 | Petroff et al. |
| 2002/0098680 A1 | 7/2002 | Goldstein |
| 2002/0110180 A1 | 8/2002 | Barney et al. |
| 2002/0127224 A1 | 9/2002 | Chen |
| 2002/0144644 A1 | 10/2002 | Zehnder et al. |
| 2002/0167254 A1 | 11/2002 | Craig et al. |
| 2003/0003300 A1 | 1/2003 | Korgel et al. |
| 2003/0008145 A1 | 1/2003 | Goldstein |
| 2003/0017264 A1 | 1/2003 | Treadway et al. |
| 2003/0034486 A1 | 2/2003 | Korgel |
| 2003/0042850 A1 | 3/2003 | Bertram et al. |
| 2003/0047816 A1 | 3/2003 | Dutta |

FOREIGN PATENT DOCUMENTS

| | | |
|---|---|---|
| EP | 0 545 595 B1 | 10/1997 |
| EP | 0859386 A1 | 8/1998 |
| EP | 0 886 167 A1 | 12/1998 |

| | | |
|---|---|---|
| EP | 0 918 245 A1 | 5/1999 |
| EP | 0774443 B1 | 5/1999 |
| EP | 1 011 008 A1 | 6/2000 |
| EP | 1160888 A1 | 12/2001 |
| EP | 1244168 A1 | 9/2002 |
| GB | 2 341 722 A | 3/2000 |
| JP | 11-264958 A | 9/1999 |
| JP | 2000-29081 A | 1/2000 |
| JP | 2000-321607 A | 11/2000 |
| WO | WO 97/06469 A1 | 2/1997 |
| WO | WO 98/34251 A1 | 8/1998 |
| WO | WO 98/36434 A1 | 8/1998 |
| WO | WO 98/46799 A1 | 10/1998 |
| WO | WO 00/07250 A1 | 2/2000 |
| WO | WO 00/10197 A1 | 2/2000 |
| WO | WO 00/22682 A2 | 4/2000 |

OTHER PUBLICATIONS

Bley et al., "a low-temperature solution phase route for the synthesis of silicon nanoclusters," *J. Am. Chem. Soc.* 118:12461-12462, 1996.

Chiu et al., "Gas phase synthesis and processing of silicon nanocrystallites: characterization by photoluminescence emission spectroscopy," *Journal of Electronic Materials* 29(3):347-354, 1994.

Cullis, "The structural and luminescence properties of porous silicon," *J. Appl. Phys.* 82(3):909-965, 1997.

Dhas et al., "Preparation of luminescent silicon nanoparticles: a novel sonochemical approach," *Chem. Mater.* 10:3278-3281, 1998.

Heath, "A liquid-solution-phase synthesis of crystalline silicon," *Science* 258:1131-1133, 1992.

Heath et al., "A liquid solution synthesis of single crystal germanium quantum wires," *Chemical Physics Letters* 208:263-268, 1993.

Heath, "Germanium quantum dots: optical properties and synthesis," *J. Chem. Phys.* 101(2):1607-1615, 1994.

Holmes et al., "Highly luminescent silicon nanocrystals with discrete optical transitions," *J. Am. Chem. Soc.* 123:3743-3748, 2001.

Kagan et al., "Long-range resonance transfer of electronic excitations in close-packed CdSe quantum-dot solids," *Phys. Rev. B* 54:8633-8643, 1996.

Kanemitsu, "Silicon and germanium nanoparticles," *Semiconductors and Semimetals* 49:157-204, 1998.

Kornowski et al., "Nanometer-sized colloidal germanium particles: wet-chemical synthesis, laser-induced crystallization and particle growth," *Advanced Materials* 5(9):634-636, 1993.

Littau et al., "A luminescent silicon nanocrystal colloid via a high-temperature aerosol reaction," *J. Phys. Chem.* 97:1224-1230, 1993.

Murray, "Synthesis and characterization of II-VI quantum dots and their assembly into 3-D quantum dot superlattices," Massachusetts Institute of Technology, thesis, Cambridge, Massachusetts, 1995.

Murray et al., "Self-organization of CdSe nanocrystallites into three-dimensional quantum dot superlattices," *Science* 270:1335-1338, 1995.

Parker, "Mighty small dots,"*S&TR Jul./Aug. 2000*:20-21.

Phely-Bobin, et al., "Characterization of Mechanically Attrited Si/SiO$_2$ Nanoparticles and Their Self-Assembled Composite Films," *Chem. Mater.* 14:1030-1036, 2002.

Prakash et al., "Nonlinear optical properties of silicon nanocrystals grown by plasma-enhanced chemical vapor deposition," *Journal of Applied Physics* 91(7):4607-4610, 2002.

Taylor et al., "Solution synthesis and characterization of quantum confined Ge nanoparticles," *Chem. Mater.* 11:2493-2500, 1999.

Vijayalakshmi, "Nonlinear optical properties of silicon nanoclusters," *Appl. Phys. Lett.* 7096:708-710, 1997.

Watanabe et al., "Soluble three-dimensional polysilane with organosilicon nanocluster structure," *Jpn. J. Appl. Phys.* 36:L1265-L1267, 1997.

Wilcoxon et al., "Optical and electronic properties of Si nanoclusters synthesized in inverse micelles," *Physical Review B* 60(4):2704-2714, 1999.

Yang et al., "Synthesis of alkyl-terminated silicon nanoclusters by a solution route," *J. Am. Chem. Soc.* 121:5191-5195, 1999.

Belomoin, et al., "Observation of a magic discrete family of ultrabright Si nanoparticles," *Applied Physics Letters* 80(5):841-843, 2002.

Berg, et al., "Quantum dot amplifiers with high output power and low noise," *Applied Physics Letters* 82(18):3083-3085, 2003.

Ding, et al., "Electrochemistry and Electrogenerated Chemiluminescence from Silicon Nanocrystal Quantum Dots," *Science* 296:1293-1297, 2002.

Garcia, et al., "Size dependence of lifetime and absorption cross section of Si nanocrystals embedded in SiO$_2$," *Applied Physics Letters* 82(10):1595-1597, 2003.

Ma, et al., "Small-Diameter Silicon Nanowire Surfaces," *Science* 299:1874-1877, 2003.

Pizzagalli, et al., "On the structure and stability of germanium nanoparticles," arXiv:cond-mat/0008145 v11-6, 2000.

Schmidt, et al., "Photoluminescence study of the initial stages of island formation for Ge pyramids/domes and hut clusters on Si(001)," *Applied Physics Letters* 72(13):1905-1907, 1999.

Tang, et al., "Spontaneous Organization of Single CdTe Nanoparticles into Luminescent Nanowires," *Science* 297:237-240, 2002.

Brus, "Quantum crystallites and nonlinear optics," *Appl. Phys. A* 53:465-474, 1991.

Brzozowski et al., "Azobenzenes for photonic network applications: third-order nonlinear optical properties," *Journal of Materials Science: Materials in Electronics* 12:483-489, 2001.

Coffer et al., "Porous silica glasses doped with quantum-confined cadmium selenide," *Journal of Non-Crystalline Solids* 142:208-214, 1992.

Cotter et al., "Nonlinear optics for high-speed digital information processing," *Science* 286:1523-1528, 1999.

Counio et al., "CdS: Mn nanocrystals in transparent xerogel matrices: synthesis and luminescence properties," *J. Phys. Chem.* 100:20021-20026, 1996.

Dabbousi et al., "(CdSe)ZnS Core-shell quantum dots: synthesis and characterization of a size series of highly luminescent nanocrystallites," *J. Phys. Chem. B* 101:9463-9475, 1997.

Doran et al., "Nonlinear-optical loop mirror," *Optics Letters* 13(1):56-58, 1988.

Friberg et al., "Ultrafast all-optical switching in a dual-core fiber nonlinear coupler," *Appl. Phys. Lett.* 51(15):1135-1137, 1987.

Gacoin et al., "Transparent sol-gel matrices doped with quantum sized PbS particles," *Mat. Res. Soc. Symp. Proc.* 358:247-252, 1995.

Gacoin et al., "New systems related to CdS nanoparticles in sol-gel matrices," *Mat. Res. Soc. Symp. Proc.* 435:643-648, 1996.

Garmire in Handbook of Optics (cd. Bass, M.) 4.1-4.80 (McGraw-Hill, New York), 2001.

Guglielmi, "Sol-gel nonlinear materials based on the incorporation of nanosize crystals and fullerence derivatives," *Critical Reviews* CR68:25-53, 1997.

Hulin et al., "Ultrafast all-optical gate with subpicosecond on and off response time," *Appl. Phys. Lett.* 49(13):749-751, 1986.

Hutchings et al., "Kramers-Krönig relations in nonlinear optics," *Optical and Quantum Electronics* 24:1-30, 1992.

Jensen, "The nonlinear coherent coupler," *IEEE Journal of Quantum Electronics* QE-18:1580-1583, 1982.

Kang et al., "1×2 all-optical switch using photochromic-doped waveguides," *Electron. Lett.* 36(19):1641-1643, 2000.

Lasers and Electro-Optics, CLEO 2001, pp. 147, 149, 151, 153, 155, 163, 173, 175, 177, 180, 182, 184, 186, 188.

Lawrence et al., "Large purely refractive nonlinear index of single crystal P-toluene sulphonate (PTS) at 1600 nm," *Electron. Lett.* 30:447-448, 1994.

Liu et al., "Fused InP-GaAs vertical coupler filters," *IEEE Photonics Technology Letters* 11:93-95, 1999.

Maier, "Self-switching of light in a directional coupler," *Sov. J. Quantum Electron* 14(1):101-104, 1984.

Murray et al., "Synthesis and characterization of nearly monodisperse CdE (E=sulfur, selenium, tellurium) semiconductor nanocrystallites," *J. Am. Chem. Soc.* 115:8706-8715, 1993.

Patela, "Nonlinear devices of integrated optics—technology and applications," *Photonics in Information Processing*, Stare Jablonki, 2000.

Peng et al., "Epitaxial growth of highly luminescent CdSe/CdS core/shell nanocrystals with photostability and electronic accessibility," *J. Am. Chem. Soc.* 119:7019-7029, 1997.

Peyghambarian, "Materials for fast switching and logic devices," *Proc. SPIE-Int. Soc. Opt. Eng.* 769(Workshop Photonic Logic Inf. Process): 28-40, 1986.

Peyghambarian et al., "Femtosecond optical nonlinearities of CdSe quantum dots," *IEEE Journal of Quantum Electronics* 25:2516-2522, 1989.

Ramaswami et al., Optical Networks: a practical perspective (Morgan kaufmann Publishers, San Francisco), pp. 199-216, 2002.

Ricolleau et al., "Correlation between structural and optical properties of PbS nanocrystals," *Journal of Crystal Growth* 166:769-733, 1996.

Samir et al., "Signal switching by a control beam in a nonlinear coupler," *J. Opt. Soc. Am. B* 11(11):2193-2205, 1994.

Sasaki et al., "Layer-by-layer assembly of titania nanosheet/polycation composite films," *Chem. Mater.* 13:4661-4667, 2001.

Schwerzel, "Nanocomposite photonic polymers, I. third-order nonlinear optical properties of capped cadmium sulfide nanocrystals in an ordered polydiacetylene host," *J. Phys. Chem. A* 102:5622-5626, 1998.

Sheik-Bahae et al., "Dispersion of bound electronic nonlinear refraction in solids," *IEEE Journal of Quantum Electronics* 27:1296-1309, 1991.

Spanhel et al., "Semiconductor clusters in the sol-gel process: synthesis and properties of CdS nanocomposites," *Journal of Non-Crystalline Solids* 147&148:657-662, 1992.

Stegeman in Handbook of Optics (cd. Bass, M.) 21.1-21.8 (McGraw-Hill, New York), 2001.

Takahashi et al., "Ultrafast high-contrast all-optical switching using spin polarization in low-temperature-grown multiple quantum wells," *Appl. Phys. Lett.* 77(19):2958-2960, 2000.

Tykwinski et al., "Structure-property relationships in third-order nonlinear optical chromophores," *J. Phys. Chem. B* 102:4451-4465, 1998.

Williams et al., "Picosecond all-optical logic gate in a nonlinear organic cialon," *Appl. Phys. Lett.* 57(23):2399-2401, 1990.

Wong et al., "Synthesis and third-order nonlinear optical properties of end-functionalized oligo-phenylenevinylenes," *Chem. Mater.* 14:2999-3004, 2002.

Zhang et al., "A novel low-threshold all-optical switch," *SPIE* 3556:189-196, 1998.

Agarwal et al., "Tailoring the photonic band gap of a porous silicon dielectric mirror," *Appl. Phys. Lett.* 82(10):1512-1514, 2003.

Ago, et al., "Composites of Carbon Nanotubes and Conjugated Polymers for Photovoltaic Devices," *Advanced Materials* 11(15):1281-1285, 1999.

Anderson, "On quantum well solar cell efficiencies," *Physica E* 14:126-131, 2002.

Aroutiounian, et al., "Quantum dot solar cells," *Journal Of Applied Physics* 89(4):2268-2271, 2001.

The University of New South Wales, "The Generation Photovoltaics 2002 Annual Report," *Special Research Centre for Third Generation Photovoltaics*, 1-35, 2002.

Akazawa, "Self-limiting size control of hemispherical grains of microcrystalline Si self-assembled on an amorphous Si film surface," *Applied Physics Letters* 82(9):1464-1466, 2003.

Barnham, et al., "Quantum-dot concentrator and thermodynamic model for the global redshift," *Applied Physics Letters* 76(9):1197-1199, 2000.

Barnham, et al., "Quantum well solar cells," *Physica E* 14:27-36, 2002.

Brunhes, et al., "Electroluminescence of Ge/Si self-assembled quantum dots grown by chemical vapor deposition," *Applied Physics Letters* 77(12):1822-1824, 2000.

Capellini, et al., "Ordering self-assembled islands without substrate patterning," *Applied Physics Letters* 82(11):1772-1774, 2003.

Das, et al., "High-Efficiency solar cells based on semiconductor Nanostructures," *Solar Energy Materials & Solar Cells* 63:117-123, 2000.

Dashiell, et al., "Photoluminescence investigation of phononless radiative recombination and thermal-stability of germanium hut clusters on silicon(001)," *Applied Physics Letters* 79(14):2261-2263, 2001.

Diehl, et al., "Electroluminescence from strain-compensated $Si_{0.2}Ge_0$/Si quantum-cascade structures based on a bound-to-continuum transition," *Applied Physics Letters* 81(25):4700-4702, 2002.

Elkurdi, et al., "Near-infrared waveguide photodetector with Ge/Si self-assembled quantum dots," *Applied Physics Letters* 80(3):509-511, 2002.

Floyd et al., "Nanometer-scale composition measurements of Ge/Si(100) islands," *Applied Physics Letters* 82(9):1473-1475, 2003.

Gebeyehu, et al., "The interplay of efficiency and morphology in photovoltaic devices based on interpenetrating networks of conjugated polymers with fullerenes," *Synthetic Metals* 118:1-9, 2001.

Goetzberger, et al., "Solar cells: past, present, future," *Solar Energy Materials & Solar Cells* 74:1-11, 2002.

Green, "Third Generation Photovoltaics: Ultra-high Conversion Efficiency at Low Cost," *Prog. Photovolt: Res. Appl.* 9:123-135, 2001.

Green, "Third generation photovoltaics: solar cells for 2020 and beyond," *Physica E* 14:65-70, 2002.

Honsberg, et al., "Design trade-offs and rules for multiple energy level solar cells," *Physica E* 14:136-141, 2002.

Huynii, et al., "CdSe Nanocrystal Rods/Poly(3-hexylthiophene) Composite Photovoltaic Devices," *Adv. Mater.* 11(11):923-927, 1999.

Huynh, et al., "Hybrid Nanorod-Polymer Solar Cells," *Science* 295:2425-2427, 2002.

Könenkamp, et al., "Nano-structures for solar cells with extremely thin absorbers," *Physica E* 14:219-223, 2002.

Konle, et al., "Self-assembled Ge-islands for photovoltaic applications," *Physica E* 16:596-601, 2003.

Kuznicki, "Enhanced absorption and quantum efficiency in locally modified single-crystal Si," *Applied Physics Letters* 81(25):4853-5855, 2002.

Kymakis, et al., "Single-wall carbon nanotube/conjugated polymer photovoltaic devices," *Applied Physics Letters* 80(1):112-114, 2002.

Lander, et al., "SiGe Heterojunction pMOSFETs," *Philips*, date not listed.

Lundszien, et al., "Band-gap profiling in amorphous silicon-germanium solar cells," *Applied Physics Letters* 80(9):1655-1657, 2002.

Meissner, et al., "Photovoltaics of interconnected networks," *Synthetic Metals* 121:1551-1552, 2001.

Melosh, et al., "Ultrahigh-Density Nanowire Lattices and Circuits," *Science* 300:112-115, 2003.

Morf, "Unexplored opportunities for nanostructures in photovoltaics," *Physica E* 14:78-83, 2002.

Nozik, "Quantum dot solar cells," *Physica E* 14:115-120, 2002.

Plass et al., "Quantum Dot Sensitization of Organic-Inorganic Hybrid Solar Cells" *J. Phys. Chem. B, 106*, 7578-7580, 2002.

Qi, et al., "Spectroscopy of individual silicon nanowires," *Applied Physics Letters* 82(16):2616-2618, 2003.

Queisser, "Photovoltaic conversion at reduced dimensions," *Physica E* 14:1-10, 2002.

Raffaelle, et al., "Nanomaterials for Space Solar Power for Space Solar Power," *Space Solar Power Concept & Technology Maturation (SCTM) Program Technical Interchange Meeting*, 2002.

Raffaelle, et al., "Quantum Dot Solar Cells," *Prog. Photovolt: Res. Appl.* 10:433-439, 2002.

Ragan, et al., "Nonlithographic epitaxial $Sn_xGe_{1-x}$ dense nanowire arrays grown on Ge(001)," *Applied Physics Letters* 82(20):3439-3441, 2003.

Rebohle, et al., "Energy level engineering in InAs quantum dot nanostructures," *Applied Physics Letters* 81(11)2079-2081, 2002.

Roth, et al., "Self-assembled gradient nanoparticle-polymer multilayers investigated by an advanced characterization method: microbeam grazing incidence x-ray scattering," *Applied Physics Letters* 82(11):1935-1937, 2003.

Sutter, et al., "Continuous formation and faceting of SiGe islands on Si(100)," *Applied Physics Letters* 82(20):3454-3456, 2003.

Tada Tetsuya, "Fabrication of Si Nanopillars and its Application", AIST Today 3:2:10, 2003.

Tennakone, et al., "A dye-sensitized nano-porous solid-state photovoltaic cell," *Semicond. Sd. Technol.* 10:1689-1693, 1995.

Tessler, et al., "Efficient Near-Infrared Polymer Nanocrystal Light-Emitting Diodes," *Science* 295:1506-1508, 2002.

Trindade, et al., "Nanocrystalline Semiconductors: Synthesis, Properties, and Perspectives," *Chem. Mater.* 13: 3843-3858, 2001.

Trupke, et al., "Very efficient light emission from bulk crystalline silicon," *Applied Physics Letters* 82(18):2996-1998, 2003.

Underwood, et al., "Charge carrier dynamics in CdSe nanocrystals: implications for the use of quantum dots in novel photovoltaics," *Eur. Phys. J. D* 16:241-244, 2001.

Vescan, et al., "Self-assembling of Ge on finite Si(001) areas comparable with the island size," *Applied Physics Letters* 82(20):3517-3519, 2003.

Rakovich, Y.P., et al, Third-Order Nonlinearities in Thin Films of CdS Nanocrystals Phys. Stat. Sol. (b) vol. 1, 319-324 (2001).

Liu, F., et al., Enhancement of third-order nonlinearity of nanocrystalline GaSb embedded in silica film Materials Science and Engineering, vol. B76,-161-164 (2000).

* cited by examiner

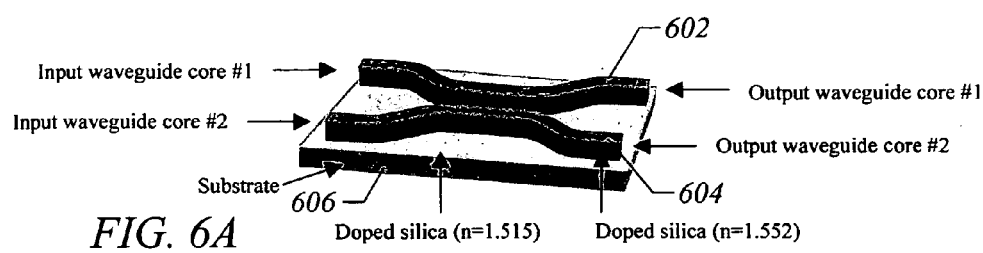
FIG. 6A
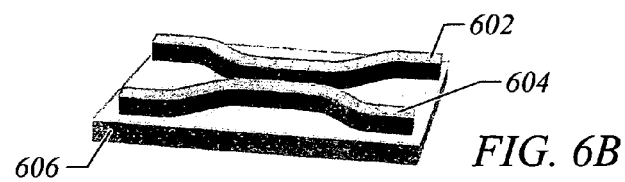
FIG. 6B
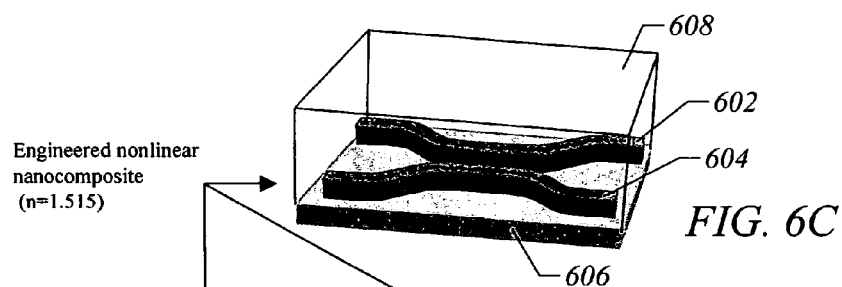
FIG. 6C
FIG. 6D   FIG. 6E
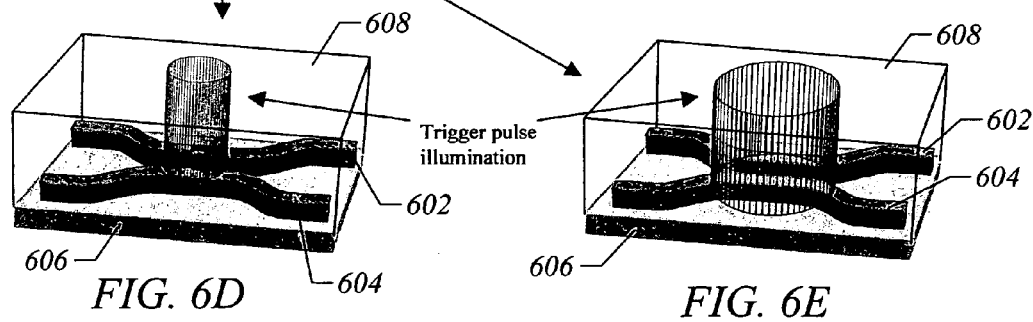
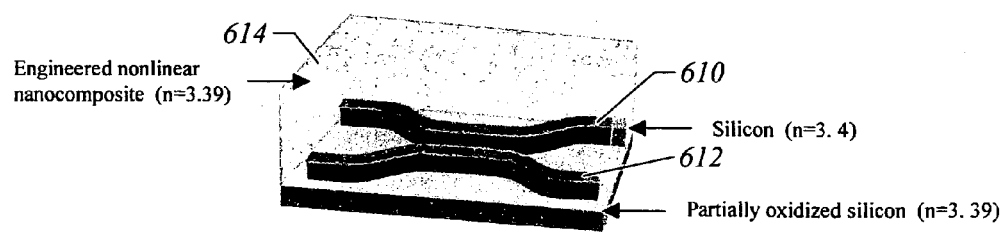
FIG. 6F

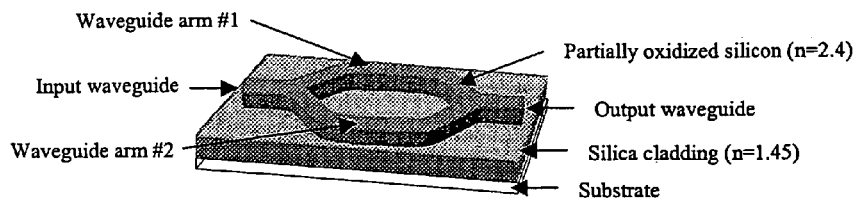
FIG. 7A
MZI with cladding on 3 sides
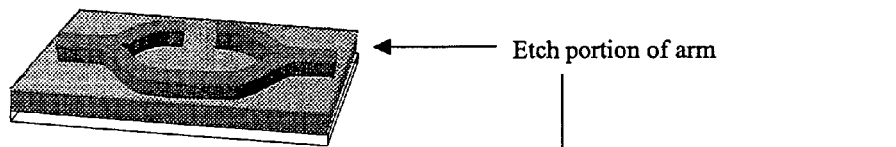
FIG. 7B — Etch portion of arm
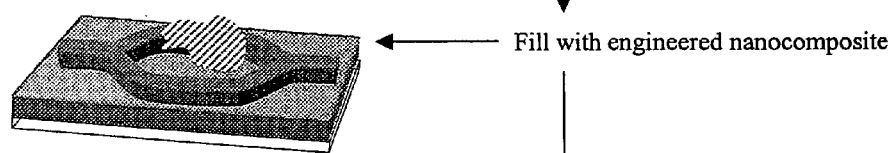
FIG. 7C — Fill with engineered nanocomposite
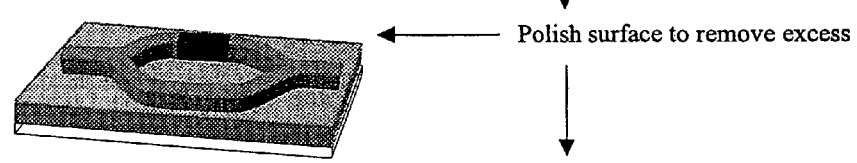
FIG. 7D — Polish surface to remove excess
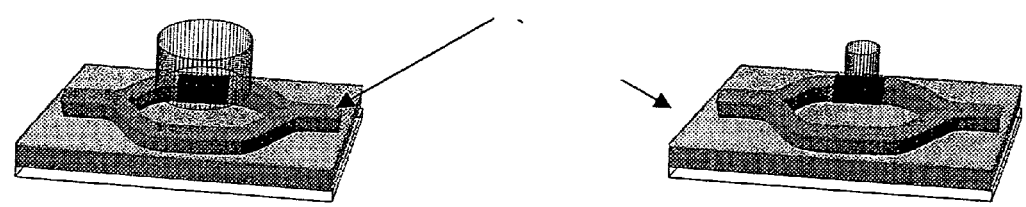
Illuminate active material to 'switch'
FIG. 7E          FIG. 7F MZI with cladding on 3 sides Coat surface with engineered nanocomposite Remove excess Illuminate active region

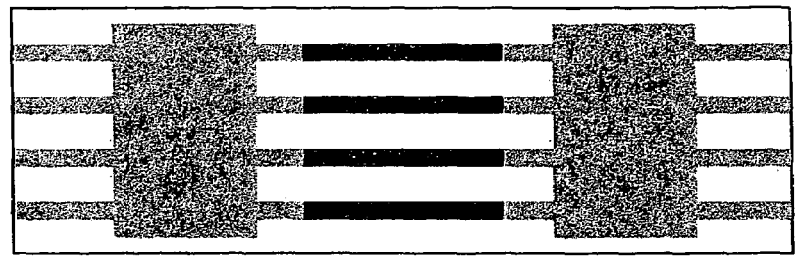
Generic device with active cores
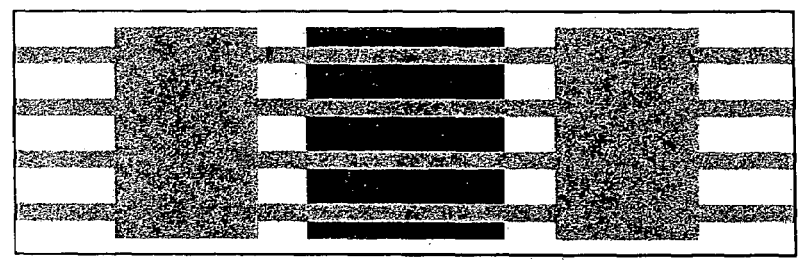
Generic device with active cladding
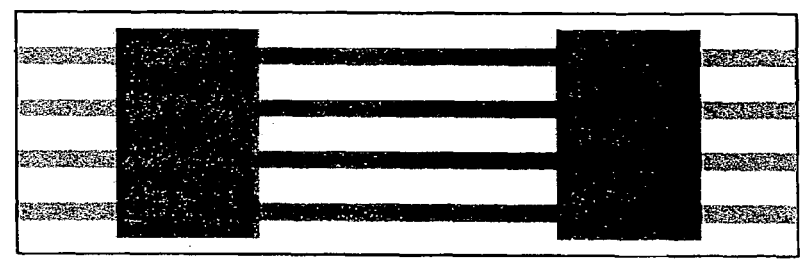
Generic device with active cores and MMIs
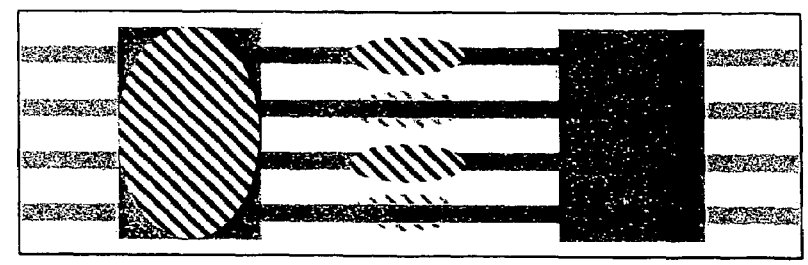
Generic device with activated cores and MMIs
FIG. 27A
FIG. 27B
FIG. 27C
FIG. 27D $n_0 > n_1 > n_2$

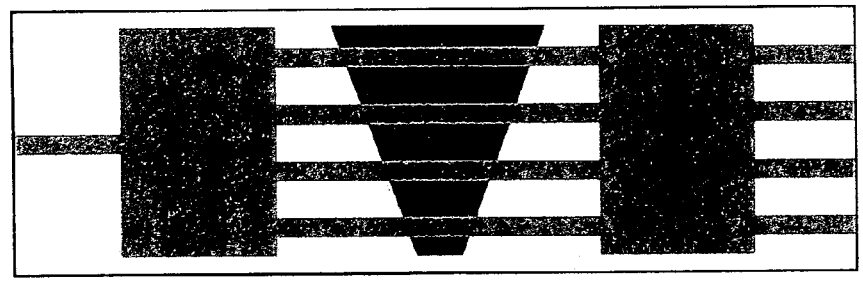
Linear AWG with modulated index cladding
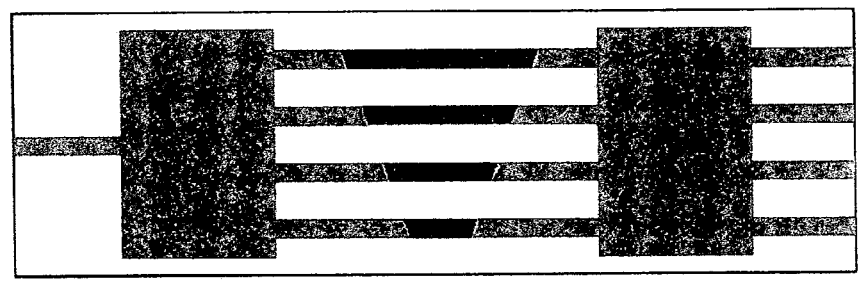
Linear AWG with modulated index cores
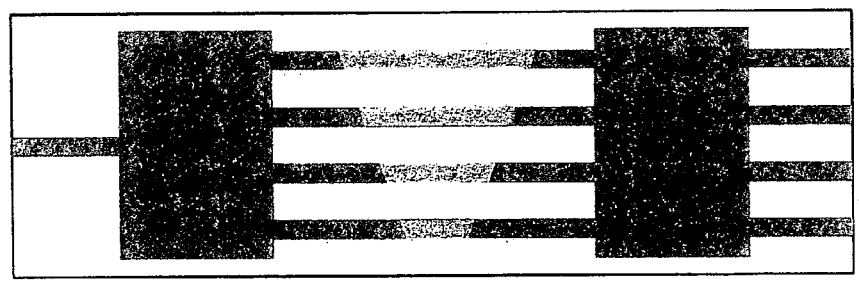
Linear AWG with silicon section cores

OPTICAL DEVICES WITH ENGINEERED NONLINEAR NANOCOMPOSITE MATERIALS

This application is a divisional of U.S. patent application Ser. No. 10/211,991, filed on Aug. 2, 2002 now U.S. Pat. No. 6,819,845, which claims the benefit of U.S. Provisional Application Ser. No. 60/309,898, filed on Aug. 2, 2001, U.S. Provisional Application Ser. No. 60/309,905, filed on Aug. 2, 2001, U.S. Provisional Application Ser. No. 60/309,979, filed on Aug. 2, 2001, U.S. Provisional Application Ser. No. 60/310,090, filed on Aug. 2, 2001, and U.S. Provisional Application Ser. No. 60/310,095, filed on Aug. 2, 2001, the disclosures of which are incorporated herein by reference in their entirety.

FIELD OF THE INVENTION

This invention relates generally to optical devices. More particularly, this invention relates to optical devices comprising engineered nonlinear nanocomposite materials.

BACKGROUND OF THE INVENTION

As telecommunication networks continue to expand their need for bandwidth, it is becoming increasingly necessary to introduce new technologies to keep up with growing demands. These technologies should not only facilitate the need for bandwidth but also be easily incorporated into today's network infrastructure. At the same time, they should be flexible and versatile enough to fit the requirements of the future. While current telecommunication systems comprise a combination of electronic and optical data-transmission, there is pressure to move towards all-optical networks due to the increased bandwidth provided by high bit-rates and parallel transmission through wavelength division multiplexing.

Currently, optical networks use light for much of the transmission of data between nodes in an optical circuit. Optical cross-connects function as switches in these nodes by routing signals arriving at one input-port to one of a variety of output-ports. Most current optical cross-connect systems comprise high-speed electronic cores, which are complex, cumbersome, and expensive. These switches typically require a light signal to be translated into an electronic signal, which is switched or routed to an output-port before being reconverted to a light signal. The complexity, size, and expense of such optical-to-electronic-to-optical (OEO) components become even more problematic with higher bit-rates and port counts, even as the cost of electronic components decreases, due to cross-talk and RF transport issues.

OEO devices are typically the rate-limiting component in an optical network. As such, many options are being considered to reduce the need for both OEO conversions, as well as electronic-signal processing in optical network components. This has lead to emphasis being placed on the development of "all-optical" switching technology, in which optical signals passing through a switch are diverted to the appropriate destination without being converted to electronic signals.

For most current applications, electronically controlled optical cross-connects with optical-cores can be used as an all-optical switch. In these devices, light routing does not require OEO conversion, but operation of the switch is electronically controlled. The various all-optical switching technologies that currently support such systems include electromechanical switches (e.g., MEMS or bulk optics), thermo-optic switches (e.g., phase shift, capillary, or "bubble"), and electro-optic switches (e.g., $LiNbO_3$ or liquid crystal). In addition, a variety of nonlinear optical switches (e.g., semiconductor optical amplifiers) use a light beam, rather than electronics, to operate the switch.

Many all-optical switching technologies are relatively slow and are therefore generally limited to static configuration control. For example, applications such as basic fiber/wavelength routing, provisioning, and restoration typically require switching speeds around 1 ms. These relatively slow all-optical switches, however, are generally inadequate for fast switching applications such as dynamic packet switching (~1 ns), optical modulation (~100 ps), header reading in packet switched networks (<25 ps), and all-optical data-processing (<1 ps).

Currently, devices based on electric field-induced optical changes, such as the electro-optic effect (a $\chi^{(2)}$ effect) and electro-absorption (a $\chi^{(3)}$ effect) are utilized for optical modulation and switching. However, these devices are rapidly approaching their speed limits, as they rely on fast electronic signals in order to perform optical processing or modulation, and these electronic signals suffer increasingly greater losses due to the fundamental limitations of high-speed electrical propagation. Devices based on nonlinear optical phenomena, such as cross-gain modulation (XGM) in semiconductor optical amplifiers, $\chi^{(2)}$ based phenomena (e.g., difference-frequency mixing (DFM)), and $\chi^{(3)}$ (or Kerr) based phenomena (e.g., cross-phase modulation (XPM) and four-wave mixing (FWM)), have the potential to switch at rates required for packet-switching, optical data processing, and other future high-speed switching applications. Devices based on such phenomena have the potential (depending on the mechanism) for switching speeds approaching (and even exceeding) ten terabits per second (10 Tbit/s), or 10 trillion bits per second. Of these nonlinear optical phenomena, $\chi^{(3)}$ based phenomena have the most flexibility but currently suffer from a lack of practical materials with both high nonlinearity and relatively low loss.

Research involving the development of $\chi^{(3)}$ based all-optical devices has been extensively pursued since the mid-1980s and has primarily focused on silica fiber-based devices. This is due to the relatively large figure-of-merit (FOM) for nonlinear optical switching for silica. There are many practical definitions of a FOM that take into account the many parameters that can be important and relevant to all-optical switching. One example of such a FOM is defined as $\alpha n/\alpha \tau$, where $\Delta n$ is the induced refractive index change, $\alpha$ is the linear and nonlinear absorption coefficient, and $\tau$ is the response time of the material. For this FOM, which is particularly relevant for resonant optical nonlinearities where light absorption is used, the larger the FOM, the better will be the performance of the all-optical switching. A definition of a FOM useful for nonresonant optical nonlinearities, where ideally no or little light absorption occurs, is $2\gamma/\beta\lambda$, where $\gamma$ is the nonlinear index of refraction, $\beta$ is the two-photon absorption coefficient, and $\lambda$ is the wavelength of operation. In this case, useful all-optical switching typically occurs when FOM>1. Due to the low linear and nonlinear losses of light at telecommunication wavelengths in silica, the FOM for silica is adequate even though $\Delta n$ and $\gamma$ (which are related to $Re[\chi^{(3)}_{1111}]$) are small.

Many all-optical switching devices have been demonstrated using silica fiber (e.g., nonlinear directional couplers, nonlinear optical loop mirrors, and soliton-based switches). Due to the small $\gamma$ of silica, however, impractical fiber lengths (~1000 km) are required for these devices to operate at typical telecommunication powers (~10 mW). As a result, there is a great deal of interest in developing materials with both a large FOM and a large γ to reduce overall device sizes and latency. For certain applications, device sizes ~1 mm or less are desirable for integration of multiple devices and to provide insensitivity to temperature fluctuations and manufacturing fluctuations (e.g., tight tolerance over long distances). In addition, low latency is needed as the data rates increase.

In addition to large nonlinearities with large FOMs, it is desirable that commercial optical switching components are low cost and compatible with high-throughput automated fabrication. Historically, semiconductor processing, used to make microprocessor chips, has been one of the most cost-effective and automated processes for miniaturization. While this technology is extremely advanced in the field of microelectronics, it is still in its infancy with respect to optics. For instance, for $\chi^{(2)}$ based devices, crystalline. $LiNiO_3$ cannot be arbitrarily inserted within a waveguide created by these techniques. In addition, polymeric nonlinear materials, which are more easily processed, typically have values for $\chi^{(3)}$ that are too low for efficient switching.

Presently, there are a variety of approaches being pursued to reduce the size of $\chi^{(3)}$ based all-optical switches. Approaches being considered include using semiconductor optical amplifiers (SOAs), manufacturing photonic bandgap structures with nonlinear materials, enhancing nonresonant optical nonlinearities using local field effects, and developing new crystalline materials and polymeric materials with high optical nonlinearities.

While proof-of-concept for all-optical switches based on SOAs has been shown, problems with amplified spontaneous emission buildup currently make cascading many of these switches problematic. In addition, the materials used for SOAs (typically InP) are expensive and create inherent difficulties with coupling to standard silica fibers and waveguides. Photonic bandgap materials are another promising approach, but manufacturing using the previously proposed materials is still beyond current practical capabilities. While enhancing nonlinearities using local field effects is an interesting approach, enhancement factors of only ~10× have been achieved to date. Finally, new nonlinear crystalline materials have been developed (e.g. periodically poled $LiNbO_3$ and p-toluene sulphonate (PTS)) but are typically expensive and difficult to process, making incorporation into waveguide devices problematic. Nonlinear polymers, with more appealing mechanical properties, have also been developed, but problems such as kinks in the polymer chains can limit the maximum nonlinearity to a value still unsuitable for practical all-optical applications. In cases where highly nonlinear polymers have been produced (e.g., polyacetylene), many of the appealing mechanical properties are lost, creating problems similar to those found in crystalline materials.

In addition to high nonlinearity and processability, nonlinear materials desirably should also be low-loss in the wavelength range-of-interest (e.g., from absorption or scattering). These materials desirably should also have a linear index of refraction that is compatible with the specific architecture of the device in which they are to be used (e.g., a nonlinear waveguide core should have an index of refraction higher than the cladding surrounding it). As such, it has been extremely difficult to find a practical material that simultaneously satisfies various requirements for a commercial $\chi^{(3)}$ based nonlinear device.

An ideal $\chi^{(3)}$ based nonlinear optical material should have a number of characteristics, which can include the following:

1. Large $Re[\chi^{(3)}_{ijkl}]$ in the wavelength range-of-interest ($Re[\chi^{(3)(3)}_{1111}]$ is directly related to Δn and γ).
2. Low optical losses from single- and multi-photon absorption and/or resonant and nonresonant scattering in the wavelength range-of-interest. Ideally, the photon energies corresponding to the wavelength range-of-interest are such that the two-photon absorption threshold is not met (i.e., the sum of the two photon energies are lower than the resonance energy), so that two-photon absorption and higher multi-photon absorptions are negligible.
3. A multi-photon transition near the wavelength range-of-interest such that resonant and near resonant enhancement of $\chi^{(3)}$ occurs (but ideally no or little multi-absorption occurs).
4. A precisely selected linear index of refraction compatible with the desired application (e.g., waveguides) and intended device architecture.
5. Physical and chemical compatibility with the specific device architecture and materials with which the material will be used.
6. The ability to be processed for incorporation into optical devices.
7. Low cost of manufacturing and incorporating the material.

While many materials may have one or more of these desirable characteristics, at present, no single material comprises a sufficient number of these characteristics required for an optimal $\chi^{(3)}$ based optical switch. In fact, besides SOAs, no commercial devices are currently available, primarily due to a lack of appropriate nonlinear optical materials.

It is against this background that a need arose to develop the optical devices described herein.

SUMMARY OF THE INVENTION

In one innovative aspect, the present invention relates to an optical device. In one embodiment, the optical device comprises a waveguide core and a nanocomposite material optically coupled to the waveguide core. The nanocomposite material includes a plurality of quantum dots, and the nanocomposite material has a nonlinear index of refraction γ that is at least $10^{-9}$ cm$^2$/W when irradiated with an activation light having a wavelength λ between approximately $3\times10^{-5}$ cm and $2\times10^{-4}$ cm.

In another embodiment, the optical device comprises a waveguide core including a portion formed of a nanocomposite material. The nanocomposite material includes a matrix material and a plurality of quantum dots dispersed in the matrix material. A quantum dot of the plurality of quantum dots includes a core that includes a semiconductor material selected from the group consisting of Si and Ge, and the quantum dot is substantially defect free such that the quantum dot exhibits photoluminescence with a quantum efficiency that is greater than 10 percent.

In a further embodiment, the optical device comprises a film formed of a nanocomposite material. The nanocomposite material includes a plurality of quantum dots, and the nanocomposite material has a nonlinear index of refraction γ that is at least $10^{-9}$ cm$^2$/W when irradiated with an activation light having a wavelength λ between approximately $3\times10^{-5}$ cm and $2\times10^{-4}$ cm. The optical device also comprises a light source optically coupled to the film. The light source is configured to irradiate the film with the activation light using a predetermined illumination pattern.

BRIEF DESCRIPTION OF THE DRAWINGS

For a better understanding of the nature and objects of the invention, reference should be made to the following detailed description taken in conjunction with the accompanying drawings, in which:

FIGS. 6(a), 6(b), 6(c), 6(d), 6(e), and 6(f) illustrate nonlinear directional couplers comprising engineered nonlinear nanocomposite materials, according to some embodiments of the invention.

FIGS. 7(a), 7(b), 7(c), 7(d), 7(e), and 7(f) illustrate an embodiment of a nonlinear Mach-Zehnder (MZ) interferometer comprising an engineered nonlinear nanocomposite material.

FIGS. 27(a), 27(b), 27(c), and 27(d) illustrate preferred embodiments of generic optical devices.

FIGS. 29(a), 29(b), and 29(c) illustrate three preferred embodiments of Linear Arrayed Waveguide Devices.

DETAILED DESCRIPTION OF THE INVENTION

Definitions

Figure 1A:
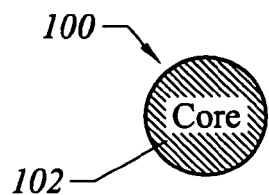
FIGS. 1(a), 1(b), 1(c), and 1(d) illustrate quantum dots according to some embodiments of the invention.

The following definitions may apply to some of the elements described with regard to some embodiments of the invention. These definitions may likewise be expanded upon herein.

As used in this specification and the appended claims; the singular forms "a", "an", and "the" include plural references unless the content clearly dictates otherwise. Thus, for example, reference to "a quantum dot" includes a mixture of two or more such quantum dots and may include a population of such quantum dots.

"Optional" or "optionally" means that the subsequently described event or circumstance may or may not occur and that the description includes instances where the event or circumstance occurs and instances in which it does not. For example, the phrase "optionally surrounded with a shell" means that the shell may or may not be present and that the description includes both the presence and absence of such a shell.

Embodiments of the invention relate to a class of novel materials comprising quantum dots. As used herein, the terms "quantum dot", "dot", and "nanocrystal" are synonymous and refer to any particle with size dependent properties (e.g., chemical, optical, and electrical properties) along three orthogonal dimensions. A quantum dot can be differentiated from a quantum wire and a quantum well, which have size-dependent properties along at most one dimension and two dimensions, respectively.

It will be appreciated by one of ordinary skill in the art that quantum dots can exist in a variety of shapes, including but not limited to spheroids, rods, disks, pyramids, cubes, and a plurality of other geometric and non-geometric shapes. While these shapes can affect the physical, optical, and electronic characteristics of quantum dots, the specific shape does not bear on the qualification of a particle as a quantum dot.

For convenience, the size of quantum dots can be described in terms of a "diameter". In the case of spherically shaped quantum dots, diameter is used as is commonly understood. For non-spherical quantum dots, the term diameter, unless otherwise defined, refers to a radius of revolution (e.g., a smallest radius of revolution) in which the entire non-spherical quantum dot would fit.

A quantum dot will typically comprise a "core" of one or more first materials and can optionally be surrounded by a "shell" of a second material. A quantum dot core surrounded by a shell is referred to as a "core-shell" quantum dot.

The term "core" refers to the inner portion of the quantum dot. A core can substantially include a single homogeneous monoatomic or polyatomic material. A core can be crystalline, polycrystalline, or amorphous. A core may be "defect" free or contain a range of defect densities. In this case, "defect" can refer to any crystal stacking error, vacancy, insertion, or impurity entity (e.g., a dopant) placed within the material forming the core. Impurities can be atomic or molecular.

While a core may herein be sometimes referred to as "crystalline", it will be understood by one of ordinary skill in the art that the surface of the core may be polycrystalline or amorphous and that this non-crystalline surface may extend a measurable depth within the core. The potentially non-crystalline nature of the "core-surface region" does not change what is described herein as a substantially crystalline core. The core-surface region optionally contains defects. The core-surface region will preferably range in depth between one and five atomic-layers and may be substantially homogeneous, substantially inhomogeneous, or continuously varying as a function of position within the core-surface region.

Quantum dots may optionally comprise a "shell" of a second material that surrounds the core. A shell can include a layer of material, either organic or inorganic, that covers the surface of the core of a quantum dot. A shell may be crystalline, polycrystalline, or amorphous and optionally comprises dopants or defects. The shell material is preferably an inorganic semiconductor with a bandgap that is larger than that of the core material. In addition, preferred shell materials have good conduction and valence band offsets with respect to the core such that the conduction band is desirably higher and the valence band is desirably lower than those of the core. Alternatively, the shell material may have a bandgap that is smaller than that of the core material, and/or the band offsets of the valence or conduction bands may be lower or higher, respectively, than those of the core. The shell material may be optionally selected to have an atomic spacing close to that of the core material.

Shells may be "complete", indicating that the shell substantially completely surrounds the outer surface of the core (e.g., substantially all surface atoms of the core are covered with shell material). Alternatively, the shell may be "incomplete" such that the shell partially surrounds the outer surface of the core (e.g., partial coverage of the surface core atoms is achieved). In addition, it is possible to create shells of a variety of thicknesses, which can be defined in terms of the number of "monolayers" of shell material that are bound to each core. A "monolayer" is a term known in the art referring to a single complete coating of a shell material (with no additional material added beyond complete coverage). For certain applications, shells will preferably be of a thickness between approximately 0 and 10 monolayers, where it is understood that this range includes non-integer numbers of monolayers. Non-integer numbers of monolayers can correspond to the state in which incomplete monolayers exist. Incomplete monolayers may be either homogeneous or inhomogeneous, forming islands or clumps of shell material on the surface of the quantum dot. Shells may be either uniform or nonuniform in thickness. In the case of a shell having nonuniform thickness, it is possible to have an "incomplete shell" that contains more than one monolayer of shell material. For certain applications, shell thickness will preferably range between approximately 1 Å and 100 Å.

It will be understood by one of ordinary skill in the art that there is typically a region between the core and shell referred to herein as an "interface region". The interface region may comprise an atomically discrete transition between the material of the core and the material of the shell or may comprise an alloy of the materials of the core and shell. The interface region may be lattice-matched or unmatched and may be crystalline or noncrystalline. The interface region may contain one or more defects or be defect-free. The interface region may be homogeneous or inhomogeneous and may comprise chemical characteristics that are graded between the core and shell materials such that a gradual or continuous transition is made between the core and the shell. Alternatively, the transition can be discontinuous. The width of the interface region can range from an atomically discrete transition to a continuous graded alloy of core and shell materials that are purely core material in the center of the quantum dot and purely shell material at the outer surface. Preferably, the interface region will be between one and five atomic layers thick.

A shell may optionally comprise multiple layers of a plurality of materials in an onion-like structure, such that each material acts as a shell for the next-most inner layer. Between each layer there is optionally an interface region. The term "shell" is used herein to describe shells formed from substantially one material as well as a plurality of materials that can, for example, be arranged as multi-layer shells.

A quantum dot may optionally comprise a "ligand layer" comprising one or more surface ligands (e.g., organic molecules) surrounding a core of the quantum dot. A quantum dot comprising a ligand layer may or may not also comprise a shell. As such, the surface ligands of the ligand layer may bind, either covalently or non-covalently, to either the core or the shell material or both (in the case of an incomplete shell). The ligand layer may comprise a single type of surface ligand (e.g., a single molecular species) or a mixture of two or more types of surface ligands (e.g., two or more different molecular species). A surface ligand can have an affinity for, or bind selectively to, the quantum dot core, shell, or both at least at one point on the surface ligand. The surface ligand may optionally bind at multiple points along the surface ligand. The surface ligand may optionally contain one or more additional active groups that do not interact specifically with the surface of the quantum dot. The surface ligand may be substantially hydrophilic, substantially hydrophobic, or substantially amphiphilic. Examples of the surface ligand include but are not limited to an isolated organic molecule, a polymer (or a monomer for a polymerization reaction), an inorganic complex, and an extended crystalline structure.

It will be understood by one of ordinary skill in the art that when referring to a population of quantum dots as being of a particular "size", what is meant is that the population is made up of a distribution of sizes around the stated "size". Unless otherwise stated, the "size" used to describe a particular population of quantum dots will be the mode of the size distribution (i.e., the peak size).

As used herein, the "size" of a quantum dot will refer to the diameter of a core of the quantum dot. If appropriate, a separate value will be used to describe the thickness of a shell surrounding the core. For instance, a 3 nm silicon quantum dot with a 1.5 nm $SiO_2$ shell is a quantum dot comprising a 3 nm diameter core of silicon surrounded by a 1.5 nm thick layer of $SiO_2$, for a total diameter of 6 nm.

For certain applications, the thickness of the ligand layer is a single monolayer or less and can sometimes be substantially less than a single monolayer.

As used herein, the term "photoluminescence" refers to the emission of light of a first wavelength (or range of wavelengths) by a substance (e.g., a quantum dot) that has been irradiated with light of a second wavelength (or range of wavelengths). The first wavelength (or range of wavelengths) and the second wavelength (or range of wavelengths) can be the same or different.

As used herein, the term "quantum efficiency" refers to the ratio of the number of photons emitted by a substance (e.g., a quantum dot) to the number of photons absorbed by the substance.

As used herein, the term "monodisperse" refers to a population of quantum dots wherein at least about 60% of the population, preferably 75% to 90% of the population, or any integer or noninteger therebetween, falls within a specified particle size range. A population of monodispersed particles deviates less than 20% root-mean-square (rms) in diameter, more preferably less than 10% rms, and most preferably less than 5% rmns.

"Optically pure" refers to a condition in which light passing through or past a material is substantially unchanged in mode quality as a result of inhomogeneities in the material or modulations at the interface between materials. This does not include mode disruption resulting from changes in index of refraction of waveguides. For instance, a material with large aggregates of quantum dots capable of scattering light would not be optically pure. The same material with aggregates of a size that do not significantly scatter light, however, would be optically pure. It will be apparent to one of ordinary skill in the art that what is meant above by "substantially unchanged" will depend on the optical requirements of a particular application. To this end, "optically pure" refers to the level of optical purity required for the application in which the material is to be used.

"Optically homogeneous" is defined as being homogeneous across a length scale that is significant for optical waves, preferably greater than 250 nm, more preferably greater than 4 µm, and most preferably greater than ~1000 µm.

A "waveguide structure" is a term of art and refers to an optical device capable of transmitting light from one location to another. A waveguide structure can transmit light through the use of guiding by localized effective index differences. One example of this involves total internal reflection within a "waveguide core", with an index of refraction $n_1$, surrounded by a "cladding", with an index of refraction $n_2$, wherein $n_1 > n_2$. Another example of a waveguide structure involves appropriately micro or nano-structured materials such as photonic bandgap materials where the guiding results from the periodic micro- or nano-structure of the materials.

"Cladding" is any material that surrounds the waveguide core in a waveguide structure such that $n_1 > n_2$. In a typical waveguide structure, light propagates as a traveling wave within and along the length of the "waveguide core" and evanescently decays within the cladding with a decay constant related to the ratio of $n_1$ to $n_2$. Light trapped within, and traveling along, the length of a waveguide core is referred to as being "guided".

The shape of a waveguide core or a cladding can typically be described in terms of its "cross-section". The cross-section is the shape created by cutting the waveguide core or the cladding along the axes perpendicular to the longitudinal axis of the waveguide structure. The longitudinal axis is the axis in which guided light travels.

"Optical fibers" and "planar waveguides" are two common forms of waveguide structures known in the art. "Optical fiber", as the term is commonly used, typically refers to a structure comprising a substantially cylindrical waveguide core surrounded by a substantially cylindrical cladding and optionally comprising a flexible, protective outer-coating. Alternatively, or in conjunction, an optical fiber can comprise a non-cylindrical waveguide core with a cross-section shaped as a trapezoid, a circle, an oval, a triangle, or another geometric and nongeometric shape.

"Planar waveguides" are waveguide structures fabricated on a substrate by a variety of methods. "Planar waveguides" typically comprise a substantially rectangular waveguide core. Alternatively, or in conjunction, planar waveguides can comprise non-rectangular waveguide cores with cross-sections of trapezoids, circles, ovals, triangles, or a plurality of other geometric and nongeometric shapes. While the term "planar" suggests a flat structure, the term "planar waveguide", as used herein, also refers to structures comprising multiple flat layers. Optionally, one or more layers in a planar waveguide are not flat. One of skill in the art will appreciate that the key aspect of a "planar waveguide" is that it is a waveguide structure fabricated on a "substrate". Unless otherwise stated, the term "waveguide structure" will be used herein to describe a planar waveguide.

"Waveguide substrate" or "substrate" is used herein to describe the material on which a planar waveguide is located. It is common that a planar waveguide is fabricated directly on the surface of the substrate. The substrate typically comprises a solid support such as, for example, a silicon wafer and optionally comprises an additional "buffer layer" that separates the waveguide structure from the solid support. The buffer layer optionally comprises a plurality of layers comprising one or more materials or combination of materials. The buffer layer may optionally act, in part, as a cladding. Alternatively, the waveguide substrate may be a flexible substrate serving the same purpose.

"Single mode" waveguide structures are those waveguide structures (either planar or fiber optic) that typically support a single optical mode (e.g., $TEM_{00}$). Such waveguide structures are preferred according to some embodiments of the invention. "Multi-mode" waveguide structures are those waveguide structures that typically support multiple optical modes simultaneously.

"Waveguide diameter" is herein used to describe the diameter of a substantially cylindrical waveguide core of an optical fiber. Waveguide diameter is also used to describe the diameter of a substantially cylindrical core on a planar waveguide.

"Waveguide width" or "width" is used herein to describe the cross-sectional dimension of a substantially rectangular waveguide core that is oriented parallel to the substrate surface. This is also referred to as the "horizontal dimension" of the waveguide core. "Waveguide height" or "height" is used herein to describe the cross-sectional dimension of a substantially rectangular waveguide core that is oriented perpendicular to the substrate surface. This is also referred to as the "vertical dimension" of the waveguide core. Based on the definitions of "width" and "height" described here, one of ordinary skill in the art will understand the translation of these terms to other geometrically or nongeometrically shaped waveguide cores. Unless otherwise stated, the standard definitions of width and height used in geometry will be used to describe geometric cross-sectional shapes.

"Core taper" refers to a region of the waveguide core in which the geometry of the waveguide core is changed. This may comprise changing the size and/or shape of the waveguide core in one or two dimensions. A core taper, for example, may comprise a transition of a waveguide core with a square cross-section of 15 µm×15 µm to a waveguide core with a square cross-section of 7 µm×7 µm. A core taper may also, for example, comprise a transition from a waveguide core with a square cross-section of 15 µm×15 µm to a waveguide core with a circular cross-section of 10 µm in diameter. Many other forms of core-tapers are possible and will be understood from the above definition.

A "core taper" is typically engineered to gradually change the characteristics of the waveguide structure over a defined distance, referred to as the "taper length". Ideally, the taper length will be long enough so that the transition preserves the mode structure of an optical signal through the taper. In particular, it is preferred, but not required, that a single optical mode entering a taper remains a single mode after exiting the taper. This retention of the mode-structure is referred to as an "adiabatic transition". While the term "adiabatic transition" is commonly used, those of ordinary skill in the art will recognize that it is typically not possible to have a perfectly adiabatic transition, and that this term can be used to describe a transition in which the mode structure is substantially undisrupted.

A "cladding taper" is a novel embodiment disclosed herein that is similar to a core taper; however, it refers to a change in width of the cladding around the waveguide core. Similar to a core taper, a cladding taper can be used to change the size and/or shape of the cladding and can be defined to have a taper length. The taper length can be such as to produce an adiabatic or nonadiabatic transition.

Both core and cladding tapers may optionally refer to the case in which the index of refraction of the materials in the core or cladding are gradually changed, or "graded" over the taper length. As used herein, the term "gradually" refers to changes that occur continuously or in small steps over a given nonzero distance. Core and cladding tapers may optionally comprise changes to the index, size, and/or shape of the core or cladding, respectively.

A "bend" is used herein to describe a portion of a planar waveguide in which the planar waveguide displays a degree of curvature in at least one dimension. Typically, the cross-section of the waveguide is substantially unchanged within the bend. Typically, bends will be smooth and continuous and can be described in terms of a radius of curvature at any given point within the bend. While bends can curve the planar waveguide both parallel and perpendicular to the substrate (e.g., horizontal or vertical bends, respectively), unless otherwise stated, the term "bend" will herein refer to horizontal bends. Optionally, bends can also comprise tapers.

A "multimode interference device" or multimode interferometer (MMI) refers to an optical device in which the cross-section of the waveguide core is substantially changed (typically increased) within a short propagation length, leading to a region of waveguide core in which more than one mode (but typically fewer than 10 modes) may propagate. The interaction of these propagating multiple modes defines the function performed by the MMI. MMI devices include fixed ratio splitters/combiners and wavelength multiplexers/demultiplexers.

As used herein, a "waveguide coupler", "optical coupler", and "directional coupler" are synonymous and refer to a waveguide structure in which light is evanescently coupled between two or more waveguide cores within a coupling region such that the intensity of the light within each of the individual cores oscillates periodically as a function of the length of the coupling region. A more detailed description of a waveguide coupler is disclosed below.

A "nonlinear waveguide coupler" is a waveguide coupler in which the region between and/or around two or more coupled waveguide cores is filled with a material (e.g., an "active material") with an index of refraction that can be changed. By changing the index of refraction of the active material, the coupling characteristics of the nonlinear waveguide coupler can be modified. Alternatively, the active material may be contained within one or more of the coupled waveguide cores (e.g., as a section of one of the waveguide cores).

A "Mach-Zehnder interferometer" or "MZ interferometer" (MZI) is a waveguide structure in which light from a waveguide core (e.g., an "input waveguide core") is split into two or more separate waveguide cores (e.g., "waveguide arms" or "arms"). Light travels a defined distance within the arms and is then recombined into a waveguide core (e.g., an "output waveguide core"). In a MZ interferometer, the history of the optical signals in each arm affects the resulting signal in the output waveguide core. A more detailed description of a MZ interferometer is disclosed below.

A "nonlinear MZ interferometer" is a MZ interferometer in which one or more of the waveguide arms comprise an active material. The active material may be in the core and/or cladding of the waveguide arm. Modifying the index of refraction of the active material modulates the signal in the output waveguide core by changing the degree of constructive and/or destructive interference from the waveguide arms.

"Active material" refers to any material with nonlinear optical properties that can be used to manipulate light in accordance with some embodiments of the invention. While the term active material will typically be used to refer to an engineered nonlinear nanocomposite material as described herein, the term may also be used to describe other nonlinear materials known in the art.

"Active region" refers to the region of an optical device in which the index of refraction of the active material is modulated in order to manipulate light. In the case of an electro-optic modulator, the active region is that area of the device where a voltage is applied. In a $\chi^{(3)}$ based device, the active region is that area to which a trigger-signal is applied. Note that while the active region can be the only region of the device in which an intentional change in optical properties occurs, it does not restrict the location of the active material, which may extend beyond the active region. Regions containing active materials outside the active region are typically not modulated during normal operation of the device. "Active length" describes the length of the active region along the longitudinal axis of the device.

In the case of optical devices employing evanescent coupling of light between two waveguide cores (e.g., a waveguide coupler), the "interaction region" or "coupling region" is the region of the optical device in which the coupling occurs. As is typically understood in the art, all waveguides can couple at some theoretically non-zero level. The interaction region, however, is typically considered to be that region of the optical device in which evanescent fields of the waveguides overlap to a significant extent. Here again, the interaction region does not restrict the extent of either the active region or the active material, which may be greater or lesser in extent than the interaction region.

"Interaction length" describes the length of the interaction region. "Interaction width" is the spacing between two coupled waveguides within the interaction region. Unless otherwise stated, the interaction width is assumed to be substantially constant across at least a portion of the interaction length.

"Trigger pulse", "trigger signal", "control pulse", "control signal", "control beam", and "activation light" are synonymous and refer to light that is used to create a transient change in the index of refraction in the materials of some embodiments of the present invention. A trigger pulse can either be pulsed or CW.

"Data pulse", data signal", and "data beam" are synonymous and refer to light used to transmit information through an optical device. A data pulse can optionally be a trigger pulse. A Data pulse can either be pulsed or CW.

"CW light" and "CW signal" are synonymous and refer to light that is not pulsed.

"Wavelength range-of-interest" refers to any range of wavelengths that will be used with a particular optical device. Typically, this will include both the trigger and data signals, where the ranges for the trigger and data signals can be the same or different. For instance, if a device is fabricated for use in the 1550 nm telecom range, the data wavelength range-of-interest may be defined as 1.5 µm to 1.6 µm, and the trigger wavelength range-of-interest may be defined as 1.5 µm to 1.6 µm (or a different range). For devices in the 1300 nm range, the data wavelength range-of-interest may be defined as 1.25 µm–1.35 µm. While these are preferred wavelength range-of-interests, it will be understood that the specific wavelength range-of-interest can be different depending on the specific application. The ability to tune the materials of embodiments of the current invention implies that any wavelength range-of-interest may be used. In general, 300 nm to 4000 nm is a preferred wavelength range-of-interest, more preferably 300 nm to 2000 nm, more preferably 750 nm to 2000 nm, more preferably 1260 nm to 1625 nm, most preferably 1310±50 nm and 1580±50 nm.

Quantum Dots

Embodiments of the current invention, in part, exploit the extraordinary properties of quantum dots. Quantum dots have optical and electronic properties that can be dependent (sometimes strongly dependent) on both the size and the material forming the quantum dots.

In nature, it is the size range on the order of a few nanometers in which the quantum mechanical characteristics of atoms and molecules often begin to impact and even dominate the classical mechanics of everyday life. In this size range, a material's electronic and optical properties can change and become dependent on size. In addition, as the size of a material gets smaller, and therefore more atomic-like, many characteristics change or are enhanced due to a redistribution of oscillator strength and density of states. These effects are referred to as "quantum confinement" effects. For example, quantum confinement effects can cause the energy gap of the quantum dot or the energy of the light emitted from the quantum dot to increase as the size of the quantum dot decreases. These quantum confinement effects result in the ability to finely tune many properties of quantum dots (e.g., optical and electronic properties) by carefully controlling their size. This control provides one critical aspect of some embodiments of the current invention.

A quantum dot will typically be in a size range between about 1 nm and about 1000 nm in diameter or any integer or fraction of an integer therebetween. Preferably, the size will be between about 1 nm and about 100 nm, more preferably between about 1 nm and about 50 nm or between about 1 nm to about 20 nm (such as about 2, 3, 4, 5, 6, 7, 8, 9, 10, 11, 12, 13, 14, 15, 16, 17, 18, 19, or 20 nm or any fraction of an integer therebetween), and more preferably between about 1 nm and 10 nm.

FIGS. 1(a), 1(b), 1(c), and 1(d) illustrates quantum dots according to some embodiments of the invention. In particular, FIG. 1(a) illustrates a quantum dot 100 comprising a core 102, according to an embodiment of the invention. A core (e.g., the core 102) of a quantum dot may comprise inorganic crystals of Group IV semiconductor materials including but not limited to Si, Ge, and C; Group II-VI semiconductor materials including but not limited to ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group III-V semiconductor materials including but not limited to AlN, AlP, AlAs, AlSb, GaN, GaP, GaAs, GaSb, InN, InP, InAs, and InSb; Group IV-VI semiconductor materials including but not limited to PbS, PbSe, PbTe, and PbO; mixtures thereof; and tertiary or alloyed compounds of any combination between or within these groups. Alternatively, or in conjunction, a core can comprise a crystalline organic material (e.g., a crystalline organic semiconductor material) or an inorganic and/or organic material in either polycrystalline or amorphous form.

Figure 1B:
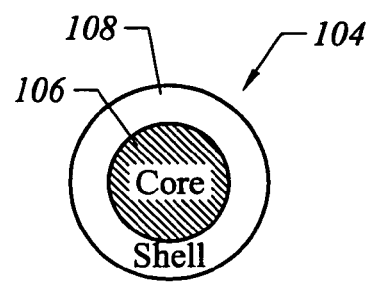

A core may optionally be surrounded by a shell of a second organic or inorganic material. FIG. 1(b) illustrates a quantum dot 104 according to another embodiment of the invention. Here, the quantum dot 104 comprises a core 106 that is surrounded by a shell 108. A shell (e.g., the shell 108) may comprise inorganic crystals of Group IV semiconductor materials including but not limited to Si, Ge, and C; Group II-VI semiconductor materials including but not limited to ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group III-V semiconductor materials including but not limited to AlN, AlP, AlAs, AlSb, GaN, GaP, GaAs, GaSb, InN, InP, InAs, and InSb; mixtures thereof; and tertiary or alloyed compounds of any combination between or within these groups. Alternatively, or in conjunction, a shell can comprise a crystalline organic material (e.g., a crystalline organic semiconductor material) or an inorganic and/or organic material in either polycrystalline or amorphous form. A shell may be doped or undoped, and in the case of doped shells, the dopants may be either atomic or molecular. A shell may optionally comprise multiple materials, in which different materials are stacked on top of each other to form a multi-layered shell structure.

Figure 1C:
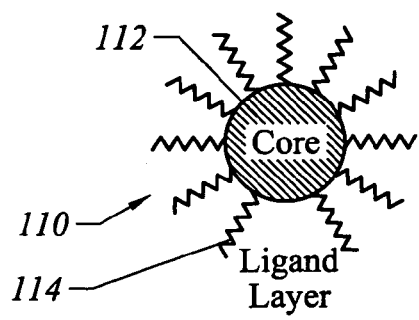
Figure 1D:
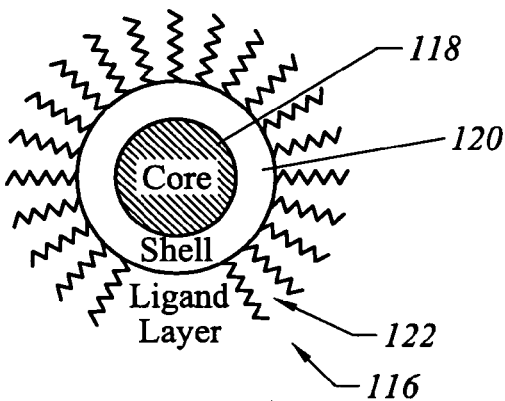

As illustrated in FIGS. 1(c) and 1(d), a quantum dot may optionally comprise a ligand layer comprising one or more surface ligands (e.g., organic molecules) surrounding a core, according to some embodiments of the invention. In FIG. 1(c), a quantum dot 110 comprises a core 112 and a ligand layer 114 surrounding the core 112. In FIG. 1(d), a quantum dot 116 comprises a core 118 and a ligand layer 122 surrounding the core 118. Here, the quantum dot 116 also comprises a shell 120 surrounding the core 118, where the shell 120 is positioned between the core 118 and the ligand layer 122.

Optical Properties

Linear Optical Properties:

One of the most dramatic examples of "quantum confinement" effects is that, for a semiconductor material, the energy gap shifts as a function of size. This can be seen in FIG. 2, where the energy gap of quantum dots fabricated from silicon, referred to herein as "silicon quantum dots", is plotted as a function of the size (e.g., diameter) of the quantum dots, according to an embodiment of the invention. The silicon quantum dots were made as described herein. The vertical axis represents the energy gap of the silicon quantum dots, and the horizontal axis represents the size of the silicon quantum dots. The observed values for the energy gap (dots with error bars) are compared against pseudopotential and tight-binding models (solid line) and against the simple effective mass theory (dashed line).

Figure 2:
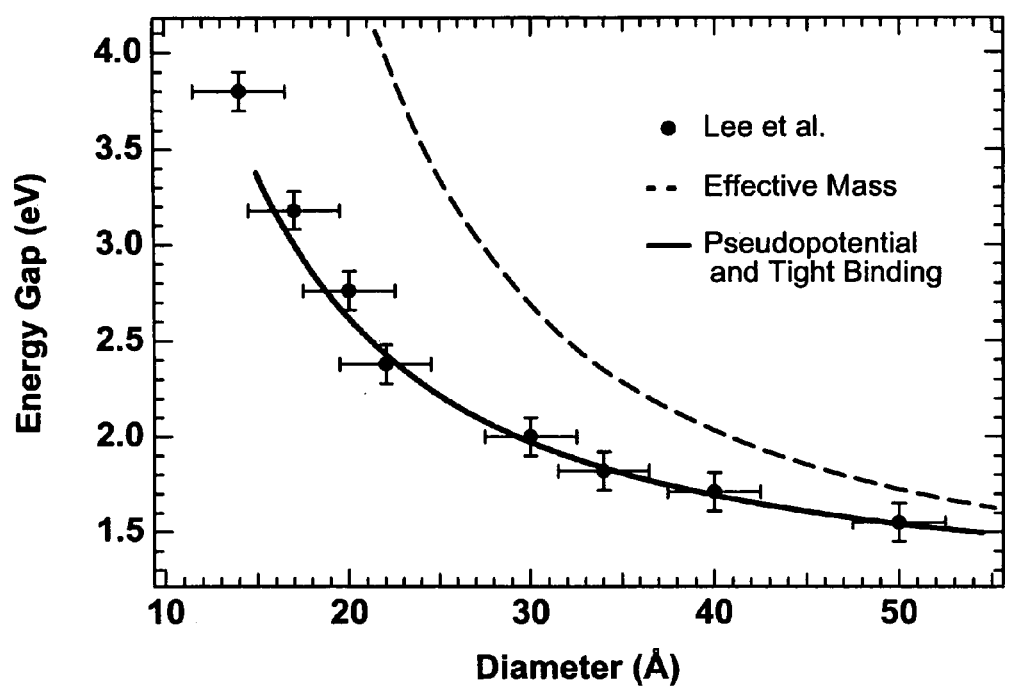
FIG. 2 illustrates the energy gap of quantum dots fabricated from silicon plotted as a function of the size of the quantum dots, according to an embodiment of the invention.
Figure 3:
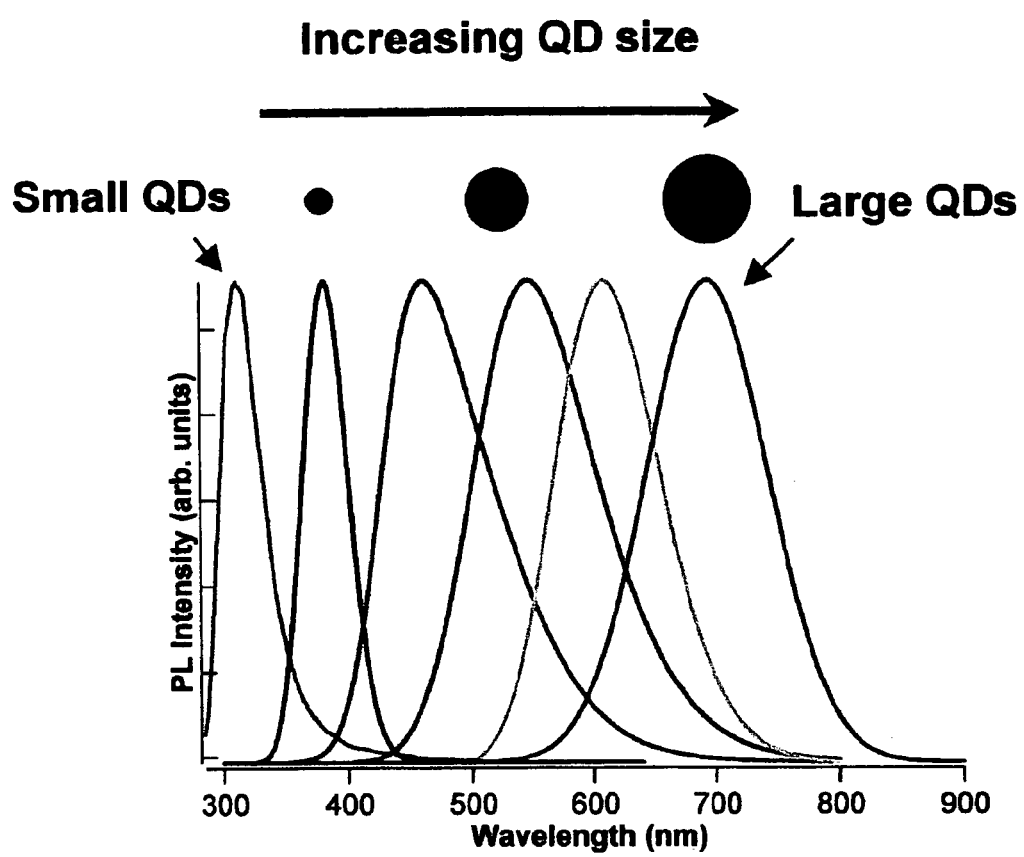
FIG. 3 illustrates photoluminescence (PL) spectra from six samples with different sizes of silicon quantum dots, according to an embodiment of the invention.

The same effect can be seen for the emission wavelength as a function of the size of quantum dots. FIG. 3 illustrates photoluminescence (PL) spectra from six samples with different sizes of silicon quantum dots, according to an embodiment of the invention. The silicon quantum dots were made as described herein and include shells formed of an oxide. The vertical axis represents a normalized PL signal, and the horizontal axis represents the emission wavelength. The PL spectra illustrated in FIG. 3 is obtained by optically exciting the silicon quantum dots with ultraviolet light. The wavelength of the optical excitation is shorter than the wavelength at the absorption edge of the silicon quantum dots. FIG. 3 demonstrates the range of sizes that can be made with the methods described herein. The quantum dots shown at the top of FIG. 3 are not drawn to scale and are meant to illustrate the relative size of the quantum dots responsible for the PL spectra. FIGS. 2 and 3 demonstrate the unprecedented control that can be obtained over absorption and emission characteristics of the silicon quantum dots.

Through a series of relations called the Kramers-Kronig equations, the properties of refractive index and dielectric constant can be related to absorption. As such, size-dependent control of absorption allows control of refractive index.

In addition to the size of a quantum dot, the optical and electronic properties are also strongly influenced by the material from which it is fabricated. Quantum confinement effects represent a modulation of the bulk properties of the material. As such, any changes resulting from a reduction in size are made relative to the bulk properties of the material.

Figure 4A:
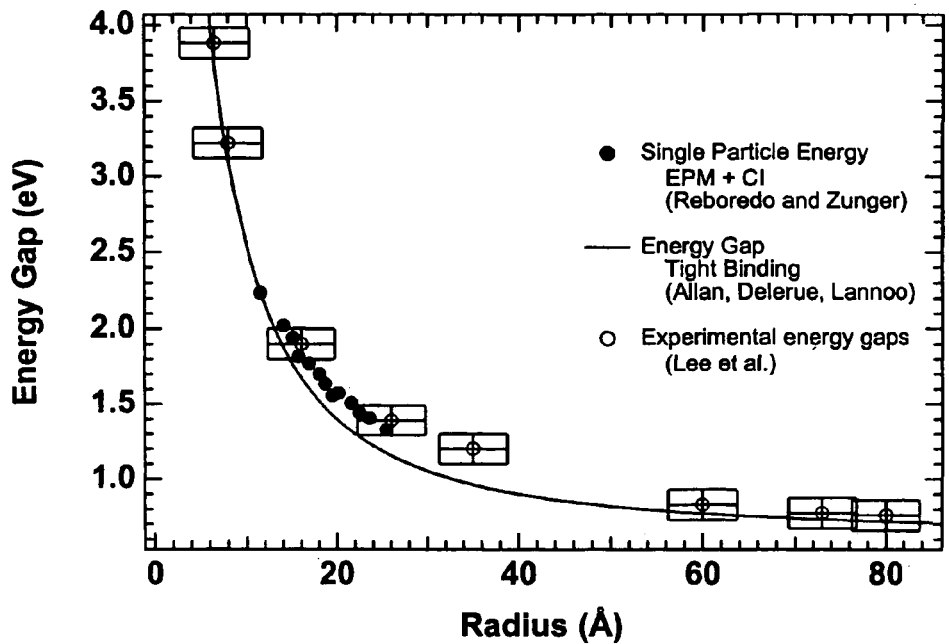
FIG. 4(a) illustrates the energy gap of quantum dots fabricated from germanium plotted as a function of the size of the quantum dots, according to an embodiment of the invention.
Figure 4B:
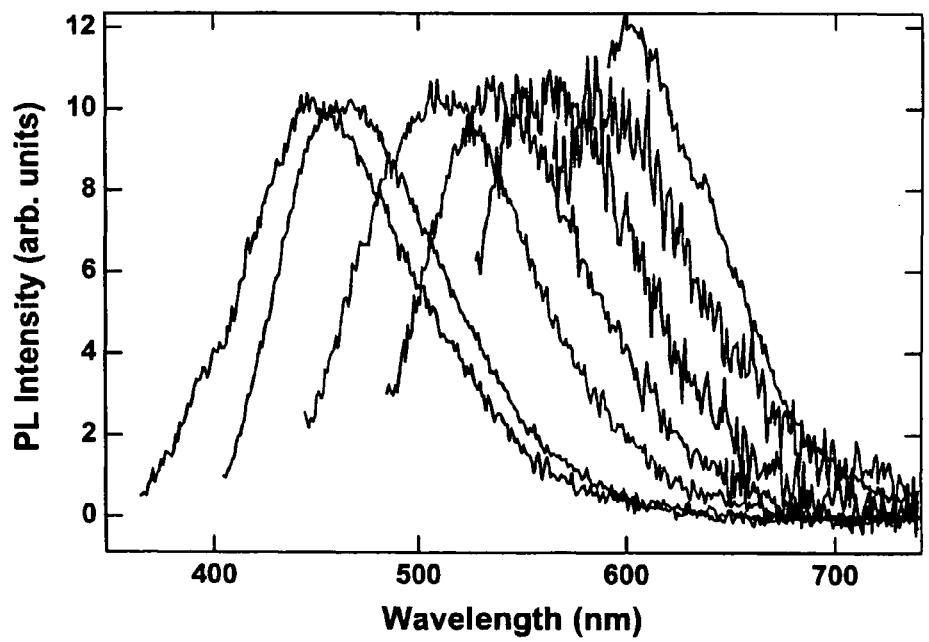
FIG. 4(b) illustrates size-selective photoluminescence (PL) spectra for different sizes of germanium quantum dots, according to an embodiment of the invention.

By selecting (e.g., independently selecting) the appropriate combination of quantum dot size and material, an even greater control of the optical and electronic properties of a quantum dot is provided. As an example, FIGS. 4(a) and (b) show the size dependent absorption and emission of germanium quantum dots, which differ from those of silicon quantum dots, according to an embodiment of the invention. The germanium quantum dots were made as described herein. In FIG. 4(a), the vertical axis represents the energy gap of the germanium quantum dots, and the horizontal axis represents the size of the germanium quantum dots. The observed values for the energy gap (open dots with error bars) are compared against theoretical predictions (solid dots and solid line). In FIG. 4(b), a size-selective PL spectrum is shown, where the vertical axis represents a normalized PL signal, and the horizontal axis represents the emission wavelength. The far right curve is offset vertically for clarity. The PL spectra shown in FIG. 4(b) are collected using different excitation wavelengths, such that only quantum dots with energy gaps less than or equal to the photon energy of the excitation light (i.e., greater than a certain quantum dot size) are excited.

Relation of Size and Material to Dielectric Constant and Index of Refraction

For most materials, the index of refraction far from resonance decreases as the energy gap of the material increases (a consequence of the Kramers-Kronig equations). This explains, for example, why the index of refraction of transparent materials (e.g., silica, metal halides, and organics) is less than that for inorganic semiconductors with smaller relative absorption energies. This effect also typically applies to quantum dots. In this case, as the size of the quantum dot decreases, the energy gap increases, decreasing the index of refraction. Thus, for quantum dots, the off-resonant index of refraction (at a fixed wavelength) typically correlates with size, affording another method to control the optical properties of the quantum dots.

Figure 5A:
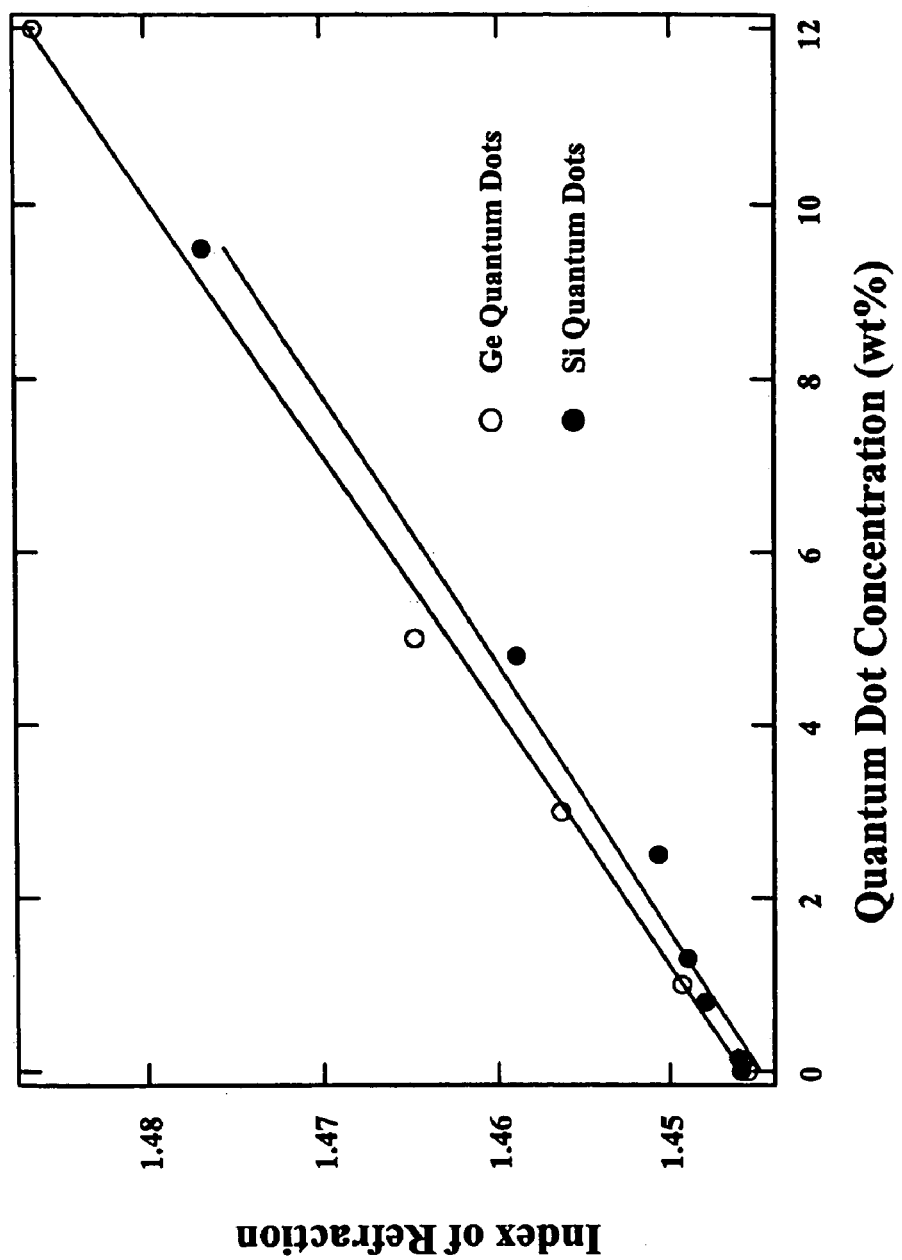
FIG. 5(a) illustrates concentration dependence of the linear index of refraction of engineered nonlinear nanocomposite materials doped with silicon and germanium quantum dots, according to an embodiment of the invention.

Relation of Concentration of Quantum Dots to Dielectric Constant and Index of Refraction Embodiments of the invention involve altering the index of refraction of a material by varying the concentration of quantum dots in the material. An example of this is shown in FIG. 5(a), which illustrates concentration dependence of the linear index of refraction of engineered nanocomposite materials doped with silicon and germanium quantum dots, according to an embodiment of the invention. The silicon and germanium quantum dots were made in accordance with the methods described herein. The index of refraction is plotted as a function of the quantum dot concentration expressed in weight percent. In this figure, the index of refraction is measured in the visible range (sodium D line).

This concentration dependence provides yet another method of controlling the overall refractive index of a material by utilizing the properties of quantum dots. The ability to embed quantum dots into a variety of host materials will be discussed in a later section.

Nonlinear Optical Properties

In general, a wide variety of nonlinear optical phenomena can arise when materials are exposed to high-intensity light. Some of these nonlinear phenomena are used in certain aspects of telecommunications (e.g., Raman amplifiers) and many are being considered for future use (e.g., four-wave mixing, cross-phase modulation, and solitons). Although nonlinear phenomena are typically associated with high-intensities, these phenomena are also observed at lower intensities due to phase matching, resonant enhancement, and/or long interaction lengths.

Light incident on a material can induce a polarization (P), which can be expressed as (in SI units)

$$P = \epsilon_0 \chi E = \epsilon_0 [\chi^{(1)} E + \chi^{(2)} E \times E + \chi^{(3)} E \times E \times E + \ldots],$$

where E is the electric field strength, $\epsilon_0$ is the electric permittivity, $\chi$ is the overall optical susceptibility, and $\chi^{(n)}$ is the nth order optical susceptibility. Since $\chi^{(2)}$ phenomena are typically only present in materials that lack inversion symmetry (e.g., non-centrosymmetry), certain embodiments of the invention primarily exploit $\chi^{(3)}$ phenomena, which can be exhibited by all materials. It should be recognized that tensor elements of $\chi^{(3)}$ are in general complex quantities. The induced refractive index change $\Delta n$ and the nonlinear index of refraction $\gamma$ are related to the real part of appropriate tensor elements of $\chi^{(3)}$ e.g., $\text{Re}[\chi^{(3)}_{1111}]$, while the two-photon absorption coefficient $\beta$ is related to the imaginary part of appropriate tensor elements of $\chi^{(3)}$, e.g., $\text{Im}[\chi^{(3)}_{1111}]$). In particular, certain embodiments of the invention exploit phenomena that change the index of refraction of a material by creating an effective optical susceptibility $$\chi_{eff} = \chi^{(1)} + \chi^{(3)} E \times E = \chi^{(1)} + \chi^{(3)} I,$$

where I is the intensity of the particular light beam creating the effective optical susceptibility (and where the higher order terms are assumed to be small and are therefore neglected here, although they can be utilized as well), which can affect the same light beam or another light beam at the same or different frequency. This leads to an effective or overall index of refraction given by $$n(\omega') = n_0 + \gamma(\omega', \omega) I(\omega),$$

and an operational definition for a nonlinear index of refraction $\gamma$ given by $$\gamma(\omega', \omega) = \frac{n(\omega') - n_0}{I(\omega)}$$

where $n(\omega')$ is the effective index of refraction at $\omega'$, $n_0$ is the low-intensity refractive index (e.g., the linear index of refraction), and $I(\omega)$ is the intensity of light with optical frequency $\omega$ that creates the effective optical susceptibility or index change. The nonlinear index of refraction $\gamma(\omega',\omega)$ is related to $\chi^{(3)}_{ijkl}(-\omega', \omega', \omega, -\omega)$, e.g., $\chi^{(3)}_{1111}(-\omega', \omega', \omega, -\omega)$. If only one light beam is involved, then $\omega'$ and $\omega$ can be set equal to $\omega$. If two light beams are involved, then $\omega'$ and $\omega$ can be the same or different. Situations where $\omega'$ and $\omega$ are the same can correspond to degenerate conditions (which is further discussed herein), in which case the nonlinear index of refraction $\gamma$ can be referred to as a degenerate nonlinear index of refraction (or $\gamma_{deg}$). Situations where $\omega'$ and $\omega$ are different can correspond to non-degenerate conditions (which is further discussed herein), in which case the nonlinear index of refraction $\gamma$ can be referred to as a non-degenerate nonlinear index of refraction (or $\gamma_{nondeg}$). As one of ordinary skill in the art will understand, an optical frequency of a light beam (e.g., $\omega$ or $\omega'$) is inversely related to a wavelength of the light beam (e.g., $\lambda$ or $\lambda'$).

This intensity dependent refractive index $n(\omega')$ can be exploited for all-optical switching and optical signal processing. For certain applications, nonlinear absorption processes are of particular importance, in which case, optimization of $\text{Im}[\chi^{(3)}_{ijkl}]$ is preferred.

Nonlinear Optical Properties of Quantum Dots

In general, three mechanisms are principally responsible for $\chi^{(3)}$ nonlinearities in quantum dots. These effects fall into the broad categories of resonant, nonresonant, and near-resonant effects. These categories can be further subdivided into degenerate (e.g., all light beams have the same wavelength) and non-degenerate (e.g., one or more light beams have different wavelengths) cases.

1) Resonant Effects:

Resonant processes typically result from a change in electronic properties upon resonant excitation (e.g., the linear absorption of light). This leads to a corresponding change in refractive index, following the Kramers-Kroenig relations. The magnitude of an absorption change, and hence the optical nonlinearity, is directly related to the ground state absorption cross-section modified by any excited state absorption. In the case of a material with discrete states, such as molecules or quantum dots, the optical nonlinearity results from state-filling and is related to $(\sigma_g - \sigma_e)$, where $\sigma_g$ and $\sigma_e$ are the absorption cross sections of the material in the ground and excited states respectively, with a reduction in refractive index occurring for a reduction in absorption. For quantum dots, further enhancement of $\chi^{(3)}$ results from unique physical phenomena such as quantum confinement, local electric field effects, and quantum interference effects.

As indicated above, the optical nonlinearity is related to $(\sigma_g - \sigma_e)$, so that increasing the oscillator strength of optical transitions from the ground state generally increases the optical nonlinearity. In the case of quantum dots, a decrease in size increases the spatial overlap of the electron and hole wave functions, which in turn increases the oscillator strength. Resonant nonlinearity therefore tends to increase with decreasing size. This enhancement, however, can be limited by any size dispersion.

Another important effect arises from the presence of one or more defects in a quantum dot. Defects can be present as trap states within the quantum dot. Due to the enormous surface to volume ratio in the size range of quantum dots, most relevant traps exist on the surface. If not passivated correctly, resonant excitation of a quantum dot creates electron-hole pairs that quickly relax into these surface-states. Holes, with their relatively large effective mass, tend to trap more easily, while the electrons, with their smaller effective mass, remain largely delocalized. The result is a spatial separation of the electron and hole wavefunctions and a decrease in oscillator strength, reducing the magnitude of the resulting nonlinearity. Furthermore, by tailoring the rate of relaxation between the delocalized quantum dot states and the localized surface states, it is possible to control the response time of the resonant optical nonlinearity.

Resonant nonlinearities can be utilized in both the degenerate and non-degenerate cases with respect to the wavelength of control and data beams. In the degenerate case, the wavelength range-of-interest lies near the absorption edge. For a single beam, the absorption can be saturated, leading to an intensity dependent absorption, commonly known as saturable absorption. For degenerate control and data beams, the control beam can modulate the transmission of the data beam, leading to an optical modulator. The refractive index change caused by the absorption change can also be utilized. Due to the broad electronic absorption in semiconductors in general and quantum dots in particular, resonant nonlinearities can be observed for the case where the control beam and the data beam are non-degenerate. In this case, the control beam can be of higher photon energy, such that carriers are generated which relax (primarily via phonon emission) towards the band edge, where the absorption bleaching and/or excited state absorption can affect the data beam of lower photon energy (but still resonant).

2) Nonresonant Effects:

In contrast to resonant nonlinearities, where linear absorption of light is typically required, non-resonant nonlinearities typically do not require single-photon absorption of light. As a result, nonresonant nonlinearities are intrinsically fast since excited state relaxation is not required. However, nonresonant nonlinearities are generally smaller than resonant nonlinearities, due to the lack of strong single-photon resonance enhancement (although multi-photon resonance can be utilized to enhance the nonresonant nonlinearity).

There are three primary enhancement factors that can be utilized for nonresonant nonlinearities in quantum dots: quantum confinement, multi-photon resonance enhancement, and local-field effects. Quantum confinement provides an increase in oscillator strength due to enhanced wavefunction overlap (as described above), which enhances $\chi^{(3)}$. Multi-photon resonances can be utilized in the absence of single-photon resonances to enhance the nonresonant nonlinearity. However, multi-photon resonances can introduce unwanted nonlinear absorptive losses. For certain applications, the ideal situation is one where the relevant light beams are just below the threshold of a multi-photon resonance, thereby allowing some resonant enhancement without significant nonlinear absorption loss. Finally, local field effects can be utilized to enhance the nonresonant $\chi^{(3)}$. In particular, for a nanocomposite material in which quantum dots with dielectric constant $\in_1$ are imbedded in a matrix material with dielectric constant $\in_2$, an externally applied electric field (such as that originating from an electromagnetic light source) can be locally enhanced at the quantum dots if $\in_1 > \in_2$, with the magnitude of the enhancement related to $\Delta\in = \in_1 - \in_2$. Such a situation can arise by embedding the quantum dots in a lower index matrix material. When illuminated by light, the electric field at the quantum dots is enhanced compared to the incident external field, in turn leading to an increase in the overall nonlinear response. This enhancement increases with size of the quantum dots as the quantum dot bandgap energy decreases, resulting in an increase in dielectric constant ($\in_1$).

Nonresonant nonlinearities can be utilized in the non-degenerate case as well. In this case, the control beam can have either higher or lower photon energy than the data beam. One advantage of the non-degenerate case is that enhancement of cross-phase modulation (the control beam inducing an index change seen by the data beam) can occur without enhancement of self-phase modulation (the data beam affecting itself by the self-induced index change), which can cause some deleterious effects for telecommunications data streams.

3) Near-Resonant Effects:

Near-resonant nonlinearities can be classified into two categories: degenerate (typically close to resonance) or non-degenerate (typically with one beam resonant and the other beam nonresonant). In the former case, the beams are typically very close to the resonance edge, i.e., just above, just below, or exactly at the edge of resonance, so that either no direct excitation of the material occurs through linear absorption or very little direct absorption occurs. The non-degenerate case is perhaps the more useful situation, as the refractive index change induced by resonant excitation via a control beam causes a phase change for the data beam that is below resonance (so as to minimize losses due to single- or multi-photon absorption). For example, the refractive index change due to the absorption saturation that extends to photon energies well below the absorption edge can be utilized, where carriers can be directly generated using the control beam instead of generating carriers via two-photon absorption using a high-intensity data beam. In addition, the excitation of free carriers in quantum dots due to absorption of control beam photons can lead to a refractive index change caused by other free carrier effects. For example, due to their small size, quantum dots typically intrinsically have high free carrier densities for even single photon absorption (e.g., ~$10^{18}$ carriers/cm$^3$ for one photon absorption in a single quantum dot). This leads to effects such as quantized Auger recombination and enhanced reflectivity (due to a large plasma frequency) at high enough carrier densities (e.g., ~$10^{20}$ carriers/cm$^3$).

Size Dependence

From the discussion above, the size dependence (for a given quantum dot material) of both resonant and nonresonant nonlinear processes can be derived. Typically, for resonant optical nonlinearity, the magnitude of the nonlinearity increases as the quantum dot size decreases, decreases as the number of quantum dots with traps that localize electrons or holes increases, and decreases as the size dispersion increases.

Typically, for nonresonant processes, the optical nonlinearity increases with increasing quantum dot size, increases with increasing index of refraction of the quantum dot, increases with decreasing index of refraction of the surrounding matrix material. There is the caveat that these trends may not continue indefinitely to all sizes of quantum dots but can be useful as aids in practical design considerations. By carefully tailoring the specific size of the quantum dot, resonant effects, nonresonant effects, or both, can be used to optimize the resulting nonlinear response.

Quantum Dot Material Dependence

One important consideration for a material forming a quantum dot is that, for bound electrons, the optical nonresonant nonlinearity typically depends on the energy gap of the material as $1/E_g^n$, where n typically ranges from about 4 to about 6. The nonresonant nonlinearity therefore can increase significantly as the energy gap decreases. This trend favors a combination of large quantum dot sizes and materials with intrinsically small bandgap energies. At the same time, however, the photon energy in the wavelength range-of-interest can affect the choice of material and quantum dot size in order to avoid significant linear and nonlinear absorption. Specifically, the material in the bulk form desirably should have an energy gap roughly equal to or greater than the photon energy in the wavelength range-of-interest for a data beam in order to exploit quantum confinement effects that shift the energy gap to higher energies. At the same time, to avoid significant multi-photon absorption effects, the energy gap of the material desirably should be sufficiently large that the energy gap of the resulting quantum dot is greater than two times the photon energy of the data beam photons.

For the case of nonresonant optical nonlinearities, these two concerns specify opposing trends that bracket the energy gap of the material of choice for quantum dots according to some embodiments of the present invention. The material in the bulk form desirably should have an energy gap less than this bracketed energy in order to exploit quantum confinement effects that shift the energy gap to higher energies. As an example, to avoid two-photon losses in degenerate all-optical switching components operating near 1550 nm (corresponding to a photon energy of 0.8 eV) and to also take advantage of the $1/E_g^n$ behavior of the nonlinear response, the quantum dot energy gap should be less than but close to 775 nm (or greater than but close to 1.6 eV).

Enhanced Optical Properties

In addition to size-dependent spectral characteristics, quantum confinement can also result in an enhancement in the magnitude of various optical and electronic properties due to a redistribution of the density of states. Properties such as absorption cross-section and excited-state polarizability have been found to be enhanced by several orders of magnitude over bulk materials. $\chi^{(3)}$ can also be enhanced by quantum confinement, as described previously.

Additional Effects

According to some embodiments of the invention, the following effects can be important for the formation of nanocomposite materials with a figure-of-merit in a usable range for practical optical switching.

1) The Effect of Defects on FOM:

Defects within quantum dot materials can have a substantial negative impact on their performance as nonlinear optical materials. Defects in the core and/or surface of the quantum dot can yield direct absorption of below-bandgap photons, increasing optical losses, and decreasing the overall FOM. As a result, while $\chi^{(3)}$ may be high, the material can still be inappropriate for optical switching. The effect of defects on optical switching using quantum dots has not been previously considered as discussed herein.

One important aspect of some embodiments of the invention is that, for quantum dots to be used as a nonlinear optical material, they desirably should comprise a substantially defect-free core. In this case, the term "defect" typically refers to defects with energy below the energy gap of the quantum dot core or within the energy range of the wavelength range-of-interest. Additionally, the surface of quantum dots should be well passivated, such that there are substantially no defect states. Passivation can be accomplished, for example, through the inclusion of appropriate surface ligands in the ligand layer to bind to defect sites and remove them from the energy gap. Alternatively, or in conjunction, passivation can be achieved by applying a shell to the quantum dot core to fill or eliminate the defect sites. In this case, the shell material is preferably a material with an energy gap that is higher than that corresponding to the wavelength range-of-interest, and more preferably higher than the energy gap of the quantum dot core. Additionally, the shell desirably should be substantially defect-free or should have defects that can be eliminated through the inclusion of appropriate surface ligands.

Figure 5B:
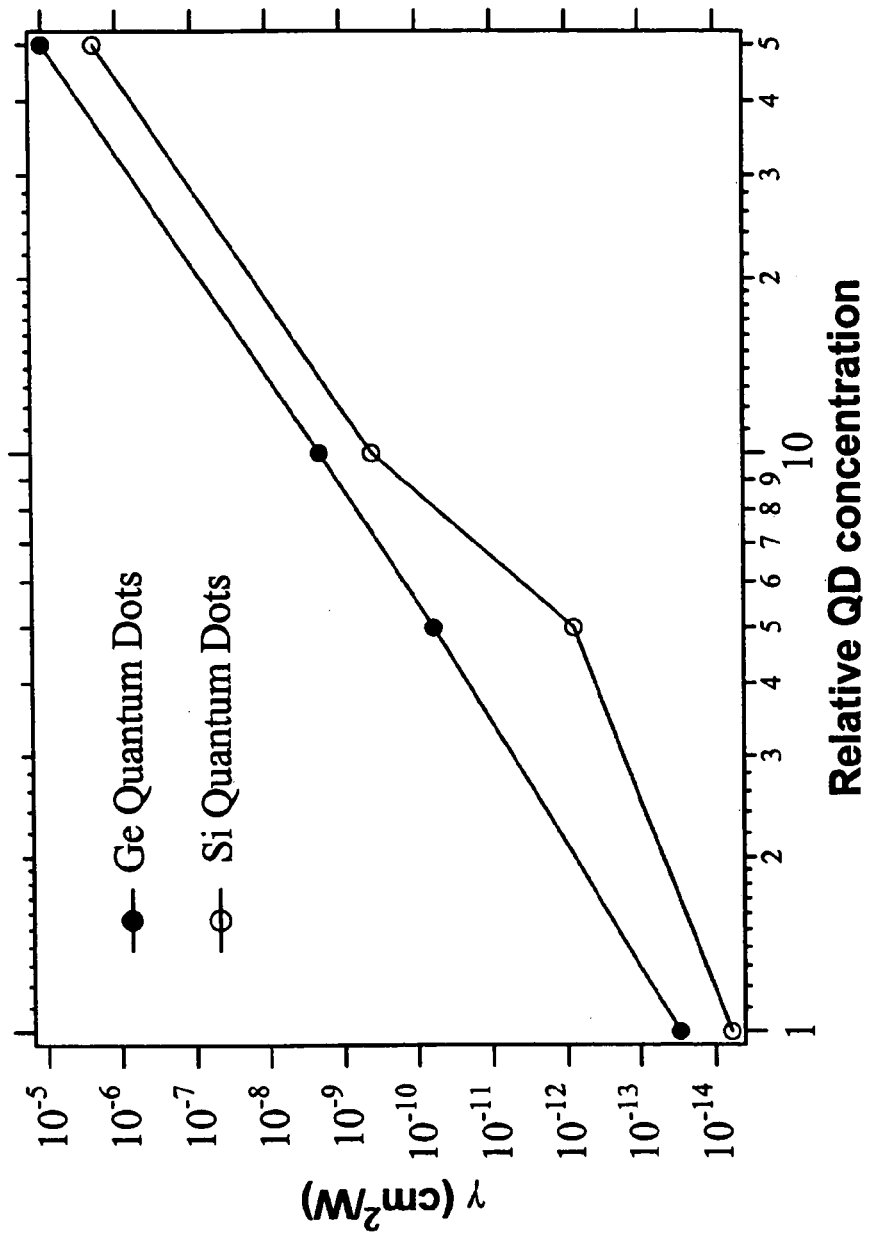
FIG. 5(b) illustrates concentration dependence of the optical nonlinearity of engineered nonlinear nanocomposite materials doped with silicon and germanium quantum dots, according to an embodiment of the invention.

2) Concentration Effects:

One important aspect of some embodiments of the invention is that the nonlinear properties of a material including quantum dots can be substantially affected by correlated interactions between two or more quantum dots. In particular, while $\chi^{(3)}$ can be proportional to concentration of quantum dots at low concentrations, as the concentration increases, the individual quantum dots can get close enough to interact with each other, producing collective phenomena that can further enhance nonlinearity. This effect is seen in FIG. 5(b), which illustrates concentration dependence of the optical nonlinearity of engineered nonlinear nanocomposite materials doped with silicon and germanium quantum dots, according to an embodiment of the invention. The silicon and germanium quantum dots were made in accordance with the methods described herein. The vertical axis represents the nonlinear index of refraction γ, and the horizontal axis represents the relative concentration of quantum dots in a matrix material. As shown in FIG. 5(b), γ can increase superlinearly with concentration at sufficiently high concentrations. The effect of concentration (and particularly the superlinear concentration dependence) on optical switching using quantum dots has not been previously considered as discussed herein.

For FIG. 5(b), γ arises as a result of nonresonant degenerate nonlinearities. The values attained for γ are particularly large. As shown in FIG. 5(b), the nanocomposite material doped with silicon quantum dots has γ as high as about $8\times10^{-5}$ cm$^2$/W, which is 9 orders of magnitude larger than the bulk material from which the silicon quantum dots are fabricated (bulk silicon has a nonresonant degenerate γ of about $8\times10^{-14}$ cm$^2$/W). Additional nonlinear enhancement can be induced through the appropriate selection of molecular species in the ligand layer (see discussion below on Molecular Tethers).

Summary of Nonlinear Optical Properties of Quantum Dots

Enhancement and tunability of the optical nonlinearity in individual quantum dots and multi-quantum dot nanocomposites, combined with substantially defect free and/or well passivated quantum dot cores, provide the engineered nonlinear nanocomposite materials according to some embodiments of the current invention. Such nanocomposite materials can satisfy various characteristics for an ideal $\chi^{(3)}$ based optical material that include (but are not limited to): large Re[$\chi^{(3)}_{ijkl}$] in the wavelength range-of-interest; a multi-photon transition that can be tuned to maximize near-resonance enhancement while minimizing optical loss due to absorption; the use of non-degenerate control and data beams where the control beam is resonant and induces a large index change at the data beam wavelength while introducing low optical loss at that wavelength; the use of degenerate control and data beams to allow cascading of devices; and low optical loss due to absorption by defects.

Colloidal Quantum Dots

Structures comprising quantum dots can be fabricated using vapor deposition, ion-implantation, photolithography, spatially modulated electric fields, semiconductor doped glasses, strain-induced potential variations in quantum wells, atomic width fluctuations in quantum wells, and a variety of other techniques. Preferably, quantum dots are formed or used in a form that can be easily incorporated into flexible or engineered optical materials or devices. In addition, it is desirable to separate the optical properties of the quantum dots from those of a matrix material to achieve a sufficiently large FOM with reduced absorption and/or scattering by the matrix material.

In a preferred embodiment, the current invention comprises colloidal quantum dots. Colloidal quantum dots are freestanding nanostructures that can be dispersed in a solvent and/or a matrix material. Such colloidal quantum dots are a particularly preferred material for some embodiments of the current invention because they can be more easily purified, manipulated, and incorporated into a matrix material.

It will be apparent to one of ordinary skill in the art-that the defining characteristic for a "colloidal" quantum dot is that it is a freestanding nanostructure. The method of fabrication, size, and shape of the particular colloidal quantum dot do not bear on its classification.

Chemical Properties

Chemically Controllable Surface

According to some embodiments of the invention, a unique physical characteristic of quantum dots is that, while the core can comprise a crystalline semiconductor material, the surface can be coated with a variety of different organic and/or inorganic materials. These surface coatings (e.g., shells or ligand layers) can impart stability and chemical activity, as well as passivation of electrically and optically active defect sites on the quantum dot surface. These surface coatings are optionally substantially different in chemical nature than the inorganic core. As a result, while quantum dots can comprise primarily a highly nonlinear semiconductor material, they substantially appear to the surrounding material as surface ligands. As such, the processability and chemical stability of this highly nonlinear and tunable optical material can primarily be a function of the surface layer and not a function of the material that provides the majority of the optical characteristics.

Surface ligands are preferably bi-functional. By bi-functional, it is meant that there are at least two portions of the surface ligand such that one portion interacts primarily with the quantum dot surface, while the second portion interacts primarily with the surrounding environment (e.g., solvent and/or matrix material). These at least two portions of the surface ligand may be the same or different, contiguous or noncontiguous, and are optionally contained within two or more different molecular species that interact with each other to form the ligand layer. The at least two portions can be selected from a group consisting of hydrophilic groups, hydrophobic groups, or amphiphilic groups. The interaction of each of the at least two portions and the quantum dot or surrounding environment can be covalent or noncovalent, strongly interacting or weakly interacting, and can be labile or non-labile. The at least two portions can be selected independently or together.

In some embodiments of the current invention, the surface ligands are selected such that the portion that interacts with the quantum dot passivates defects on the surface such that the surface is made substantially defect-free. At the same time, the portion that interacts with the environment is selected specifically to impart stability and compatibility (e.g., chemical compatibility or affinity) of the quantum dot within a matrix material that is selected for a specific application. Simultaneously satisfying both of these requirements is an important aspect of certain embodiments of the current invention relating to the development of an engineered nonlinear nanocomposite material. Alternative methods of achieving these requirements include (but are not limited to): 1) Passivating the surface of the quantum dot independent of the ligand layer (e.g., using a shell or creating an intrinsically defect free surface), while the environmental compatibility is imparted by the surface ligands, or 2) imparting both passivation and environmental compatibility independent of the ligand layer. Achieving passivation of the surface of quantum dots is one advantage of using colloidal quantum dots over alternate approaches.

Through the appropriate selection of surface ligands, quantum dots can be incorporated into a variety of matrix materials such as, for example, liquids, glasses, polymers, crystalline solids, and even close-packed ordered or disordered quantum dot arrays. The resulting nanocomposite materials can be formed into homogeneous, high-quality optical films of quantum dots. Alternatively, the chemistry can be selected to allow dispersion of the quantum dots into a matrix material with a controllable degree of aggregation, forming micron or sub-micron sized clusters. The result is an increased local fill-factor and an enhanced local field effect that may further increase the nonlinear response of the nanocomposite materials of embodiments of the present invention.

An important aspect of some embodiments of this invention relates to effectively separating the optical properties of the quantum dots from the optical, chemical, mechanical, and other properties of the matrix material. In this aspect, it is possible to combine the large nonlinearities of quantum dots with the ease of handling and processability of a matrix material such as a standard polymer. Thus, this aspect provides two additional features of an ideal $\chi^{(3)}$ based optical material: physical and chemical compatibility with specific device architectures and the ability to be easily processed for incorporation.

Molecular Tethers:

In addition to conveying stability and chemical compatibility with the surrounding environment, the ligand layer can optionally be used to tailor the physical, optical, chemical, and other properties of the quantum dots themselves. In this case, it is not just the chemical nature of the surface ligand but also the interaction of the surface ligand with the quantum dot that imparts an additional level of control over the physical, optical, chemical, and other properties of the resulting nanocomposite material. We refer herein to any molecule, molecular group, or functional group coupled (e.g., chemically attached) to the surface of a quantum dot that imparts additional functionality to the quantum dot as a "molecular tether". In some cases, the molecular tether can be electrically active, optically active, physically active, chemically active, or a combination thereof. The inclusion of molecular tethers into a quantum dot structure is an important aspect of some embodiments of the present invention.

Active species are used to precisely control the electrical, optical, transport, chemical, and physical interactions between quantum dots and the surrounding matrix material and/or the properties of individual quantum dots. For instance, a conjugated bond covalently bound to the surface of one or more quantum dots may facilitate charge transfer out of one quantum dot and into another. Similarly, a physically rigid active group bound in a geometry substantially normal to the surface of a quantum dot can act as a physical spacer, precisely controlling minimum interparticle spacing within an engineered nonlinear nanocomposite material.

As described above, collective phenomena (e.g., at high concentrations) are an important aspect of some embodiments of the current invention. This aspect can be further enhanced by allowing individual quantum dots to interact with one another using molecular tethers that foster interactions between quantum dots. At sufficiently high number densities, the molecular tethers begin to make contact with molecular tethers from other quantum dots or with other quantum dots directly. This can serve to augment nonlinearity by controlling the interaction between quantum dots and thus increasing the degree of collective phenomena compared to single particle phenomena. Molecular tethers may include, but are not limited, to conducting polymers, charge transfer species, conjugated polymers, aromatic compounds, or molecules with donor-acceptor pairs. These molecular tethers can foster electron delocalization or transport and thus can increase the interaction between quantum dots. Additionally, the molecular tethers can be selected to facilitate high quantum dot number densities without the detrimental aggregation that often plagues high concentration systems.

Molecular tethers can also be selected to impart stability of quantum dots under a variety of environmental conditions including ambient conditions. Molecular tethers can optionally contain chemically active groups to allow quantum dots to be attached to polymer backbones, along with other active molecules. This provides a method for controlling the density of quantum dots within close proximity of molecules that influence a variety of functions such as carrier transport or delocalization.

An additional aspect of the present invention is the use of molecular tethers to physically connect two or more quantum dots in a 1 dimensional, 2 dimensional, or 3 dimensional structure or array. Such quantum dot superstructures can be created to initiate multiple dot quantum interference interactions or collective phenomena yielding new and useful properties such as enhanced, nonsaturating optical nonlinearities. The length and properties of these molecular tethers can be tailored to enhance or generate specific quantum phenomena. These nanostructures can have the properties of single quantum dots or an ensemble of quantum dots depending on the nature of the molecular tethers. For certain applications, more than one type of molecular tether can be used to connect quantum dots.

The quantum dots according to some embodiments of the invention exemplify microscopic conditions that enhance the nonresonant optical nonlinearity arising from local electric field effects described above. Whether the quantum dot surface is terminated with oxide or ligand layer (e.g., molecular tethers), the result is a particle (e.g., a core of the quantum dot) with dielectric constant $\in_1$ surrounded by an environment (e.g., the surface oxide layer or molecular tethers) with dielectric constant $\in_2$ where $\in_1 > \in_2$. Therefore, the enhancement of the nonresonant optical nonlinearity can be engineered by the judicious choice of oxide or molecular tether without resorting to a surrounding bulk matrix material. In other words, a single quantum dot as described in this patent should exhibit an enhanced nonresonant optical nonlinearity since the surface layer functions as a surrounding matrix material with a lower dielectric constant. Optionally, molecular tethers can be used to connect quantum dots together without a separate matrix material. In this case, an extrinsic matrix material is not required since the individual interconnected quantum dots exhibit an enhanced local electric field effect.

A preferred approach of attaching appropriate molecular tethers to a quantum dot surface can be thought of as essentially treating a quantum dot as a very large molecule (e.g., a macro-molecule) and the molecular tethers as functionalizations of this large molecule. This creates a large three-dimensional structure with enhanced nonlinear optical properties resulting from the combination of quantum effects from the quantum dot and carrier polarization and delocalization effects from the molecular tethers and from the interaction of these two effects. These properties can be tailored by the choice of molecular tethers. In addition, a quantum dot can also represent a large and stable reservoir of polarizable charge that also contributes to a large nonlinear optical response.

Macroscopic Quantum Dot Solids

Macroscopic solids can be fabricated in which quantum dots form a substantially close-packed array (e.g., a cubic closed-packed array) in the absence of an extrinsic matrix material. These "quantum dot solids" can either be crystalline, polycrystalline, or amorphous. While containing a relatively high density of quantum dots, quantum dot solids can still be easily processed since, during formation, the quantum dots can be dispersed in a solvent that is subsequently removed. Uniform solid quantum dot films, for instance, can be formed using standard spin-coating techniques as, for example, described in C. R. Kagan et al., "Long-range resonance transfer of electronic excitations in close-packed CdSe quantum-dot solids," *Phys. Rev. B* 54, 8633 (1996), the disclosure of which is incorporated herein by reference in its entirety. In addition, surface ligands can still be selected to impart solvent compatibility and appropriate chemical stability to the final quantum dot solid. In contrast to the interconnected material described above, these macroscopic quantum dot solids are typically not held together by molecular bonds but rather by Van der Waals forces.

High-quality optical materials can be fabricated from quantum dot solids with substantially homogeneous optical properties throughout the material. The density of quantum dots can be tuned by modifying the length and/or structure of the surface ligands. Careful selection of surface ligands can produce continuously tunable densities up to a maximum fill-factor of about 75% by volume of the quantum dot solid, preferably between about 0.005% and 75% by volume (e.g., between about 10% and 75% by volume, between about 30% and 75% by volume, between about 50% and 75% by volume, or between about 60% and 75% by volume). The surface ligands are optionally removed partially or completely by heating or chemical treatment after the quantum dot solid is formed. More specifically, the length of the surface ligands can be used to define the spacing between quantum dots. By combining the ability to create density-controlled quantum dot solids with variable density quantum dots in a matrix material, the concentration of quantum dots, and therefore the nonlinear index of refraction of the materials described herein, can be tuned over many orders of magnitude.

In the case of quantum dot solids, the surface ligands can take the place of an extrinsic matrix material according to some embodiments of the current invention. In the case of close-packed quantum dots in which the surface ligands have typically been removed, the quantum dots themselves are considered to form their own "intrinsic" matrix material. Quantum dot solids according to some embodiments of the invention can be fabricated in a variety of ways, such as, for example, described in C. B. Murray et al., "Self-Organization of CdSe Nanocrystallites into Three-Dimensional Quantum Dot Superlattices," *Science* 270, 1335 (1995), C. R. Kagan et al., "Long-range resonance transfer of electronic excitations in close-packed CdSe quantum-dot solids," *Phys. Rev. B* 54, 8633 (1996), and U.S. Pat. No. 6,139,626 to Norris et al., entitled "Three-dimensionally patterned materials and methods for manufacturing same using nanocrystals" and issued on Oct. 31, 2000, the disclosures of which are incorporated herein by reference in their entirety. Quantum dot solids according to some embodiments of the invention can be fabricated with a variety of different quantum dot materials, sizes, and size distributions. It is also possible to form mixed quantum dot solids comprising a plurality of quantum dot materials, sizes, and size distributions.

Engineerable Nonlinear Nanocomposite Materials

One embodiment of the present invention comprises an engineered nonlinear nanocomposite material that combines the large nonlinear and size dependent optical properties of quantum dots with the processability and chemical stability of a matrix material and/or a chemically controlled quantum dot surface. By separately selecting the size and material of the quantum dot, the surface ligands, the matrix material, and the density of quantum dots within the matrix material, one can independently tune various significant characteristics in designing an ideal nonlinear optical material.

In particular, this embodiment of the present invention comprises the following characteristics that, taken together, in part or in whole, provides a substantially improved nonlinear optical material over what is known in the art.

1) The effects of quantum confinement and the specific selection of quantum dot material is used to create extremely large optical nonlinearities, specifically $\text{Re}[\chi^{(3)}_{ijkl}]$, in the data beam wavelength range-of-interest, while the energies of single- and multi-photon absorption features are selected to minimize absorptive loss of the data beam and heating and to optimize resonant enhancement effects. This optimization can include the use of appropriately chosen non-degenerate control and data beams. Alternatively, the nonlinear absorption mechanisms can be enhanced, e.g., $\text{Im}[\chi^{(3)}_{ijkl}]$ can be optimized, depending upon the application.
2) The matrix material is selected, independent of the quantum dot material and size, with the desired chemical and mechanical properties to impart physical and chemical compatibility with the specific device architecture and materials as well as the process of incorporation into devices.
3) The surface ligands of the quantum dots are selected to facilitate homogeneous incorporation of the quantum dots into the selected matrix material and are optionally selected to facilitate controlled aggregation of quantum dots within the selected matrix material.
4) The density of quantum dots in the matrix material is selected to precisely tune the linear index of refraction to match the boundary conditions for a given device architecture (in the case of high-index materials, a quantum dot solid can be used).

EXAMPLE 1

This example describes a preferred embodiment in which an engineered nonlinear nanocomposite material is incorporated into a nonlinear directional coupler that utilizes non-resonant or near-resonant nonlinearities. In the current example, the waveguide core is fabricated from doped silica with an index of refraction of 1.52 at 1.55 µm. It will be recognized by one of ordinary skill in the art that doped silica can have an index of refraction over a wide range of values. The current example is not meant to limit the scope of the invention, and it will be understood that variations on this example can extend to waveguide cores with an arbitrary index of refraction.

In the case of a nonlinear directional coupler, light is evanescently coupled between two waveguide cores such that a signal entering one waveguide core oscillates between the two as a function of the interaction length. By choosing an appropriate length, the light can be coupled completely into one or the other of the two waveguide cores (i.e., the "off" state can be transmission through one or the other waveguide core by appropriate device design). By changing the index of refraction between the waveguide cores, it is possible to switch the output waveguide core from the "off" state to the other waveguide core (i.e., the "on" state) for a fixed length device. An index change from a $\chi^{(3)}$ based nonlinear material can yield extremely fast optical switching. However, so far no single material has been appropriate for a commercial optical switch based on a nonlinear direction coupler.

The active material in this optical device desirably should have a large nonlinear response in the data beam wavelength range-of-interest. It is also desirable (primarily for nonresonant nonlinearities) to maximize resonant enhancement, while simultaneously avoiding significant single-or multi-photon absorption. At the same time, the linear index of refraction of the active material desirably should be less than that of the core material and be close to that of the rest of the cladding to avoid disruption of the optical mode as light is guided into the active region.

In this example, depicted in FIGS. 6(a) through 6(e), the device comprises doped silica waveguide cores 602 and 604 (n=1.552) fabricated on a doped silica substrate 606 (n=1.515). As shown in FIG. 6(b), the other three sides of the waveguide cores 602 and 604 are initially surrounded by air (n=1), as is the space between the waveguide cores 602 and 604 in the interaction region. The space around the waveguide cores 602 and 604 is then filled with an engineered nonlinear nanocomposite material 608 (n=1.515) to match the waveguide boundary conditions of the substrate 606, as shown in FIG. 6(c). By illuminating the interaction region with trigger-pulses as shown in FIGS. 6(d) and 6(e), the index of refraction between the waveguide cores 602 and 604 is changed, activating the switch.

Operation of this switch is slightly different than what is commonly described in the art. It is best understood by presupposing that the directional coupler length is chosen such that in the inactivated state, the two waveguide cores 602 and 604 exchange energy such that each output will receive substantially half of the power from each input (acting as a 3 dB coupler). If the illumination is such that the index of refraction increases in the nonlinear nanocomposite material 608, the interaction between the two propagating waveguide cores 602 and 604 will decrease, leading to a reduction in the data energy transferred between the cores 602 and 604, forcing the switch closer to a bar state. If the illumination is such that the index of refraction decreases in the nonlinear nanocomposite material 608, the interaction between the two cores 602 and 604 increases, increasing the energy transferred between the cores 602 and 604, forcing the switch closer to a cross state. One skilled in the art will recognize that this transfer function is cyclic and that further reduction of the index of refraction of the nonlinear nanocomposite material 608 will result in oscillations between the cross and bar states. If desired, the length of nonlinear directional coupler may be chosen to include several oscillations in the inactive state, leading to an effective bias in the total oscillations.

The engineered nonlinear nanocomposite material 608 for this example comprises silicon oxide coated silicon quantum dots or organic-terminated silicon or germanium quantum dots dispersed in a poly(methyl methacrylate) polymer matrix material (PMMA; n=1.49). PMMA is chosen here due to its desirable optical properties for use in the 1.55 µm range and its ease of processing in waveguide structures. Examples of these desirable optical properties include high optical transmissivity in the visible wavelength, relatively low absorption near 1550 nm, and low birefringence (as low as 0.0002 at 1550 nm has been observed).

In order to optimize degenerate nonresonant switching at 1.55 µm, silicon quantum dots with a diameter of around 4 nm are used, placing the 2-photon absorption peak at higher energy than the spectral energy range-of-interest. This is sufficient to minimize 2-photon absorption that may result in signal loss and heating, while maintaining a significant resonance enhancement at the wavelength of the trigger pulse. This particular combination of quantum dot material and size also yields a maximum in $\chi^{(3)}$ at 1.55 µm. To maximize near-resonant switching, the appropriate choice of control wavelength and quantum dot resonance at the control wavelength desirably should be chosen that minimizes or reduces absorption loss at the data wavelength.

To facilitate incorporation of the quantum dots into PMMA, the silicon or germanium quantum dots can be coated with a ligand layer comprising a long-chained hydrocarbon with a methacrylate functional group at the end. Alternatively, any functional group compatible with PMMA can be used. Quantum dots and PMMA are dissolved in an organic solvent, such as toluene, and applied to the device as shown in FIG. 6(c). The concentration of PMMA is determined based on the desired thickness of the final nanocomposite material and the method of application. In the case of spin-coating, a 5% PMMA solution is appropriate. The concentration of quantum dots is selected such that the final nanocomposite material, after deposition, has a linear index of refraction of 1.515. This is determined by calibrating the initial concentration of quantum dots (as measured by the absorption characteristics) to the final index of refraction of a PMMA-quantum dot film deposited in the method to be used. The linear index of the film can be measured using ellipsometry or the like.

After spin-coating the polymer-quantum dot solution over the device, the solvent is allowed to evaporate, leaving an engineered nonlinear nanocomposite coated device as shown in FIG. 6(c). The index of refraction around all sides of the waveguide cores 602 and 604 is matched and optimized for the specific device. At the same time, $\chi^{(3)}$ and the resonance conditions for 1.55 μm are independently tuned for optimum switching performance. As a final aspect of the current example, based on the known intensity of the trigger-pulse and the resulting nonlinear response of the engineered nonlinear nanocomposite material 608, the active length of the device is selected to provide optimal switching performance. This can be done by limiting the illumination area of the trigger-pulse to define the active area as in FIG. 6(d) or by designing the specific waveguide structure with the appropriate interaction length as in FIG. 6(e). The actual active length can be determined empirically or through simulation.

By increasing the index of refraction of waveguide cores, substantially larger concentrations of quantum dots can be incorporated into the active material while retaining functionality of the switch. This can yield substantially higher switching efficiency. For example, as shown in FIG. 6(f), with silicon waveguide cores 610 and 612 having an index of refraction of ~3.4, an active material 614 desirably should have an index of refraction equal to or less than 3.39 to achieve efficient waveguiding through the active region. This allows densities of quantum dots as high as those of close-packed quantum dot solids (either crystalline or amorphous).

EXAMPLE 2

To highlight the flexibility of embodiments of the current invention, this example describes a second preferred embodiment in which an engineered nonlinear nanocomposite material may be used in a waveguide nonlinear Mach-Zehnder (MZ) interferometer. In this case, as shown in FIGS. 7(a) through 7(f), a waveguide core is fabricated from partially oxidized silicon with an index of refraction of 2.4 at 1.55 μm. Once again, it will be apparent to one of ordinary skill in the art that partially oxidized silicon can have a range of indices of refraction, and that 2.4 is not meant to limit the scope of the invention. Variations on this example comprising other possible indices can be used depending on the specific application.

In the nonlinear MZI of the present example, a data signal traveling along a waveguide core is split into two separate and uncoupled waveguide arms with a defined phase relation between them. The signals travel along the arms for a predetermined length and are then recombined. Phase differences resulting from the propagation of the light in each arm result in constructive or destructive interference of the signals in the output waveguide core. By modulating the index of refraction of one or both of the arms, the output signal can be switched on or off by creating a relative 0- to π-phase shift between the signals. One of ordinary skill in the art will realize that further changes in index of refraction will result in cyclic exchange between the on and-off states. An index change from a $\chi^{(3)}$ based nonlinear material would yield extremely fast optical switching; however, so far no single material has been appropriate for a commercial switch based on this device.

As with the example above, the active material in this device desirably should have a high nonlinear response in the wavelength range-of-interest and no significant absorption. In this case, however, the nonlinear material is incorporated directly into the waveguide core. As such, the index of refraction of the engineered nonlinear nanocomposite desirably should be greater than that of the cladding material and be close to that of the core to avoid disruption of the optical mode as light moves into the active region.

In this example, as shown in FIG. 7(a), the device comprises a partially oxidized waveguide core (n=2.4) fabricated on a silica substrate (n=1.45) and surrounded by a silica cladding on three sides. The top of the waveguide core is bounded by air (n=1). A section of one of the waveguide arms is etched away as shown in FIG. 7(b), filled with an engineered nonlinear nanocomposite material (n=2.4) as shown in FIG. 7(c) to match the boundary conditions of the waveguide core, and then polished as shown in FIG. 7(d). By illuminating the active region with trigger-pulses as shown in FIGS. 7(e) and 7(f), the index of refraction in one arm is changed, thus activating the switch. A preferred engineered nonlinear nanocomposite material for this example comprises silicon oxide coated silicon quantum dots formed into a close-packed quantum dot solid with index of refraction tuned to 2.4.

In order to optimize switching at 1.55 μm, silicon quantum dots with a diameter of 4 nm are used, placing the 2-photon absorption peak at higher energy than the spectral energy range-of-interest. This is sufficient to eliminate or reduce 2-photon absorption that may result in signal loss and potential heating of the device by the trigger-pulse. This particular combination of material and size also yields a maximum in $\chi^{(3)}$ at 1.55 μm. To maximize near-resonant switching, the appropriate choice of control wavelength and quantum dot resonance at the control wavelength desirably should be chosen that minimizes or reduces any absorption loss at the data wavelength.

In order to achieve precise index of refraction control within the waveguide arm, surface ligands desirably should be selected to yield a specific particle-to-particle spacing within the final quantum dot solid. This can be achieved by measuring the index of refraction of many thin-films, formed by the method to be used, with quantum dots comprising different types of surface ligands. By using ellipsometry or the like, the index of refraction resulting from each type of surface ligand and deposition method can be determined and calibrated for determining the optimum conditions for the final device deposition. In the case of the present example, an index of 2.4 corresponds roughly to a packing density of 70% by volume. A short-chained hydrocarbon is preferable in this case, such as a butyl- or other alkyl group.

The quantum dots, in a solvent of hexane or toluene, are spin-coated over the surface of the device, filling the open region of the waveguide arm as shown in FIG. 7(c). A slow spin speed is preferable, since the thickness of the material in the waveguide arm can be controlled by polishing the overflow off the surface (1000 rpm). The concentration of quantum dots in the solution should be high, preferably in the range of 1 nM to 1M, more preferably 10 µM to 1 mM.

After spin-coating, the solvent is allowed to evaporate, creating a close-packed quantum dot solid filling the open region of the waveguide arm as shown in FIG. 7(c). The surface is then polished to provide an optical-quality interface on the topside of the device in the active region as shown in FIG. 7(d). The index of refraction of the engineered nonlinear nanocomposite is matched to that of the waveguide core of the arm and optimized for the specific device. At the same time, $\chi^{(3)}$ and the resonance conditions for 1.55 µm are independently tuned for optimum switching performance. As a final aspect of the current embodiment, based on the known intensity of the trigger-pulse and the resulting nonlinear response of the engineered nonlinear nanocomposite material, the active length is selected to provide optimal switching. This can be done by designing the etched length of the waveguide arm to the desired active length as in FIG. 7(e) or by limiting the illumination area of the trigger-pulse as in FIG. 7(f). The specific active length can be determined empirically or through simulation.

Figure 8A:
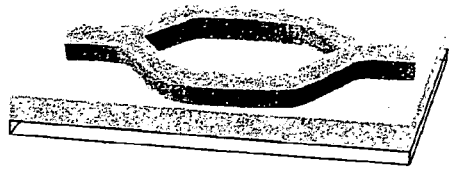
FIGS. 8(a), 8(b), 8(c), and 8(d) illustrate an alternative embodiment of a nonlinear MZ interferometer comprising an engineered nonlinear nanocomposite material.
Figure 8B:
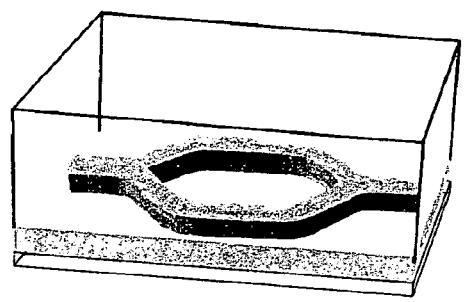
Figure 8C:
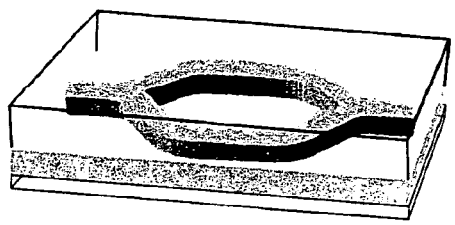
Figure 8D:
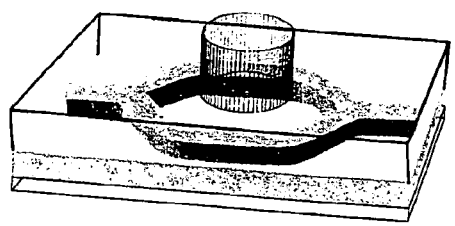

Alternatively, a nonlinear MZ interferometer can be fabricated without etching a portion of a waveguide core as shown in FIGS. 8(a) through 8(d). In this case, a engineered nanocomposite material can be simply cast on top of the entire device as shown in FIG. 8(b) with any excess removed as shown in FIG. 8(c), such that the active material is in evanescent contact with the signal passing through each of the arms (as well as elsewhere). By illuminating a portion of one or both arms, the active region can be defined as shown in FIG. 8(d). In this preferred embodiment, the engineered nonlinear nanocomposite desirably should be designed to have an index of refraction that is compatible with waveguiding in the partially oxidized silicon core (e.g., n<2.4). Again, this nanocomposite material is preferably a close-packed quantum dot solid.

Had further chemical processing steps been required in either of the above examples, it would also be possible to select the matrix material and/or surface ligands to impart stability of the engineered nonlinear nanocomposite under the required conditions.

The current embodiments not only provide a nonlinear material with a dramatically increased nonlinear response for use in these optical devices, they simultaneously provide materials that have been engineered to have optimum linear index of refraction, 2-photon absorption, near-resonance enhancement, and processability for each application. This level of independent control of optical, chemical, and mechanical properties does not exist in other materials.

Preferred Quantum Dot Materials

Preferred quantum dots according to some embodiments of the present invention comprise substantially defect free quantum dots with a well-passivated surface. Preferred quantum dots also comprise a bandgap energy that is preferably greater than the photon energy range-of-interest (e.g., for the data beam), and more preferably greater than twice the photon energy range-of-interest (primarily for nonresonant nonlinearities) for its intended applications. While maintaining these requirements, the material and size of the quantum dots can be interchangeable. The specific material and size can be selected as necessary to engineer the optical characteristics for a particular application. The following provides certain preferred characteristics according to some embodiments of the invention:

a) Core-Shell Quantum Dots:

Core-shell quantum dots are particularly preferred because defects can result in traps for electrons or holes at the surface of a quantum dot core. These traps can degrade the electrical and optical properties of the quantum dot, yielding low-energy states within the bandgap of the material. An insulating layer at the surface of the quantum dot core provides a rise in the chemical potential at the interface, which can eliminate energy states that serve as traps. Surprisingly, these trap states can actually interfere with efficient switching or decrease the FOM of a material by contributing to single or multi-photon absorption. Additionally, shells act to physically protect the core material from chemical interactions such as oxidation, reduction, or dissolution. For instance, one embodiment of the present invention relates to the use of a shell to stabilize intrinsically unstable silicon or germanium quantum dots. Optionally, the shell can provide an appropriate chemical surface for covalent or non-covalent binding of molecules to the quantum dot, wherein the core material may or may not provide an appropriate surface for such binding.

Preferably, a quantum dot will be substantially defect free. By substantially defect free, it is typically meant that within the quantum dot there is fewer than 1 defect per quantum dot, preferably substantially fewer than 1 defect per quantum dot, more preferably less than 1 defect per 1000 quantum dots, more preferably less than 1 defect per $10^6$ quantum dots, more preferably less than 1 defect per $10^9$ quantum dots. Typically, a smaller number of defects within a quantum dot translates into an increased photoluminescence quantum efficiency. For certain embodiments of the invention, a quantum dot that is substantially defect free will typically exhibit photoluminescence with a quantum efficiency that is greater than 6 percent, preferably greater than 10 percent, more preferably at least 20 percent, more preferably at least 30 percent, more preferably at least 40 percent, and more preferably at least 50 percent.

Preferably, the core will be substantially crystalline and be substantially defect-free. By substantially defect free, it is typically meant that within the core there is fewer than 1 defect per quantum dot, preferably substantially fewer than 1 defect per quantum dot, more preferably less than 1 defect per 1000 quantum dots, more preferably less than 1 defect per $10^6$ quantum dots, more preferably less than 1 defect per $10^9$ quantum dots.

Figure 9:
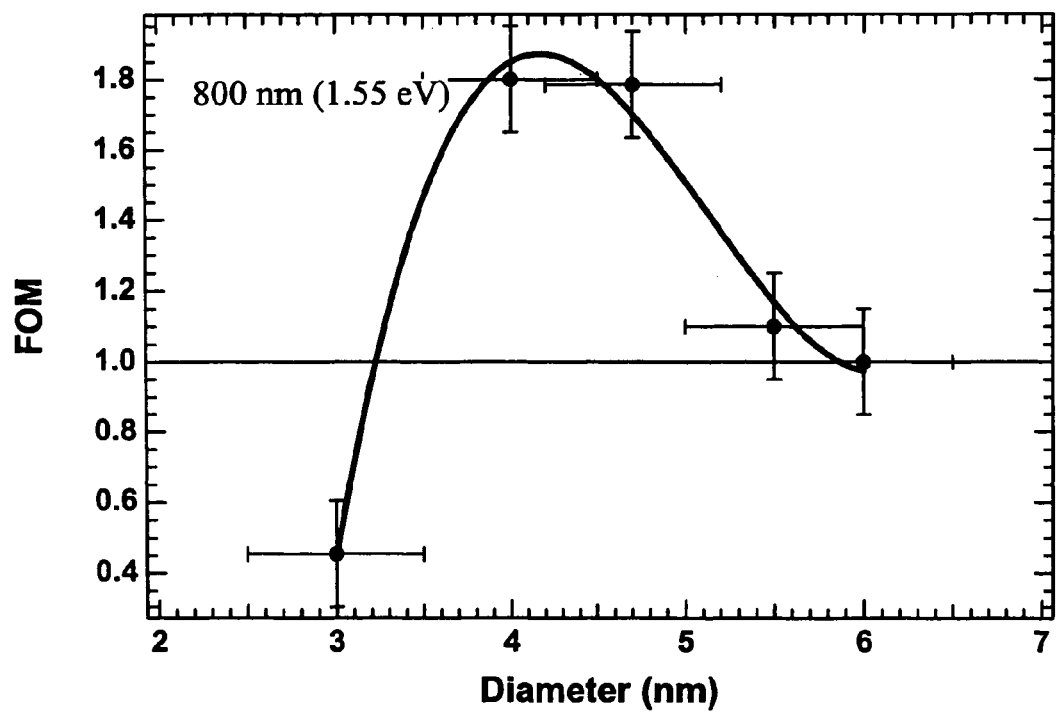
FIG. 9 illustrates a figure-of-merit (FOM) for all-optical switching with an engineered nonlinear nanocomposite material as a function of quantum dot size, according to an embodiment of the invention.

In a similar manner, the shell and/or the interface region preferably will be substantially defect free, where it is typically meant that within the shell and/or the interface region there is fewer than 1 defect per quantum dot, preferably substantially fewer than 1 defect per quantum dot, more preferably less than 1 defect per 1000 quantum dots, more preferably less than 1 defect per $10^6$ quantum dots, more preferably less than 1 defect per $10^9$ quantum dots.

b) Size and Size-Distribution:

Another preferred characteristic of the quantum dots of some embodiments of the present invention is such that a figure-of-merit (FOM) for all-optical switching or processing can be largely insensitive to size dispersion, contrary to results and predictions in the literature. FIG. 9 illustrates a figure-of-merit (FOM) for all-optical switching with an engineered nonlinear nanocomposite material as a function of quantum dot size, according to an embodiment of the invention. Here, the nanocomposite material includes germanium quantum dots made with methods described herein. The FOM in this case is defined as $2\gamma/\beta\lambda$, which is applicable for nonresonant nonlinearities. The criteria for effective all-optical switching is FOM >1. FIG. 9 shows how the FOM for all-optical switching depends on the size of the quantum dots. It can be seen that the FOM exceeds 1 for a large size dispersion, e.g., for diameters ranging from 3 nm to 6 nm. Similar results can be obtained with the other quantum dots described herein, e.g., silicon quantum dots. Therefore, some embodiments of the present invention avoid the need for a substantially monodispersed size distribution of quantum dots while substantially improving switching characteristics and efficiency over previous uses of quantum dots as nonlinear materials. The effects of size distribution and specifically how the FOM of switching depends on the quantum dot size has not been previously considered in detail.

c) Shape and Shape Distribution

Quantum dots can be fabricated in a variety of shapes, including (but not limited to) spheroids, rods, pyramids, cubes, and other geometric and non-geometric shapes. For shapes that are not spherically symmetric, a distribution of orientations can result in an effective broadening of the size distribution as seen by incident light. To avoid the need for orientation of quantum dots within a matrix material, the preferred quantum dot shape is spherical, according to some embodiments of the invention. Spherical quantum dots are also preferred for nanocomposites comprising oriented quantum dots. Alternatively, another preferred embodiment comprises spheroid or substantially spherical quantum dots, with an aspect ratio restricted to between 1±(% size distribution) or with an aspect ratio between approximately 0.8 and 1.2. In this case, orientation plays an insignificant role in the inhomogeneous broadening of the spectral features. For similar reasons, the preferred quantum dot will also be substantially monodisperse in shape. These considerations regarding the importance of shape and/or shape-distribution constitute an improvement in the use of quantum dots as a nonlinear material.

It should be recognized that an arbitrary shape may still be preferred as long as the relative orientation dependence of the broadening of the linear and nonlinear optical properties is less than the broadening resulting from the size distribution of the quantum dot sample.

d) Crystal Structure of the Core

For reasons similar to those described above for shape, preferred quantum dots according to some embodiments of the invention will have a core with a crystal structure that is spherically symmetric, more preferably a cubic or diamond crystal structure. Alternatively, the crystal structure may be non-spherically symmetric, preferably cylindrically symmetric, more preferably a wurtzite crystal structure.

It should be recognized that an arbitrary crystal structure may still be preferred as long as the relative orientation dependence of the broadening of the linear and nonlinear optical properties is less than the broadening resulting from the size distribution of the quantum dot sample. Once again, the considerations described here regarding the importance of crystal structure constitute an improvement in the use of quantum dots as a nonlinear material.

e) Semiconductor Materials

There are a variety of preferred quantum dot materials for some embodiments of the current invention. For any given application, the preferred materials can be determined based on the specific optical requirements for that application. Examples of such preferred materials include but are not limited to inorganic crystals of Group IV semiconductor materials including but not limited to Si, Ge, and C; Group II-VI semiconductor materials including but not limited to ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe and BaO; Group III-V semiconductor materials including but not limited to AlN, AlP, AlAs, AlSb, GaN, GaP, GaAs, GaSb, InN, InP, InAs and InSb; Group IV-VI semiconductor materials including but not limited to PbS, PbSe, PbTe, and PbO; mixtures thereof; and tertiary or alloyed compounds of any combination between or within these groups, including but not limited to GeSe, SnS, SnSe, PbS, PbSe, PbTe ZnGeAs$_2$, ZnSnP$_2$, ZnSnAs$_2$, CdSiAs$_2$, CdGeP$_2$, CdGaAs$_2$, CdSnP$_2$, and CdSnAs$_2$.

Quantum dots of many semiconductor materials can be fabricated, at least in part, using a variety of methods. Some preferred synthetic methods include those described for Group III-V and Group II-VI semiconductors as described in U.S. Pat. No. 5,990,479 to Weiss et al., entitled "Organo Luminescent semiconductor nanocrystal probes for biological applications and process for making and using such probes" and issued on Nov. 23, 1999; U.S. Pat. No. 5,262,357 to Alivisatos et al., entitled "Low temperature thin films formed from nanocrystal precursors" and issued on Nov. 16, 1993; U.S. Pat. No. 5,505,928 to Alivisatos et al., entitled "Preparation of III-V semiconductor nanocrystals" and issued on Apr. 9, 1996; C. B. Murray et al., "Synthesis and characterization of nearly monodisperse CdE (E=sulfur, selenium, tellurium) semiconductor nanocrystallites, " *J. Am. Chem. Soc.* 115, 8706 (1993); and in the thesis of C. Murray, "Synthesis and Characterization of II-VI Quantum Dots and Their Assembly into 3-D Quantum Dot Superlattices" (Massachusetts Institute of Technology, Cambridge, Mass., 1995), the disclosures of which are hereby incorporated in their entireties by reference.

The fabrication of some types of shells on quantum dots can be performed using a variety of methods. Preferred methods include those described in X. Peng et al., "Epitaxial Growth of Highly Luminescent CdSe/CdS Core/Shell Nanocrystals with Photostability and Electronic Accessibility," *J. Am. Chem. Soc.* 119, 7019 (1997) and B. O. Dabbousi et al., "(CdSe)ZnS Core-Shell Quantum Dots: Synthesis and Characterization of a Size Series of Highly Luminescent Nanocrystallites," *J. Phys. Chem. B* 101, 9463 (1997), the disclosures of which are hereby incorporated by reference in their entirety.

Two preferred materials for use in quantum dots are silicon and germanium, according to some embodiments of the invention. Both Si and Ge have bulk energy gaps that are less than 1.6 eV, making them ideal materials from which to fabricate quantum dots that exploit quantum confinement to enhance optical nonlinearities at telecommunications wavelengths (where photon energies are typically ~0.8 eV). The ideal chemistry of Group IV materials (as discussed below) further solidifies these choices.

In addition, the electron affinity or ionization potential of Group IV materials (e.g., Si and Ge) makes them amenable to forming strong and stable covalent bonds with organic and inorganic surface ligands, making them ideal for this purpose and for enabling quantum-dots that are stable in ambient as well as reasonably extreme environmental conditions. The significance of this capability can be better appreciated by recognizing that the surfaces of quantum dots comprised of more ionic materials often require surfactants or ionic species to cap, which involves less preferable and weaker van der Waals bonds, hydrogen bonds, or ionic bonds. Examples of these more ionic quantum dot materials include Group II-VI materials such as CdSe. These more ionic quantum dots often require complex processing to modify the ionic quantum dots so as to enable the more desirable covalent bonding between the quantum dot surface and surface ligands, e.g., a surface layer or layers comprised of a material different than the core quantum dot material typically needs to be added to the ionic quantum dot surface, wherein the attached surface layer or layers are amenable to covalent bonding to surface ligands. An example of such a surface layer is one comprised of CdS.

In addition, the chemical properties of Group IV materials (e.g., Si and Ge) are such that a stable oxide can be formed that serves to confine carriers and to passivate the surface to mitigate surface traps.

In addition, the Bohr exciton is relatively large in Ge (~12 nm), thus providing a large size range over which the beneficial effect of quantum confinement, as discussed in various sections herein, are relevant.

A Novel Quantum Dot Material

In one embodiment, the quantum dots are silicon quantum dots or germanium quantum dots that are surface passivated (or terminated) with an inorganic layer (such as oxides of silicon and germanium) and/or organic and/or inorganic surface ligands, herein sometimes referred to as SiQDs and GeQDs, respectively. SiQDs and GeQDs as described herein are novel types of quantum dots that show definitive quantum confinement effects as manifested by size dependent properties such as size-dependent energy gaps that can be tuned over a very broad range and in particular from the near infrared to the near ultraviolet. In addition, SiQDs and GeQDs are stable under a variety of environmental conditions including ambient (e.g., pressure: ~1 atmosphere; Gases: ~70% nitrogen, ~30% oxygen; Temperature: ~20–25 C) for desired periods of time depending on the specific application. A SiQD and a GeQD can be comprised of a substantially Si core for a SiQD and a substantially Ge core for a GeQD. In addition, the "surface" of the SiQD can be comprised of Si and inorganic elements such as oxygen and/or organic ligands (R). In addition, the "surface" of the GeQD can be comprised of Ge and inorganic elements such as oxygen and/or organic ligands (R).

In one embodiment of the invention, a SiQD comprises a substantially defect free silicon crystal core of diameter between approximately 1 nm and 100 nm, preferably between approximately 1 nm and 20 nm, more preferably between approximately 1 nm and 10 nm, while a GeQD comprises a substantially defect free germanium crystal core of diameter between approximately 1 nm and 100 nm, preferably between approximately 1 and 50 nm, more preferably between approximately 1 and 20 nm. In the case of an inorganic shell surrounding the silicon or germanium core, this shell typically has a thickness of between approximately 0.1 and 5 nm. One preferred inorganic shell is $SiO_n$ for SiQD and $GeO_n$ for GeQD with n ranging between approximately 0 and 2, preferably ranging between approximately 1.5 and 2, most preferably ranging between approximately 1.8 to 2. The chemical composition of the shell (e.g., relative amounts of Si (or Ge) and O) is potentially varying continuously through a portion of the shell and optionally varying discontinuously through a portion of the shell, in which case n can represent an averaged value within the shell. In the case of organic surface ligands terminating the surface, the SiQD and GeQD can comprise ligand layers comprising organic molecules with a structure R. R can be any one of a variety of hydrophobic, hydrophilic, or amphiphilic molecules (a list of preferred surface ligands is included below). The surface ligands can provide a surface coverage of available silicon (or germanium) and oxygen binding sites at the surface to provide between approximately 0% and 100% surface coverage, preferably between approximately 20% and 100% surface coverage, more preferably between approximately 50% and 100% surface coverage, more preferably between approximately 80% and 100% surface coverage, with a maximum of one or more complete layers of surface ligands. R can optionally comprise a plurality of different organic molecules at a plurality of absolute and relative densities. Finally, a SiQD or GeQD may optionally comprise additional R-groups that do not interact directly with the quantum dot surface, but rather indirectly through other R-groups interacting directly with the surface. In this case, surface coverage greater than 100% is possible.

It has long been considered that the production of an ambient-stable silicon quantum dot or germanium quantum dot with a defined oxide shell could not be achieved due to difficulties in growing a stable and trap-free surface oxide shell Thus, the SiQD and GeQD described herein represent a substantial advance.

Methods for fabricating SiQDs and GeQDs in accordance with some embodiments of the invention are discussed below. It should be noted, however, that the current invention refers to SiQDs or GeQDs synthesized by a variety of other methods in addition to those described herein. Some embodiments of the invention encompass various possible variations of composition of SiQD and GeQDs that-could be made while retaining the general characteristics of a substantially crystalline Si or Ge core and a substantially noncrystalline inorganic (e.g., oxide) shell or organic ligand layer.

Method One—"Top Down" Approach

A general method for the formation of quantum dots of some embodiments of this invention involves a "top down" approach in which "bulk" material is converted to nanostructured material in the form of quantum dots. In this approach, a form of energy is applied to a form of a material from which the quantum dot is to be made. The material can be in bulk form, hence the term "top down." The material in the bulk form is preferably converted to a fine powder, preferably as fine as possible, more preferably particles in the nanometer size regime (e.g., between approximately 1 nm and 100 nm) comprised of the material from which the quantum dot is to be made. One advantage of using a fine powder is that it leads to shorter processing times to achieve the desired quantum dot. The applied energy can be in the form of, for example, acoustic or vibrational energy (e.g., sound energy), optical energy (e.g., light energy), electrical energy, magnetic energy, thermal energy, chemical energy, or any combination thereof. More precise size control of the final quantum dots can be achieved by applying more than one source of energy to the starting material. Multiple sources of energy can be applied simultaneously or they can be applied in various sequential combinations. This also leads to shorter processing times to achieve the desired quantum dot. It is believed that the applied energy fractures or breaks the starting material into smaller particles and/or "grows" the starting material into larger particles by, for example, fracturing or breaking (e.g., "consuming") the smaller particles. In essence, this method evolves the starting material into the desired nanostructured form. This results in the unique quantum dots described herein in which a stable, well-formed, substantially defect-free inorganic shell is formed on the surface of the QD, as well as a defect-free interfacial region between the core and the shell. This shell imparts a high stability to the QDs under a variety of environmental conditions including ambient. In the specific case of an oxide shell, the oxide is stable and substantially defect-free.

Specific examples of "top-down" methods of formation of quantum dots of some embodiments of this invention follow:

EXAMPLE 1

Oxide-Terminated SiQDs

A powdered form of Si, from which Si quantum dots can made for some embodiments of this invention, is derived from porous silicon (PSi). A nanostructured PSi layer is removed and made into a fine powder. Energy is then applied in the form of sound energy through sonication and light energy through irradiation with a light source. The size of the SiQDs is determined by the duration and power of the sonication (with longer and higher power sonication giving rise to smaller quantum dots) and by the characteristics of the light source (with shorter wavelengths and longer irradiation times giving rise to smaller quantum dots).

The method in this example uses sonication periods sufficient to form stable and well-formed quantum dots with stable oxide surface termination that were not previously available. In addition, the method allows the size of the quantum dots to be controlled by the sonication period. In addition, the method also uses light irradiation as a means to control the size and the size distribution of the quantum dots, where shorter wavelengths of irradiation and longer irradiation times give smaller quantum dots and narrower size distributions. This light irradiation allows better control over the size and range of sizes of the quantum dots than previously available, with sizes ranging from ~1 nm to ~6 nm in diameter in one embodiment of the invention.

The result from the method of this invention is oxide-terminated SiQDs that are stable under a variety of environmental conditions including ambient. This stability results largely from the stable and substantially defect-free oxide shell and interfacial region between the core and shell.

PSi is formed using a variety of methods that include, but are not limited to, anodic electrochemical etching of p-doped or n-doped silicon as, for example, described in A. G. Cullis et al., "The structural and luminescence properties of porous silicon," *J. Appl. Phys.* 82, 909 (1997), the disclosure of which is incorporated herein by reference in its entirety. One preferred method includes starting with p-type (e.g., Boron-doped) silicon (Si) wafers comprising a plurality of orientations, with the (100) orientation being preferred. The wafer resistivity preferably ranges from 0.02 Ω-cm to 30 Ω-cm. The wafer is preferably between approximately 500–600 microns thick. Electrical contact to the wafer is made through a thin layer of metal (e.g., aluminum or platinum; preferably between approximately 100–500 microns thick) deposited on the backside of the wafer. Anodic electrochemical etching is performed on the wafer, which is placed in a solution comprising aqueous hydrofluoric acid (HF, preferably 48 wt %) and ethanol. The weight percentage of ethanol to aqueous HF ranges between approximately 0% and 60%, preferably between approximately 45% and 55%. Various conducting materials can be used as the counter electrode in which metals are an example. Examples of such metals include, but are not limited to, aluminum, copper, brass, and platinum.

The metal layer making electrical contact with the silicon wafer may optionally be protected from erosion in the acidic solution by isolating the metal layer from the solution. This can be achieved by sealing the silicon surface with a gasket such that the etching solution is substantially only in contact with the silicon side of the substrate. Alternatively, the electrode metal can be selected to be relatively inert under the selected etching conditions or can be selected with a thickness great enough to withstand the etching procedures described below.

Electrochemical etching of the Si wafer is carried out for various time durations (which can range from between approximately 2 and 200 minutes, depending on the starting parameters) using a constant current density ranging from between approximately 5 and 1000 mA/cm$^2$ with approximately 60 mA/cm$^2$ as a preferred current density and approximately 30 minutes as a preferred etching time. After etching, the surface of the Si wafer is left with a thin layer (between approximately 10 microns and 1 mm in thickness) of nanostructured material, which comprises PSi. The peak of the luminescence of the PSi ranges typically from 600 nm to 800 nm (or to greater than 800 nm).

The PSi is optionally rinsed with deionized water, dried under a stream of nitrogen gas, and placed in a vacuum chamber. The chamber is evacuated to a moderate pressure for several hours, preferably less than 1 Torr, more preferably less than 500 mTorr, and most preferably less than 100 mTorr. The samples are then transferred to a solvent-free environment (e.g., a drybox). The nanostructured PSi layer is then mechanically removed or scraped (which can be accomplished, for example, with a knife edge or scalpel) from the Si substrate, and the removed material is collected. The nanostructured PSi layer can also be separated from the Si wafer through a second electrochemical etching process in which low concentration HF/H$_2$O (preferably between 0.5 and 2%) and a high current density (preferably greater than 160 mA/cm$^2$) is used for a few minutes to separate the anodized and nanostructured PSi layer from the Si substrate.

After the PSi layer has been separated from the silicon substrate, the PSi is ground into a fine powder (using, for example, a mortar and pestle and/or a mechanical agitator) yielding about 25 to 40 mg of powdered PSi from a wafer surface area measuring approximately 1 inch in diameter. The peak of the PL spectra of the powder is in the red spectral region and ranges any where from 600 nm to greater than 800 nm, depending on the conditions of the electrochemistry. A solvent is then added to the powdered PSi. Preferred solvents include, but are not limited to, acetonitrile, toluene, hexane, methanol, ethanol, ethylene glycol, and water. In the case of organic solvents, the solvent may be dried over a dehydrant (e.g., calcium hydride or magnesium sulfate), distilled, and degassed prior to being added to the PSi.

The resulting mixture of PSi powder and solvent is placed in a bath and sonicated with acoustic waves or sound energy for a period of time. Although acoustic energy is being disclosed, it is to be understood that other types of energy may be used, as discussed above. The sonication can be accomplished with a variety of equipment that emits acoustic waves or vigorously agitates or shakes the powder, with an ultrasonic bath being a particularly convenient method.

The size and size distribution of the quantum dots in the mixture can be controlled by varying the duration of sonication. The precise period of time required for sonication depends on a number of factors that include the acoustic power of the sonicator, the solvent used, the initial size and size distribution of the nanostructures in the PSi powder, etc., and the characteristics of the sonication should be calibrated for the specific processing conditions used. A factor determining the optimum time duration of the sonication is the time required to achieve the desired size of the resultant quantum dots, i.e., the sonication is continued until the desired quantum dot size is reached (e.g., until cores are formed with diameters within a predetermined or desired range). Generally, the size of the quantum dots decreases as the sonication time increases, and the size of the quantum dots can be determined by the energy gap or the peak wavelength of the photoluminescence of the colloidal suspension of quantum dots. The relationship between quantum dot size and energy gap and the relationship between the PL peak wavelength and quantum dot size for silicon quantum dots were previously described with respect to FIGS. 2 and 3. Therefore, the photoluminescence spectrum of the colloidal suspension can be periodically taken during the sonication process to monitor the progress of the sonication. Typically, the PL peak wavelength shifts towards shorter wavelengths (corresponding to a shift towards smaller peak sizes) during the sonication process. Once the sonication time is calibrated for the processing conditions used to give the desired quantum dot size, this method can give very consistent results.

Another factor that can be used to determine the optimum time duration of the sonication is the time required to achieve the desired shells for the resultant quantum dots, e.g., the sonication is continued until oxide shells are formed having desired properties as discussed herein. If desired, the sonication time can be calibrated for the processing conditions used to give the desired photoluminescence quantum efficiencies.

As mentioned above, the precise relationship between sonication time and the quantum dot size that results depends on several parameters that may need to be calibrated with each specific fabrication setup and conditions. The following is an example that serves as a point of reference. With a sonication power of 80 W and with methanol as the solvent, a sonication period of 10 days resulted in oxide-terminated Si quantum dots with an average size of ~1.5–1.7 nm in diameter and emitting in the near ultraviolet-blue; a sonication period of 3 days resulted in quantum, dots with an average size of ~2.5 nm in diameter and emitting in the green; a sonication period of 1 day resulted in quantum dots with an average size of ~3.6 nm in diameter and emitting in the red.

Upon removal from the ultrasonic bath, the mixture is allowed to settle and is centrifuged, and the supernatant is filtered to remove any large particles. Preferred pore sizes of the filter range between approximately 20 nm and 450 nm. Filters can also be used to separate the different sizes of quantum dots. Additionally, other separation techniques such as chromatography, more specifically gel permeation chromatography or size exclusion chromatography, can be used to separate the different sizes of quantum dots. The result is a colloidal suspension of oxide-terminated Si quantum dots (SiQDs) of various sizes that are stable in a variety of environmental conditions that include ambient (room temperature, pressure, and atmosphere).

As mentioned above, more precise size and size distribution control of the final quantum dots can be achieved by applying more than one source of energy to the starting material. In one preferred method, two sources of energy are applied to the starting material. One additional preferred source of energy is light energy. In this example of a preferred method, the sample is irradiated with light during or sequentially with sonication. The light source can be a lamp (e.g., Tungsten, Xenon, or Mercury), a light emitting diode (LED), a laser, or any other light source capable of emitting light at the appropriate wavelengths, where "appropriate wavelengths" is described below. Alternatively, irradiation can be implemented during the electrochemical etching process (in which the etched surface of the Si wafer is irradiated). The size of the quantum dots that result is determined by a number of parameters including wavelength, intensity, spectral bandwidth, and duration of irradiation. Preferably, the wavelength of irradiation should be within the spectral region where the light is absorbed by at least a subset of the quantum dot sizes to be controlled. Specifically, within a size distribution of quantum dots, the longer the wavelength of the irradiation, the larger the size of the resulting quantum dots. More specifically, to achieve a specific size SiQD, the sample should be irradiated with photons of energy approximately equal to the energy gap of the desired SiQD. This effect can be accentuated by increasing the duration and/or intensity of irradiation. In particular, the size and size distribution of the quantum dots in the mixture can be controlled by varying the duration of irradiation. The optimum time duration of the irradiation is the time required to achieve the desired size and/or size distribution of the resultant quantum dots, i.e., the irradiation is continued until the desired quantum dot size is reached (e.g., until cores are formed with diameters within a predetermined or desired range) and/or until the desired size distribution is reached (e.g., until substantially monodisperse quantum dots are formed).

For any specific set of synthesis parameters, the precise relationship between irradiation wavelength, irradiation intensity, irradiation duration, and quantum dot size should be calibrated as is done in the case of the sonication method alone. This can be achieved by monitoring the energy gap or peak wavelength or spread of the photoluminescence at various times during the irradiation as an indicator of the progress toward the desired quantum dot. Typically, the photoluminescence has a peak wavelength that shifts towards shorter wavelengths (corresponding to a shift towards smaller peak sizes) and a wavelength spread that narrows (corresponding to a shift towards narrower spread in sizes) during the irradiation process.

The following serves as examples or points of reference. Simultaneously irradiating and sonicating the sample as described above for 5 days with 50 mW of laser light at 400 nm results in oxide-terminated SiQDs that luminesce in the near ultraviolet-blue spectral region; simultaneously irradiating and sonicating the sample as described above for 2 days with 100 mW of laser light at 532 nm results in oxide-terminated SiQDs that luminesce in the green spectral region; simultaneously irradiating and sonicating the sample as described above for 0.5 days with 150 mW of laser light at 620 nm results in oxide-terminated SiQDs that luminesce in the red spectral region.

The result of this "top down" approach is oxide-terminated Si quantum dots that are stable in a variety of environmental conditions, including ambient. This capability was previously thought to not be possible. This is achieved in the "top down" approach through the establishment of a stable and substantially defect-free silicon oxide shell surrounding the Si quantum dot core.

The defect-free nature of the resulting SiQDs is manifested in the quantum efficiency of the photoluminescence from these SiQDs. The presence of defects in quantum dots can trap excited carriers (electrons and holes). These trapped carriers can either nonradiatively relax, or they can radiatively recombine in a defect. Both processes lead to a low quantum efficiency for the photoluminescence from the quantum dots. Previous quantum dots formed of Si or Ge typically exhibited photoluminescence quantum efficiencies of ~1–5%. In contrast, the photoluminescence quantum efficiency of the SiQDs made with the methods of some embodiments of this invention is greater than 6%, preferably at least or greater than 10%, more preferably at least 20%, more preferably at least 30%, more preferably at least 40%, and more preferably at least 50% (e.g., as high as between approximately 50% and 60%). This represents the largest photoluminescence quantum efficiency observed for such quantum dots.

FIG. 3 shows global PL spectra of six samples of different sized oxide-terminated Si quantum dots made with the method described herein. FIG. 3 shows that the light emission can be readily tuned from the red to the ultraviolet, and as a result, the size can be readily tuned as well. And, this light emission is stable in a variety of environmental conditions including ambient.

The electronic and optical properties of these SiQDs that are made in this fashion are unique in that they show size dependent properties that are uniquely consistent with quantum confinement. The optical and electronic properties of these Si quantum dots are uniquely consistent with theoretical calculations more sophisticated than Effective Mass approaches, such as the Empirical Pseudopotential Method and the Tight Binding Method. A comparison of the size dependent energy gap calculated by these methods and with measurements taken on the SiQDs synthesized by the method disclosed herein is shown in FIG. 2. The agreement is extremely good and is the best observed for any quantum dots formed of Si.

The use of light to control the physical size or size distribution of the quantum dots in this synthetic process is a particularly novel aspect of certain embodiments of the present invention. Previous methods have typically used optical excitation not for control of the physical parameters of the quantum dots but to initiate the chemical reaction needed for quantum dot formation, i.e., to photolyze the chemical precursors. As described above, embodiments of the invention utilize optical control over the physical parameters of quantum dots in a synthetic method. This aspect is also applicable to other quantum dot synthetic procedures and is not limited to those described herein with respect to SiQDs and GeQDs.

Overall, the size and size distribution of the resulting SiQDs can be precisely controlled by varying the duration of sonication processing, the strength or intensity of the acoustic energy of the sonication device, the photon wavelength (photon energy) of irradiation, the intensity of irradiation, the spectral width of irradiation, the duration of irradiation, the size and size distribution of the starting material, and the solvent into which the starting material is incorporated. For certain embodiments of the invention, the average SiQD size can be varied from ~1 nm to greater than 6 nm with this technique. These average sizes give rise to light emission from the infrared to the ultraviolet.

Alternatively, PSi can be fabricated using n-doped Si wafers. In this case, a process similar to that described above can be followed. However, the electrochemical etching process may be performed in the dark, and the wafer desirably should be illuminated with a light source (UV light being preferred) during etching in order to generate "holes" (as opposed to electrons) needed in the etching process.

EXAMPLE 2

Oxide-Terminated GeQDs

In the synthesis above, the reactants and starting materials can be replaced with their germanium counterparts for the formation of GeQDs. As shown in FIGS. 4(a) and 4(b), GeQDs of sizes ranging from 1 nm to 16 nm have been synthesized using the method according to an embodiment of the invention.

The electronic and optical properties of these GeQDs that are made in this fashion are unique in that they show size dependent properties that are uniquely consistent with quantum confinement. The optical and electronic properties of these GeQDs are uniquely consistent with theoretical calculations more sophisticated than Effective Mass approaches, such as the Empirical Pseudopotential Method and the Tight Binding Method. A comparison of the size dependent energy gap calculated by these methods with measurements taken on the GeQDs synthesized by the method disclosed herein is shown in FIG. 4(a). The agreement is extremely good and is the best observed for any quantum dots formed of Ge.

Method Two—"Bottoms Up" Approach

In another embodiment, quantum dots can be fabricated from chemical precursors. This is essentially a "bottoms up" approach in which the quantum dots can be assembled "atom-by-atom" through chemical synthesis.

The present invention provides general high yield methods of synthesizing surface-functionalized quantum dots and, in particular, methods of synthesizing soluble quantum dots of a Group IV semiconductor material in a solution at relatively low temperatures.

The methods can be described by reference to the following:

Method 2-a:

$$YX_a + \text{Reducing Agent} \rightarrow (Y)X \qquad (1)$$

$$(Y)X + \text{Capping Agent}(R) \rightarrow (Y)R \qquad (2)$$

Method 2-b:

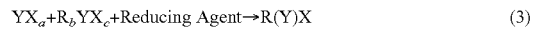

$$YX_a + R_b YX_c + \text{Reducing Agent} \rightarrow R(Y)X \qquad (3)$$

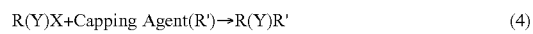

$$R(Y)X + \text{Capping Agent}(R') \rightarrow R(Y)R' \qquad (4)$$

wherein $YX_a$ is a source of Y, with Y being Si or Ge, and X is selected from the group consisting of —F, —Cl, —Br, —I, —O—CO—R$^{(1)}$, —NR$^{(2)}$R$^{(3)}$, —O—R$^{(4)}$, —S—R$^{(5)}$, and so forth, with R$^{(1)}$, R$^{(2)}$, R$^{(3)}$, R$^{(4)}$, and R$^{(5)}$ independently selected from the group consisting of alkyls, alkenyls, alkynyls, aryls, and so forth. The reducing agent is selected from either activated metals (e.g., Group IA, Group IIA, transition metals, and lanthanides) or hydrides (Group IIIB hydrides, Group IVB hydrides, and transition metal hydrides). Electrochemical reduction can also be used for reduction. The capping agent(R) and the capping agent(R') are sources of surface ligands R and R', respectively, and can be selected from organometallic reagents, e.g., RM (or R'M), with R (or R') being a surface ligand (e.g., a linear or branched alkyls, alkenyls, alkynyls, ether, ester, acid, amide or nitrile moiety having between 1 and about 20 carbon atoms). It should be recognized that the surface ligands R and R' can be the same or different. The capping agents can also be an alcohol, amine, thiol, and so forth. M is preferably from Group IA, Group IIA, or Group IIB. In the above, "a"

represents an oxidation state or coordination number of Y in the source of Y, which is typically 2, 4, or 6, and "b" and "c" are integers that can each range from 1 to 6. "a" is typically equal to the sum of "b" and "c". In method 2-a, (Y)X represent intermediate particles comprising cores including Y and with surfaces terminated with X, and (Y)R represent quantum dots that are formed with surfaces terminated with R. In method 2-b, R(Y)X represent intermediate particles comprising cores including Y and with surfaces terminated with R and X, and R(Y)R' represent quantum dots that are formed with surfaces terminated with R and R'.

The basic strategy involves solution phase reduction of $Si^{a+}$ or $Ge^{a+}$, where a represents the oxidation state of Si or Ge, and subsequent termination with organic or organometallic reagents. The methods according to some embodiments of the invention allow mild synthesis, precise manipulation, functionalization, and interconnection of the Group IV quantum dots to an extent not previously achieved. The key differentiations between previously used methods and the methods according to some embodiments of the invention include one or more of the following:

1. Some embodiments can avoid arduous procedures typically associated with the use of highly pyrophoric and air-sensitive starting materials, such as Group IV Zintl compounds or sodium metal. The Group IV Zintl salts are typically prepared by combining starting materials (e.g., K and Si) at elevated temperature (500–900° C.) in a sealed tube for a few days. As an example, a method of some embodiments of this invention uses milder and air-stable reducing agents such as magnesium (Mg), other Group IIA metals, transition metals, or lanthanides. This makes the method more amenable to scale up and large scale manufacture.
2. Some embodiments provide a method in which the reaction conditions are less extreme than required by previous methods. In particular, a method of some embodiments of the invention avoids the high pressure and high temperature conditions as sometimes previously used that can produce large amounts of undesirable insoluble materials.
3. Some embodiments need not utiltize high energy sonochemical techniques for reduction of $Si^{4+}$, which has typically produced either small amorphous particles with ill-defined surface composition or larger insoluble aggregates with an irregular network.
4. Some embodiments need not utilize highly toxic gaseous Group IV hydrides and pyrophoric metal hydrides.
5. The yields from the method of some embodiments in this invention are significantly higher than in previously reported methods. In some embodiments, the yields that can be obtained are between approximately 35% and 95%.
6. The size control that can be achieved is greater than previous methods.
7. The range of sizes possible that can be produced is greater than-achievable with previously reported methods. Some embodiments allow production of different sizes of quantum dots that can give rise to infrared to ultraviolet light emission (e.g., not limited to production of smaller quantum dots that emit primarily in the blue and blue-green region).
8. The resultant quantum dots are not limited to certain size distributions (e.g., the size distribution control that can be achieved is greater).
9. Some embodiments afford quantum dots with defined surface composition and high surface coverage with surface ligands.
10. The resultant quantum dots are more stable than those produced from other methods and have the unique properties as described herein.
11. The resultant quantum dots are more crystalline than those produced from other methods.
12. Quantum dots can be produced with higher amounts than achievable with other methods. (e.g., in quantities of at least ten grams).

The functionalization of quantum dots using methods 2-a or 2-b allows functional group inter-conversion at the surface of intermediate particles produced in equations 1 or 3 with appropriate organic reagents in equations 2 or 4 to form ligands layers. The intermediate particles typically will comprise cores that include Y. The organic functionalization of these quantum dots imparts favorable solubility in common organic solvents and compatibility in various matrix materials such as organic polymers, inorganic polymers, gels, glasses, and the like.

Method 2-a is based on controlled chemical reduction of readily available molecular $Si^{a+}$ and $Ge^{a+}$ reagents, where a ranges from 2 to 6 and typically from 2 to 4, and the quenching of the corresponding intermediate particles (Y)X with different reagents in a reaction medium. Two suitable families of reducing agents are activated metals and hydrides. A nonaqueous reaction medium desirably should be used for the reduction of silicon and germanium reagents because of the large negative reduction potential and high oxophilicity of Group IV compounds. The controlled addition of a capping agent(R) such as RM (R=alkyl, aryl, etc. and M=Li, Na, MgA, ZnA, with A being a halogen, and so forth) to the corresponding intermediate particles at relatively low temperatures produces the functionalized quantum dots in high yield.

In a further effort to control quantum dot particles and size distributions, terminating agents, $R_b YX_c$ can be employed using method 2-b (equation 3). R group, in this method, serves as the terminating agent for the quantum dots. The ratio of $R_b YX_c$ to the $YX_a$ reagent in equation 3 can be used as a basic measure of the surface-to-volume ratio of the quantum dots. A mixture of $YX_a$ and $R_b YX_c$, in the presence of a reducing agent, yields the corresponding intermediate particles, R(Y)X, which can be treated with a capping agent(R') such as R'M to displace the remaining leaving groups, X, on the surface of the intermediate particles (equation 4). This methodology can, in principle, produce highly functionalized quantum dots.

A preferred method of this chemical synthetic method is described as follows.

A silicon source, e.g., $SiCl_4$, is reacted with a reducing agent, e.g., Mg powder, under an inert atmosphere, e.g., argon. These materials are heated together in a liquid-phase reaction medium. The reaction medium should desirably be aprotic. It can be a hydrocarbon, or it could be aromatic. It could be a cyclic or acyclic ether, an aromatic ether, or a polyether. It could contain oxygen, nitrogen, sulfur, and/or phosphorous (so long as it is compatible with the other reagents). It can include an organic solvent with various combinations of more than one hetero-atom or any combination of the solvents discussed previously. Representative solvents include alkanes such as heptane, decane, and octadecane; aromatics including benzene, tetralin, and naphthalene; and alkylaromatics such as toluene, xylene, and mesitylene; ethers such as dialkylethers, diarylethers, alkylarylethers, and cyclic ethers; and polyethers like glymes.

In this process, a Group IV source, such as providing $Si^{4+}$, $Ge^{4+}$, or $Ge^{2+}$, especially in the form of halides or with corresponding 1–20 carbon organic substituent (RA, R=organic substituent, A=O, S, N, Si, etc.), is reacted with a reducing agent, such as a Group IA compound, Group IIA compound, transition metal, lanthanide, or hydride, in liquid phase reaction medium at an elevated temperature. Representative Group IV sources include $SiF_4$, $SiCl_4$, $SiBr_4$, $SiI_4$, $GeF_4$, $GeCl_4$, $GeBr_4$, $GeI_4$, $GeCl_2$, $GeBr_2$, $GeI_2$, $SiR_4$, $Si(OR)_4$, $Si(SR)_4$, $Si(NR^{(1)}R^{(2)})_4$, $Si(O_2R)_4$, $Si(SiR)_4$, $GeR4$, $Ge(OR)_4$, $Ge(SR)_4$, $Ge(NR^{(1)R(2)})_4$, $Ge(O_2R)_4$, $Ge(SiR)_4$, $Ge(NR^{(1)}R^{(2)})_2$, as well as the dimmers and the higher oligomers of the above reagents (R, $R^{(1)}$, $R^{(2)}$=organic substituent). Representative reducing agents include Li, Na, K, Na/K alloy, Rb, Cs, Be, Mg, Ca, Sr, Ba, Sc, Ti, Zr, Mn, Fe, Co, Ni, Pd, Cu, Zn, Ce, Sm, Gd, Eu, $LiAlH_4$, $NaBH_4$, Super-hydride, L-Selectride, $RSiH_3$, $R_2SiH_2$, $R_3SiH$ (R=organic substituent), and the like. Reducing agents can be provided in a variety of forms (e.g., as a powder, a liquid, a solid, and so forth). For certain reducing agents (e.g., a Group IIA compound such as, for example, Mg), it is desirable to provide such reducing agents in a powdered form to facilitate reaction with the Group IV source. Alternatively, or in conjunction, it is desirable to provide such reducing agents in other forms such as in the form of chips, a mesh, dendritic pieces, ribbons, rods, turning or activated (e.g., "Rieke magnesium", etc.).

One or two of each of these two groups of materials are mixed together in the reaction medium (e.g., an anhydrous aprotic solvent) for at least few minutes. For some embodiments, the reaction between a source of Si or Ge and a reducing agent is performed by maintaining the reaction medium at a temperature between approximately −78° C. and 300° C., preferably between approximately 60° C. and 280° C., and at around ambient pressure (e.g., about 1 atm) for a period of time between approximately 2 and 48 hrs. For some embodiments, the reaction between Na and silicon reagents can require an elevated temperature and a prolonged period to complete. The reflux temperature of the reaction medium can be used. Elevated pressures of up to about 100 atmospheres can be used to obtain higher temperatures. Suitable temperatures range between approximately 25 and 300° C.

In an additional step in the same pot, the intermediate product, which is chemically labile, can be functionalized with organic substituents when treated with an appropriate reactive material (e.g., capping agent, surface ligands, molecular tethers, terminating agents, passivator, etc.). These reagents can be organometallic reagents, RM (R=surface ligand such as alkyl, aryl, heteroaryl, and so forth and M=Li, Na, MgA, ZnA, with A being a halogen, and so forth), alcohols, amines, amides, thiols, phosphines, oxyphosphines, acids, silanes, gennanes, oxides, silanols, and germanols or their corresponding anion salts. Representative ligand sources include organolithium reagents (e.g., n-butyllithium, sec-butyllithium, tert-butyllithium, n-hexyllithium, and phenyl lithium); Grignard reagents (e.g., octyl-magnesium halide, phenylmagnesium halide, and allylmagnesium halide); alcohols (e.g., ethanol, isopropyl alcohol, and phenol); amines and thiols (e.g., diethylamine, octylamine, and hexylthiol); and the like.

For some embodiments, the reaction between the intermediate particles or nanocrystallites and the source of surface ligands can require a prolonged period to complete and can require an elevated temperature. Suitable temperatures range from room temperature to about 100° C. The reaction can be completed in between approximately 2 and 100 hours at ambient temperature. Subsequent work-up affords the organically functionalized quantum dots as a powder. The subsequent work-up preferably involves the addition under an inert atmosphere (e.g. argon) of acidic water to destroy the unreacted reducing agent or the organometallic reagent. The product can be extracted with organic solvents. The solvent can be a hydrocarbon, an aromatic, or a mixed hydrocarbon fraction. It could be an ether or a polyether. It could be ester. It could contain nitrogen, sulfur, and/or halides (so long as it is not very soluble in water). Representative solvents include hexanes, decane, toluene, xylene, diethyl ethers, glyme, dichloromethane, chloroform, ethyl acetate, carbon disulfide, and the like. The extraction process desirably should be repeated several times to improve the yield.

The product is a quantum dot powder that can be isolated by removing the solvent. This can be carried out by evaporation, filtration, and the like.

The synthetic method described above is associated with yields in the range of 35 to 95%, which are significantly higher than previously obtainable. A broad range of particle sizes can be achieved, e.g., between approximately 1–100 nm.

Various factors can affect particle size, including the nature of the reaction medium, the nature of the reducing agent, the nature of the starting material, the ratio of reagents employed, concentration, temperature, and pressure employed. The reaction medium employed can play an important role in the physical properties of the quantum dot product. More particularly, coordinating solvents or agents such as oxygen or nitrogen or sulfur or phosphorous containing organic compounds tend to yield quantum dots with larger particle size. In particular, the size and the size distribution of the quantum dots can be controlled by varying the coordination ability of the solvent or the co-solvent. As to the effect of temperature, higher reaction temperatures improve the crystallinity of the quantum dots and aid in the production of bigger quantum dots. Concentration also affects the particle size, with lower concentrations tending to produce smaller quantum dots (the larger amount of solvent effectively causes better heat dispersion from the reacting species).

This invention will be further described by the following examples. These examples are not to be construed as limiting the scope of this invention, which is defined by the appended claims.

EXAMPLE 1

A 500-ml three-neck round bottom flask equipped with a stirring bar, a reflux condenser, and a thermometer was purged with argon and charged with 200 ml of the selected solvent (e.g., glymes (n=1 to 5)) and the reducing agent (e.g., magnesium powder, 0.05 to 0.20 mol). Freshly distilled $YX_4$ (0.05 to 0.20 mol) was added dropwise, and the resulting brown-reddish solution was heated to higher temperatures (e.g., between approximately 60 and 280° C.) for a period of time (e.g., between approximately 2 and 100 hrs, typically between approximately 2 and 48 hrs). The resulting mixture was cooled to about −20° C. and treated with an excess amount of the capping agent (e.g., 1.8 M solution of phenyllithium), which was added dropwise to keep the temperature below room temperature. After the reaction mixture was stirred at ambient temperature for a period of time (e.g., between approximately 2 and 48 hrs), it was quenched with dilute protic acid (pH ~2) and extracted with an organic solvent (e.g., toluene). The combined organic extracts were washed with water and dried over a drying agent (e.g., sodium sulfate). The solvents were removed under reduced pressure, and traces of the solvents were removed by precipitation with a nonsolvent (e.g., pentane). After centrifugation or filtration, the product was collected and dried in a vacuum oven. The product can be purified by column chromatography (e.g., silica, $CH_2Cl_2$/methanol, 95/5).

EXAMPLE 2

The preparation of Example 1 is repeated using sodium as the reducing agent.

EXAMPLE 3

The preparation of Example 1 is repeated using barium as the reducing agent.

EXAMPLE 4

The preparation of Example 2 is repeated using a mixture of 350%/65% (by volume) diglyme/xylenes as the reaction medium.

EXAMPLE 5

The preparation of Example 1 is repeated using diphenyl ether as the reaction medium.

EXAMPLE 6

The preparation of Example 1 is repeated using tetraglyme as the reaction medium.

EXAMPLE 7

The preparation of Example 1 is repeated using n-butyllithium as the capping agent.

EXAMPLE 8

The preparation of Example 1 is repeated using 3-butenylmagnesium bromide as the capping agent.

EXAMPLE 9

The preparation of Example 1 is repeated using allylmagnesium bromide as the capping agent.

EXAMPLE 10

The preparation of Example 1 is repeated using 4-methoxyphenyllithium as the capping agent.

EXAMPLE 11

The preparation of Example 1 is repeated using pentafluorophenyllithium as the capping agent.

EXAMPLE 12

The preparation of Example 1 is repeated using perfluorohexyllithium as the capping agent.

EXAMPLE 13

The preparation of Example 1 is repeated using sodium ethoxide as the capping agent.

EXAMPLE 14

The preparation of Example 1 is repeated using silicon tetrabromide as the source of silicon.

EXAMPLE 15

The preparation of Example 1 is repeated in a sealed pressure reactor at 260° C.

EXAMPLE 16

The preparation of Example 1 is repeated using a mixture of 70%/10%/10%/10% (by molar ratio) germanium tetrachloride/phenyltrichlorogermane/diphenyldichlorogermane/triphenylgermanium as germanium source and terminating agents, $R_bYX_c$.

Preferred Surface Ligands and Molecular Tethers

As described in the previous sections, the ligand layer can serve to passivate the surface of a quantum dot and eliminate surface defects. It also facilitates compatibility with matrix materials. This is further explained as follows. Fluoropolymers are a group of desirable materials for optical applications because of their unique properties. Fluoropolymers, in general, have low indices of refraction (e.g., in comparison with regular hydrocarbon polymers) and thus low intrinsic scattering loss. They also, in general, exhibit low absorption loss as they are typically comprised of little or no carbon-hydrogen bonds. They are hydrophobic and thus low in moisture absorption. They, in general, are chemically and thermally inert and thus compatible in demanding environments and extreme process conditions in device fabrication. Because of their inertness, fluoropolymers are nearly non-mixable with many materials, such as conventional quantum dots. Embodiments of the current invention provide a novel approach to circumvent the compatibility issue by introducing fluorinated surface ligands to the surface of quantum dots (e.g., as in Example 11 and 12 of the preceding section). The quantum dots, which are terminated with a ligand layer of fluorinated surface ligands, can now be incorporated into, for example, Cytop® brand polymer (a perfluorinated polymer from Asahi), facilitated, for example, by using a solvent vehicle, CT-SOLV 180 from Asahi.

The following are preferred surface ligands of the ligand layer, according to some embodiments of the invention. This list, which is not intended to be exhaustive, describes a number of surface ligands having desirable physical characteristics that can be used to form ligand layers for SiQDs or GeQDs. In the following, Y is Si or Ge, and Y—C, Y—O, Y—S, Y—Si, and Y—N denote covalent bonds between Si or Ge and a C atom, an O atom, a S atom, a Si atom, and a N atom, respectively. Other preferred surface ligands, not listed below, can contain a P or a Se atom that is covalently bonded to Si or Ge.

Y—C

A) Alkyls
  a. Simple aliphatic alkyl groups (e.g., methyl, ethyl, propyl, etc.)
  b. Branched and cyclic alkyl groups (e.g., iso-propyl, tert-butyl, cyclohexyl, etc.)
  c. Substituted alkyl groups (e.g., 4-cyanobutyl, 3-ethoxy-3-oxopropyl, etc.)
  d. Perfluorinated alkyl groups (e.g., linear, branched, or cyclic)

Figure 10A:
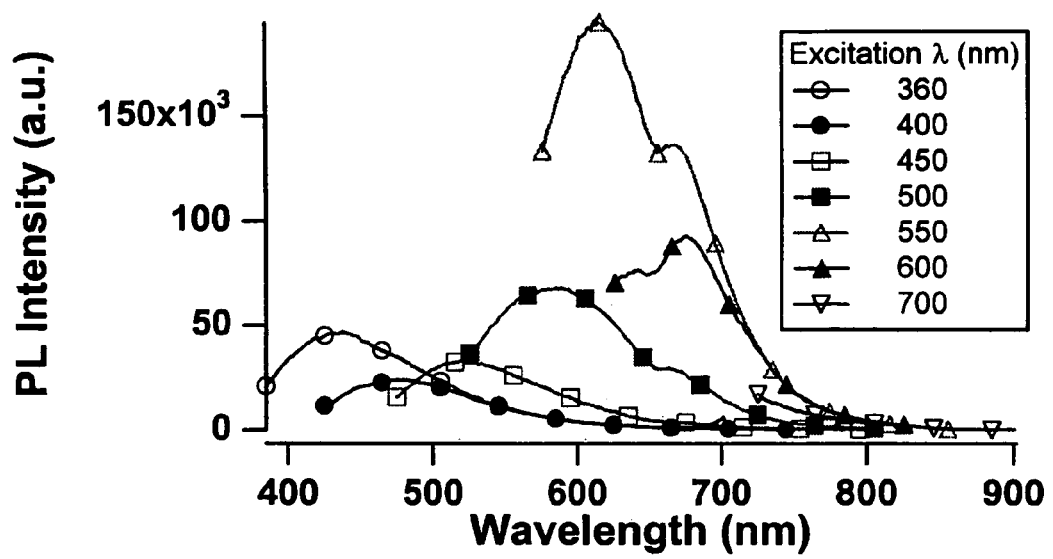
FIGS. 10(a) and 10(b) illustrate photoluminescence spectra of silicon quantum dots made in accordance with an embodiment of the invention.
Figure 10B:
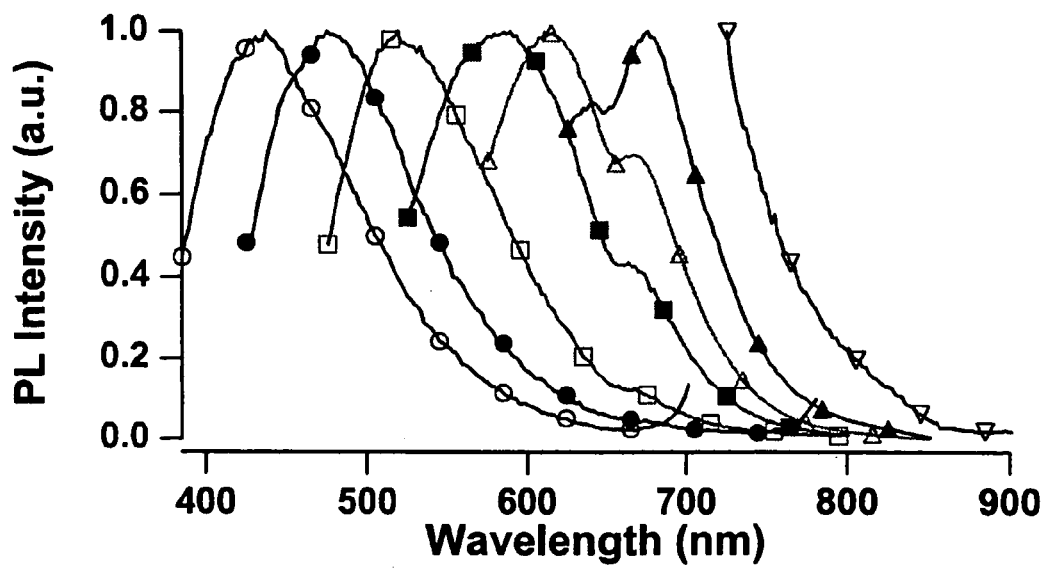
Figure 11A:
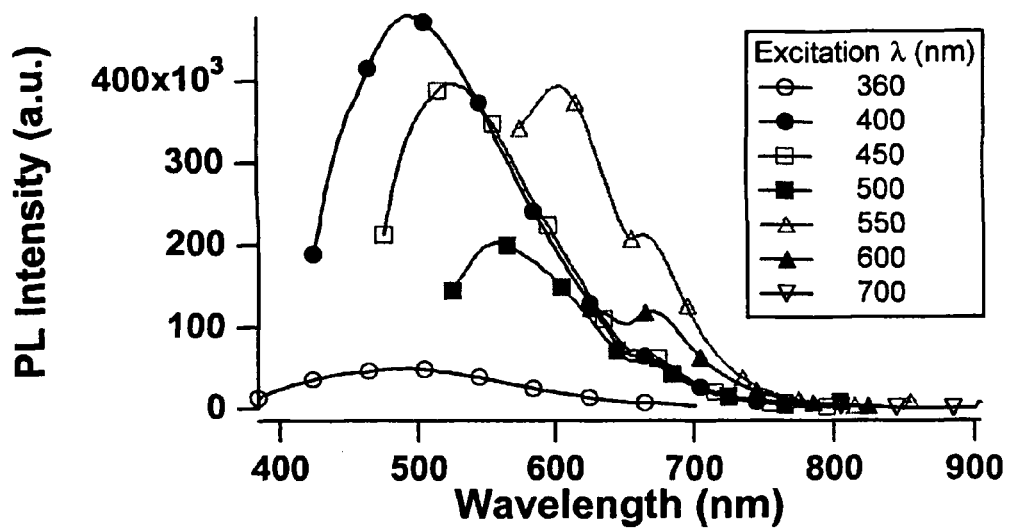
FIGS. 11(a) and 11(b) illustrate photoluminescence spectra of germanium quantum dots made in accordance with an embodiment of the invention.
Figure 11B:
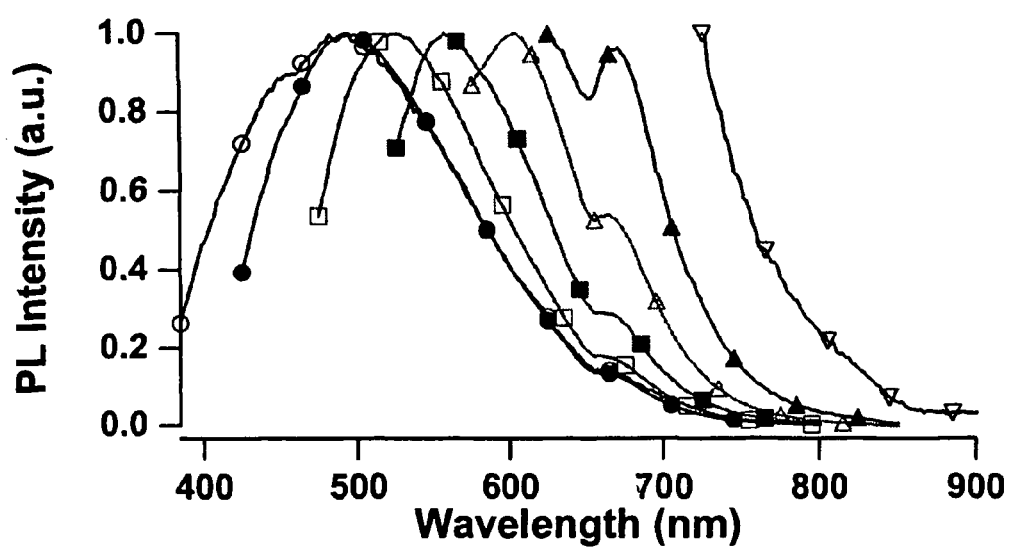

B) Alkenyls
  a. Simple isolated double bonds (e.g., 1-hexenyl, 1-dodecenyl, etc.)
  b. Substituted alkenes (e.g., 6-heptenenitrile, etc.)
  c. Conjugated polyenes (e.g., pentadienyl etc.)

d. Polymerizable alkenes (e.g., allyl, 3-butenyl, 2-butenyl etc.)
C) Alkynyls
  a. Simple isolated alkynes (e.g., hexynyl, octynyl, etc.)
  b. Substituted alkynes (e.g., phenylethynyl, etc.)
  c. Polymerizable alkynyls
  d. Perfluoro alkynyls
D) Aromatics and Aromatic Heterocycles
  a. Phenyls, Pyridyls, Thienyl, etc.
  b. Substituted Aromatics and Aromatic Heterocycles
    i. With electron withdrawing groups (nitro, nitrile, fluoro, perfluoro, carboxylate, e.g., 4-cyanophenyl, etc.)
    ii. With electron donating groups (amino, alkoxy, e.g., 4-methoxyphenyl, etc.)
E) Conjugated Aromatics, Aromatic Heterocycles, and Polyenes (poly is referred to well defined oligomers)
  a. Polyenes
  b. Poly(p-phenylene)
  c. Poly (diacetylene)
  d. Poly(triacetylene)
  e. Poly(p-phenylene vinylene)
  f. Poly(p-phenylene ethynylene)
  g. Polythiophene
  h. Polypyrrol
  i. Polyaniline
  j. Poly(phenylene sulfide)
F) Cyanide
Y—O
A) Hydroxy, Alkoxy, etc.
  a. Diol, triol, polyol, etc.
  b. Cholesteryl group
  c. Trisubstituted siloxy
B) Carboxylate
C) Phenoxy
D) Siloxy
E) Cyanate
F) Inorganic Oxides
Y—S
A) Thioalkyl
B) Thioaryl
C) Thiocyanate
D) Silylthio
Y—Si
A) Substituted silyl group
B) Tri-substituted silyl group with one or more functional groups
Y—N
A) Amino group (e.g., linear, branched, aromatic, or cyclic)
B) Mono and di-substituted amines
C) C) Imino group (e.g., linear, branched, aromatic, or cyclic)
D) D) Silylamino FIGS. 10(a) and 10(b) show PL spectra of organic-terminated Si quantum dots, and FIGS. 11(a) and 11(b) show PL spectra of organic-terminated Ge quantum dots. The Si and Ge quantum dots were made with the methods described herein. The PL spectra show that the light emission can be readily tuned from the red to the ultraviolet by exciting quantum dots of different sizes. The PL spectra are obtained by optically exciting the quantum dots with wavelengths shorter than the wavelength at the absorption edge of the quantum dots. This light emission is stable in ambient conditions. This stability is due in large part to the relative completeness and stability of the surface termination, e.g., the surface termination and the interface between the core and the surface termination is substantially defect free. In FIGS. 10(a) and 10(b), the surfaces of the Si quantum dots are terminated with 4-methoxyphenyl groups. In FIG. 10(b), the vertical axis represents a normalized photoluminescence signal from FIG. 10(a). In FIGS. 11(a) and 11(b), the surfaces of the Ge quantum dots are terminated with butyl groups. In FIG. 11(b), the vertical axis represents a normalized photoluminescence signal from FIG. 11(a). Similar results can be seen for Si quantum dots having surfaces terminated with ethoxy groups and Ge quantum dots having surfaces terminated with methyl groups.

The electronic and optical properties of these organic-terminated SiQDs and GeQDs that are made in this fashion are unique in that they show size dependent properties that are uniquely consistent with quantum confinement. The optical and electronic properties of these SiQDs and GeQDs are uniquely consistent with theoretical calculations more sophisticated than Effective Mass approaches, such as the Empirical Pseudopotential Method and the Tight Binding Method. A comparison of the size dependent energy gap calculated by these methods with measurements taken on the SiQDs and GeQDs synthesized by the method disclosed herein show that the agreement is extremely good and is the best observed for any quantum dot formed of Si or Ge.

According to some embodiments of the invention, nanocomposite materials comprising quantum dots that are surface-terminated with various organic groups and dispersed in processible matrix materials such as organic polymers or sol-gels can exhibit new quantum phenomena. This new quantum phenomena in turn allow a large variety of new applications (such as all-optical switching) and the fabrication of device structures using low cost processing techniques (e.g., spin coating or dipping). Described herein are several novel synthetic schemes to fabricate these quantum dots and to functionalize their surfaces with molecular species that are chemically bonded to the surface for stability and robustness. Use of such functionalized quantum dots avoid the need for expensive and specialized fabrication equipment and facilities. The synthesis of these nanostructures can be readily implemented in many laboratories.

As discussed above, the value of this quantum dot nanostructure can derive from molecular tethers serving multiple functions. The molecular tethers may be active in a variety of ways, e.g., electrically, chemically, mechanically, or optically active. This enables precise control of the electrical, optical, transport, chemical, and physical interactions between quantum dots and the surrounding matrix material or the properties of individual quantum dots. These molecular tethers can be a key innovation needed to develop new devices and applications. Examples of particularly preferred embodiments of optically active molecular tethers are molecules with polarized or polarizable sections or with large polarizabilities, donor-acceptor molecules, hetero-molecules, and charge transfer molecules.

Another major innovation comes from collective phenomena resulting from nanocomposite materials that include coupled quantum systems such as coupled quantum dots. The ability to attach active molecular tethers to the quantum dot surface allows coupling quantum dots together in various one, two, and three-dimensional configurations or arrays to initiate multiple quantum interference interactions between quantum dots that may be applied towards novel devices. The length and properties of these molecular tethers can be tailored to enhance or generate specific quantum phenomena such as enhanced nonlinear optical properties. For instance, molecular tethers can provide charge transport between two or more interconnected quantum dots. For certain embodiments of the present invention, the quantum dots can be massively interconnected to an extent that is unlike previous efforts. The massively interconnected quantum dot system can be comprised of more than 2 interconnected quantum dots, preferably more than 10 interconnected quantum dots, preferably more than 1000 interconnected quantum dots, and most preferably more than $10^9$ interconnected quantum dots. For certain embodiments of the invention, the massively interconnected quantum dot system can be comprised of two or more massively interconnected quantum dot subsystems, which subsystems may or may not be connected. The quantum dots can be interconnected via the formation of chemical bonds between appropriate molecular tethers on different quantum dot surfaces. This, in turn, can be performed using the functionalization of the quantum dot surfaces as described earlier herein. After the quantum dot surface is functionalized, the interconnection can proceed via chemical reaction between surface functional groups, e.g., conjugated species, aromatics, etc. As a result of such interconnection, a large variety of nanostructures is possible:

(1) n quantum dots coupled in a linear structure or array.
(2) n quantum dots coupled in an arbitrary 2-dimensional structure or array.
(3) n quantum dots coupled in an arbitrary 3-dimensional structure or array (e.g., to produce new lattice structure and new materials with tailorable properties.).
(4) n quantum dots attached to a polymer backbone to give controllable densities of quantum dots. These quantum dots can be coupled with other species (e.g., electron donating or accepting molecules) onto the polymer backbone to generate other new phenomena and applications.

These nanostructures can have the properties of single quantum dots or an ensemble of quantum dots, which will be determined by the nature of the molecular tethers. This approach can be important for exploiting collective excitations in quantum dot systems towards innovative devices. These new nanostructures represent an important innovation in nanotechnology. Examples of particularly preferred embodiments of molecular tethers that can be used to interconnect quantum dots in this fashion and to generate controllable collective phenomena include conjugated species such as conjugated polymers (e.g., alkenes, alkynes, and aromatics).

The uniqueness of the synthetic process described above is manifested in, but is not restricted to, the following properties of the resultant quantum dots and nanocomposite materials formed of such quantum dots: (1) extremely large optical nonlinearities are manifested, e.g., in large values of $Re[\chi^{(3)}_{ijkl}]$, with values as high as $10^{-5}$ cm$^2$/W to $10^{-4}$ cm$^2$/W. Previous materials with optical nonlinearities in the infrared and more specifically in the important telecommunications region of 1500 nm to 1600 nm typically have values of nonresonant degenerate γ of ~$10^{-2}$ cm$^2$/W to $10^{-11}$ cm$^2$/W or less. As a result, the optical nonlinearity, e.g. $Re[\chi^{(3)}_{ijkl}]$, of the quantum dots of this invention is ~$10^6$ to $10^8$ times larger than such previous materials; (2) stability of the quantum dots in a variety of environmental conditions including ambient; (3) stability of the infrared to ultraviolet emission in a variety of environmental conditions including ambient; (4) control over the size of the quantum dots such that the light emission can be size-tuned from the infrared to the ultraviolet; (5) control over the size of the quantum dots such that the nonlinear optical properties give large figures-of-merits that surpass those required for effective all-optical switching; (6) the nonlinear optical properties are such that all-optical switching occurs in a very short time (depending on the nature of the nonlinear optical mechanism (e.g., resonant or non-resonant, the switching time can range from picoseconds to less than 60 femtoseconds); (7) low switching energy ($<<1\times10^{-12}$ Joules); (8) non-degenerate (e.g., control and data beams with different wavelengths) all-optical switching where the wavelengths of the relevant beams can be detuned from each other over a very broad spectral range ($>>100$ nm) and still maintain effective all-optical switching; (9) all-optical switching can occur throughout a broad wavelength range (e.g., from 400 nm to 1600 nm).

Preferred Matrix Materials

According to some embodiments of the current invention, the matrix material that is used to host quantum dots can be selected from a broad range of materials due in large part to the versatile surface termination of the quantum dots as discussed above. These matrix materials can include, for example, organic and inorganic polymers or glasses with different properties including mechanical strength, optical transparency, lightwave transmissivity, thermal stability, dimensional stability, low temperature flexibility, moisture absorption, and chemical inertness.

The matrix materials in some embodiments of the current invention are preferred to be highly transparent and low absorption in the wavelength range from 600 nm to 2 μm. Also, they are preferred to be highly compatible with quantum dots so that a desired amount of quantum dots can be readily incorporated into the resulting nanocomposite material without degrading optical and mechanical properties. Polymers with special functional groups may be selected to facilitate solubility interactions and enhance compatibility with quantum dots. This is further explained as follows. Polymers with Lewis acid (base) functional groups, for example, can be selected to host quantum dots which are surface-functionalized with Lewis base (acid) surface ligands. Another example is to take advantage of hydrogen-bonding interactions. Polymers of hydrogen-bonding donors (acceptors) are the preferred matrix materials for quantum dots which are surface functionalized with hydrogen-bonding acceptors (donors). Additionally, polymers with strong dipolar groups are the preferred matrix materials for quantum dots which are engineered with strong dipolar surface ligands. The strong intermolecular interactions described above greatly enhance compatibility between the quantum dots and the matrix materials. Therefore, high contents of quantum dots can be readily incorporated into the matrix materials while maintaining desired uniformity and homogeneity (e.g., allowing the quantum dots to be substantially uniformly dispersed throughout the matrix materials). Additionally, block copolymers can be used to further enhance compatibility by skillful selection of monomer units and block length. As a result, a nanocomposite material comprising quantum dots and a matrix material can be engineered to be of high optical quality and low scattering loss. More importantly, the linear and nonlinear index of refraction can be tuned for a variety of applications primarily by adjusting the content of the quantum dots and by selecting the matrix material, according to some embodiments of the invention.

In addition to the optical properties and compatibility with the quantum dots, the preferred matrix material desirably should meet other requirements for a specific application. Thus, other properties can be considered in the selection of matrix materials.

One preferred matrix material is selected from a group of polymers with high glass transition temperature, $T_g$, such as polyimides, fluoropolymers (e.g., Teflon AF® brand fluoropolymers available from DuPont), polymers derived from B-staged bisbenzocyclobutene monomers (e.g., Cyclotene® brand resins and Cyclotene® brand fluorinated resins available from The Dow Chemical Company), phenolic resin, and fluorinated poly(aryl ether sulfide), for applications where thermal stability is important.

Another preferred matrix material is selected from a group of polymers with low $T_g$ such as poly(isobutylene), poly(diphenoxyphosphazene), and fluorinated acrylate (ZPU series from Zen Photonics Co., LTD) for applications where low temperature flexibility and low birefringence are desired.

Another preferred matrix material can be selected from photosensitive polymers, such as fluoropolymers (e.g., Cytop® brand fluoropolymers available from Asahi), poly (methyl methacrylate), and photoresists to facilitate lithographical fabrication of devices.

Another preferred matrix material is selected from a group of cross-linkable polymers for applications where isotropic homogeneity or dimensional stability is required.

Another preferred matrix material is a blend of two or more polymers which are engineered to tailor the optical and mechanical properties and thermal and chemical stability.

Another preferred matrix material is a copolymer including random and block copolymer.

Another preferred matrix material is a homopolymer including, but not limited to, the following:
a. Poly(vinyl alcohol)
b. Poly(vinyl butyral)—other
c. Poly(vinylcarbazol)
d. Poly(vinyl fluoride)
e. Poly methyl vinyl ether
f. Polyethylene
g. Polypropylene
h. Polystyrene
i. Poly(vinyl pyridine)
j. Polyimides
k. Poly(ethylene oxide)
l. Photoresist (positive or negative)
m. Cyclotene®
n. Fluorinated Cyclotene®
o. Cytop®
p. PMMA
q. Fluorinated acrylates
r. Poly(siloxanes)
s. Poly(silanes)
t. Poly(diphenoxyphosphazenes)
U. Poly(vinyl ferrocene)
V. Polycarbonate
w. Polystyrene
x. Poly(cyclic olefen) such as Zenor® and Zenex®
y. Teflon® AF®

Another preferred matrix material is a glass including, but not limited to, the following:
a. Sol-gel derived glasses
b. Organically modified glasses
c. Spin-on glasses
d. Flow-glass
e. Dielectrics such as Low K FlowFill™ brand dielectrics of Trikon Industries
f. Dielectrics such as Black Diamond™ brand dielectrics of Applied Materials, Inc.

Preferred Methods of Use

The engineered nonlinear nanocomposite materials of some embodiments of the present invention can be incorporated into an optical device by a variety of methods, including a variety of standard methods known in the art. The flexibility to process the nanocomposite material of embodiments of the current invention, desirably independent of the nonlinear optical properties, is a key benefit of embodiments of the current invention. By selecting an appropriate matrix material and solvent, engineered nonlinear nanocomposites can be deposited using spin-coating, spin casting, dip coating, spraying, blade application, screen printing, and other methods commonly used in the process of standard semiconductor micro-fabrication.

While processes like spin-coating have been used in other contexts, the combination of tuning the optical and mechanical properties of an engineered nonlinear nanocomposite material followed by spin-coating, or the like, is unlike previous capabilities. Traditional nonlinear materials known in the art have chemical and mechanical properties that are directly linked to their optical properties. The processing techniques that can be used to incorporate these materials are therefore often limited to those that are compatible with the materials themselves. For instance, $LiNbO_3$ is a crystal and can therefore not be incorporated by spin coating.

The steps of incorporating a nonlinear nanocomposite material into a device by selecting desired optical properties, substantially independently selecting desired chemical and/or mechanical properties to facilitate incorporation by a particular technique (e.g., spin-coating), and then incorporating the nanocomposite material using that technique represents a substantial improvement over previous incorporation methods. While spin-coating has been discussed herein as a specific example of a standard method of materials incorporation, this is done strictly for exemplary purposes and should not be considered to limit the scope of the invention.

For example, desired optical properties such as linear index of refraction and γ can be established by selecting or tuning at least one of a chemical composition of quantum dot cores, a chemical composition of quantum dot shells, a peak size of quantum dots, a thickness of the shells, a chemical composition of ligand layers, a chemical composition of a matrix material, a concentration of the quantum dots in the matrix material, and a degree of interconnection of the quantum dots (e.g., using molecular tethers). Other desired optical properties such as single-photon and multi-photon absorption characteristics can be established by selecting or tuning at least one of a chemical composition of quantum dot cores, a chemical composition of quantum dot shells, a peak size of quantum dots, and a thickness of the shells. Desired chemical and mechanical properties can be established by selecting or tuning at least one of a chemical composition of ligand layers and a chemical composition of a matrix material. As discussed previously, at least two of these desired properties can be substantially independently established, according to some embodiments of the invention.

In addition to standard incorporation techniques, other methods of deposition such as layer-by-layer growth using polymers with alternating and complementary functionalities, as pioneered by Gero Decher and described in T. Sasaki et al., "Layer-by-Layer Assembly of Titania Nanosheet/Polycation Composite Films," *Chem. Mater.* 13, 4661 (2001), the disclosure of which is incorporated herein by reference in its entirety, can be used to create films and coatings of laminated layer structures in the required thickness with desired density of quantum dots.

All of the same processing techniques are also possible for quantum dot solids, including the ability to perform layer-by-layer growth. Here again, the process of selecting the chemical properties of the surface ligands and solvent to facilitate incorporation by a particular technique, desirably independent of the optical properties, represents a significant improvement over previous incorporation methods.

The following provides some additional preferred methods of incorporating an engineered nonlinear nanocomposite material into a variety of devices:

i) The engineered nonlinear nanocomposite material can be dispersed in a polymer and subsequently dissolved in an appropriate solvent to create a fluid of sufficient viscosity to generate the desired thickness of a film. The film thickness can be easily tailored by varying the solvent content and therefore the viscosity. The specific quantum dot surface chemistry is selected for compatibility with the selected polymer and solvent to be used. Some preferred materials include: Dow Chemical's Cyclotene®, which is B-staged divinylsiloxane-bis-benzocyclobutene with Mesitylene and minor portions of other organic compounds; poly (methyl methacrylate) (PMMA); photoresists (both positive and negative) used in semiconductor manufacturing; and so forth.

ii) The engineered nonlinear nanocomposite material is dispersed in a suitable carrier fluid or solvent and applied evenly over the desired surface. Heat, vacuum, IR radiation, and/or an inert carrier gas are then used to remove the carrier fluid, giving rise to a film of the engineered nonlinear nanocomposite material on the device.

iii) The engineered nonlinear nanocomposite material is dispersed in a carrier gas, which is either reactive or inert. Appropriate carrier gasses include, but are not limited to, $SiH_4$, $N_2$, $H_2$, $O_2$, and $N_2O$. The gases are allowed to react under appropriate conditions of heat and/or plasma to cause a CVD film to be deposited on a substrate of choice. In this embodiment, a preferred substrate is a silicon wafer, optionally comprising lithographic structures or patterns on the surface.

iv) The engineered nonlinear nanocomposite material is incorporated into a sputter target, optionally using procedure (i) above. Alternatively, a pure target of a desired matrix material could be used (e.g., organic or inorganic targets, preferably $SiO_2$), and the engineered nonlinear nanocomposite material is introduced in a gas in a sputter chamber. The engineered nonlinear nanocomposite material is then incorporated directly into a growing sputtered film.

v) The engineered nonlinear nanocomposite material is heated and caused to vaporize.

The material vapors are then transported to a desired surface and condensed by keeping the surface at a suitable temperature. The result is a solid film deposited on a device.

vi) The same concepts can be used in systems that deposit Low K material such as Low K FlowFill™ brand dielectrics from Trikon Industries or Black Diamond™ brand dielectrics from Applied Materials, Inc., thus incorporating quantum dots into low k films for even better control of the index of refraction and processability.

Preferred Nanocomposite Materials

Embodiments of the current invention comprises a nanocomposite material with a controllable set of optical, mechanical, chemical, and electronic properties. The nanocomposite material can comprise quantum dots dispersed in an organic and/or inorganic matrix material. The matrix material may be either doped or undoped with molecular species, with a density of quantum dots therein such that the index of refraction (e.g., the linear index of refraction or the overall index of refraction) of the nanocomposite material falls between approximately 1.3 and 5.0. Some embodiments of the nanocomposite material comprise at least or more than 10% by weight of the quantum dots (e.g., at least 20% by weight of the quantum dots, at least 30% by weight of the quantum dots, at least 40% by weight of the quantum dots, or at least 50% by weight of the quantum dots, such as between approximately 50% and 60% by weight of the quantum dots). More particularly, some embodiments of the nanoconmposite material can comprise the above discussed weight percentages of the quantum dots with little or no agglomeration or aggregation of the quantum dots and with the quantum dots substantially uniformly dispersed throughout the matrix material. Also disclosed are nanocomposite materials (e.g., quantum dot solids) such that the density of quantum dots within the nanocomposite material is between approximately 0.005% and 75% by volurne. Optionally, the index of refraction of the nanocomposite material can be additionally tuned by selecting a matrix material with a specific index of refraction and/or further doping the matrix material to modify that index. This provides additional control over the optical characteristics. Optionally, the matrix material can be a polymerizable material with a desired index of refraction. The index of the refraction can be further fine-tuned by cross-linking via various activation mechanisms including thermal, photo illumination, plasma, and high energy radiations. The matrix material in which the quantum dots are dispersed may optionally have an intrinsically high $\chi^{(3)}$. The matrix material may optionally be an intrinsic matrix of a quantum dot solid.

The nanocomposite materials according to some embodiments are preferably optically pure, with a homogeneous distribution of quantum dots dispersed therewithin. These quantum dots may be substantially uniformly dispersed as individual dots or as aggregates of controlled sizes (e.g., smaller aggregates up to massively interconnected quantum dot subsystems). The engineered nanocomposite materials are preferably optically homogeneous and uniform, so that little or no scattering and/or mode disruption result from light passing through or past the material, as the specific application demands. For certain applications, close-packed micron- or sub-micron-sized clusters of quantum dots dispersed in a polymer or other matrix material with a filling fraction optimized to enhance local field effects may be preferable.

In addition, nanocomposite materials of some embodiments preferably have an optical nonlinearity, such as $Re[\chi^{(3)}_{ijkl}]$ contributing to $\gamma$ (e.g., under degenerate conditions, such as nonresonant degenerate conditions), in a wavelength range-of-interest of between approximately $10^{-12}$ and $10^{-5}$ $cm^2/W$, more preferably between $10^{-10}$ and $10^{-5}$ $cm^2/W$ and most preferably between $10^{-8}$ and $10^{-5}$ $cm^2/W$. In particular, certain embodiments of the nanocomposite material have $\gamma$ being at least $10^{-9}$ $cm^2/W$ (e.g., at least $10^{-8}$ $cm^2/W$ or at least $10^{-7}$ $cm^2/W$) when irradiated with light having a wavelength between approximately $3\times10^{-5}$ cm and $2\times10^{-4}$ cm. More particularly, certain embodiments of the nanocomposite material have $\gamma$ being at least $10^{-9}$ $cm^2/W$ (e.g., at least $10^{-8}$ $cm^2/W$ or at least $10^{-7}$ $cm^2/W$) when irradiated with light having a wavelength between approximately $1.25\times10^{-4}$ cm and $1.35\times10^{-4}$ cm or between approximately $1.5\times10^{-4}$ cm and $1.6\times10^{-4}$. For $\gamma$ under non-degenerate conditions, both relevant wavelengths (e.g., wavelengths corresponding to trigger and data signals) can lie within the wavelength ranges stated above. Optical characteristics of the disclosed nanocomposite materials can be evaluated in a variety of configurations and are not restricted by the specific examples described herein. One of skill in the art will appreciate that the linear and nonlinear optical properties of a material can be evaluated using methods such as Z-scan, FWM, cross-phase modulation, nonlinear phase shift in an interferometer, nonlinear etalons, and so forth.

The mechanical properties of nanocomposite materials are preferably selected to be compatible with incorporation into devices selected from the list of: planar waveguides, nonplanar waveguides, optical fibers, waveguide cores, waveguide claddings, free-space optics, and hybrid optical devices. Such nanocomposite materials can be used in a variety of optical devices for switching, modulating, and manipulating light in ways such as for an optical switch, an optical cross-connect, a wavelength converter, and the like, as well as combinations thereof.

The nanocomposite materials described herein can have a number of key attributes lacking in other materials. For instance, the nanocomposite materials can have an extremely large optical nonlinearity. This optical nonlinearity can be represented by the real part of various tensor elements of $\chi^{(3)}$, which include $\chi^{(3)}_{1111}$, $\chi^{(3)}_{1212}$, $\chi^{(3)}_{1221}$, $\chi^{(3)}_{1122}$, and various permutations of the energies of the optical fields involved, e.g., $\chi^{(3)}_{ijkl}(-\omega_4; \omega_1, \omega_2, \omega_3)$. According to some embodiments of the invention, the value of the real part of these tensor elements falls in the range of $10^{-9}$ cm$^2$/W to $10^{-4}$ cm$^2$/W. As a result, the nanocomposite materials allows all-optical devices to be made that can be effectively switched or controlled with very low intensity light such as light from continuous wave laser diodes and also LEDs in some cases. This capability is highly sought after but has not been previously achieved in a satisfactory manner.

Also, the nanocomposite materials described herein can exceed various FOM criteria for effective all-optical switching. In particular, certain embodiments of the nanocomposite material has a FOM that is at least 1 (e.g., at least 1.5 or 1.8), where this particular figure-of-merit can be defined as $2\gamma/\beta\lambda$, where $\beta$ is a two-photon absorption coefficient of the nanocomposite material expressed in cm/W, and $\lambda$ is a wavelength between approximately $3\times10^{-5}$ cm and $2\times10^{-4}$ cm, preferably between approximately $1.25\times10^{-4}$ cm and $1.35\times10^{-4}$ cm or between approximately $1.5\times10^{-4}$ cm and $1.6\times10^{-4}$. It should be recognized that other definitions for the FOM may be used instead. This is particularly differentiating since, though other materials may possibly have large nonlinear refractive indices, the linear or nonlinear losses such as that originating from two photon absorption are often sufficiently large so that the FOM is inadequate, the thermal properties are sufficiently poor such that the FOM is inferior, and the temporal response is considerably slower than with the nanocomposite materials described herein. Another important consequence is that significantly shorter lengths of the nanocomposite materials described herein are required for effective all-optical switching devices. Thus, significantly smaller and faster devices can be made. As an example, rather than requiring centimeters or more of a conventional material to effectively switch light, devices can be made with the nanocomposite materials with lengths of approximately ten microns to a few millimeters.

In addition, the nanocomposite materials described herein are relatively simple and inexpensive to make, are more easily processed, are compatible with a large number of other material systems, and can be incorporated more readily into various device structure and in nearly any device size. Epitaxial growth of the nanocomposite materials described herein is typically not required, which can be an advantage since epitaxial growth is typically an expensive process that is often not amenable to simple processing or large area devices and is often incompatible with many other material systems (since it requires epitaxial growth on material systems that are lattice-matched to itself). The nanocomposite materials can be deposited on various substrates, substantially independently of their size, surface area, and surface nature, in the form of films or coatings of varying thicknesses and can be formed into structures of various shapes and sizes. Importantly, these films, coatings, and structures made from the nanocomposite materials can be manufactured with a number of simple and inexpensive fabrication techniques such as spin coating, spray coating, doctor blading, and dip coating at ambient temperature and pressure, or using conventional molding processes for engineering plastics and elastomers.

And, the nanocomposite materials described herein can have optical, chemical, thermal, and mechanical properties engineered to suit device or application requirements. For certain embodiments, these various desirable attributes result in large part from the inherent flexibility in engineering the surface properties of quantum dots, substantially independently of their optical and electronic properties. In addition, these attributes can also result from use of organic or inorganic polymers with tailored optical, thermal, chemical, and mechanical properties suitable for different devices and applications.

Alternative Applications for Engineered Nanocomposite Materials

While the application of engineered nanocomposite materials as a nonlinear material is described herein, it should be recognized that such materials will also find applications in a variety of areas such as, though not limited to, engineered resonant nonlinear nanocomposite materials, engineered linear nanocomposite materials, engineered absorptive nanocomposite materials, engineered electro-optic nanocomposite materials, engineered thermo-optic nanocomposite materials, engineered thermal nanocomposite materials, engineered gain nanocomposite materials, engineered magneto-optic nanocomposite materials, engineered magnetic nanocomposite materials, engineered electronic nanocomposite materials, engineered biological nanocomposite materials, engineered optoelectronic nanocomposite materials, and engineered mechanical nanocomposite materials. It should be recognized that the tunable physical, chemical, electronic, and optical properties of the materials described herein, as well as the methods of incorporation thereof, can be used to create materials with specific characteristics tailored to many other applications.

Preferred Structures, Devices and Systems:
Preferred Structures

A variety of articles of manufacture comprising nanocomposite materials of some embodiments of the invention can be formed for use in a variety of application areas. These areas include but are not limited to optical switching, telecommunications, and computing.

One embodiment of the current invention comprises a film of an engineered nonlinear nanocomposite material. In a preferred embodiment, the film has a thickness between approximately 10 nm and 1000 nm. There are no restrictions on the width and length of the film, although these are preferably less than the size of a 16-inch wafer. This embodiment can be useful as a tunable thin film filter. In another preferred embodiment, the film is a thick film, with thickness ranging between approximately 0.1 µm and 100 µm, more preferably between approximately 1 µm and 20 µm, and most preferably between approximately 3 µm and 10 µm.

Another embodiment of the current invention comprises a substrate and an engineered nonlinear nanocomposite material, where the two are in physical and/or evanescent optical contact. By evanescent optical contact, it is meant that the two are typically separated by at most 10,000 nm, preferably by at most 1500 nm, more preferably by at most 500 nm. Substrates may include, but are not limited to, insulators, semiconductors, metals, glasses, polymers, plastics, a silicon wafer, a silica wafer, a glass wafer, an InP wafer, a GaAs wafer, or any piece or fragment thereof. Substrates may optionally comprise multiple layers of different materials.

Another embodiment of the current invention comprises a waveguide core and an engineered nonlinear nanocomposite material, wherein the two are in physical and/or evanescent optical contact. The waveguide core can include, but is not limited, to an optical fiber core, a planar waveguide core, a silica waveguide core, a silicon waveguide core, a polymer waveguide core, a liquid light guide, and the like. In a preferred embodiment, the waveguide core comprises a bend, as bends are useful for routing light to appropriate places. Optionally, the bend is configured such that the present device acts as an optical limiter, wherein the output intensity of the limiter is defined, in part, by the density of quantum dots within the engineered nonlinear nanocomposite material.

Another embodiment of the current invention comprises a free-space optic and an engineered nonlinear nanocomposite material, wherein the two are maintained in a fixed spatial relation to each other. One example of the utility of this embodiment is in the delivery of a control beam into a waveguide based device utilizing optical nonlinearity. Another example is if the device utilizing optical nonlinearity is a free-space optic, such as a tunable thin film filter. Another embodiment relates to a solid (multi-)cavity etalon in which a nonlinear nanocomposite material comprises the solid etalon cavity.

Another embodiment of the current invention comprises a waveguide core fabricated from an engineered nonlinear nanocomposite material. Optionally, an engineered nonlinear nanocomposite material is placed in a strip over the region where the waveguide core is to be located. The waveguide core is then defined within a cladding using patterned UV light to write waveguides directly into the nonlinear nanocomposite material to increase the index of refraction (e.g., via polymerization/depolymerization of a host polymer), i.e., the waveguides can be patterned directly into the nonlinear nanocomposite material, with the unexposed regions acting as the cladding. For a nonlinear directional coupler, one possible method to avoid problems is to spin the nonlinear nanocomposite material down and etch away the material except where desired and to subsequently grow silica core waveguides around the nonlinear nanocomposite material. In addition, the nonlinear nanocomposite material can be incorporated between two waveguides by growing one waveguide layer for one arm of a directional coupler, spinning the appropriate thickness of the nonlinear nanocomposite material on top, and then growing another waveguide layer that forms the other arm of the directional coupler. Such directional coupler is referred to as a vertical directional coupler and can be made using the method disclosed in B. Liu et al., "Fused InP-GaAs Vertical Coupler Filters," *IEEE Photonics Technology Letters* 11, 93 (1999), the disclosure of which is incorporated herein by reference in its entirety.

A further embodiment of the present invention comprises a polymer waveguide structure and an engineered nonlinear nanocomposite material. Since the engineered nonlinear nanocomposite material optionally comprises a polymer matrix material, there would be less material mismatch issues when using polymer waveguides with the nonlinear nanocomposite material. Using polymer-based waveguides, one can write all the waveguides directly (e.g., by using ultraviolet light). However, the switching beam illumination areas typically should be limited to the appropriate spots. Alternatively, etching and redeposition of polymers can be performed with or without quantum dots as appropriate.

Devices Comprising an Engineered Nonlinear Nanocomposite Material

Embodiments of the invention relate to devices that can have extremely large nonlinearity and fast response time and that can be substantially smaller, faster, and more efficient than previous devices. The results are devices with surprising advantages in terms of speed, size, and efficiency.

Figure 12:
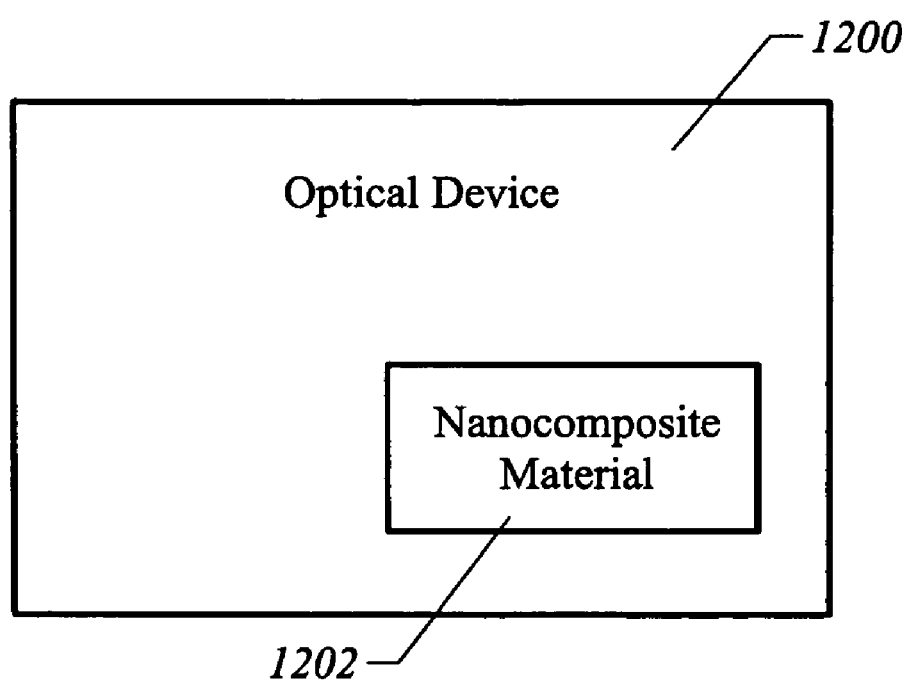
FIG. 12 illustrates an optical device comprising an engineered nonlinear nanocomposite material, according to an embodiment of the invention.

FIG. 12 illustrates an optical device 1200 comprising an engineered nonlinear nanocomposite material 1202, according to an embodiment of the invention. The optical device 1200 can be configured, for example, as nonlinear directional coupler, a Mach-Zehnder interferometer, an optical transistor, a wavelength converter, an optical regenerator, an optical limiter, a saturable absorber, an absorptive modulator, an optical spatial light modulator, a tunable waveguide Bragg grating or filter, a reconfigurable integrated optical system, a reconfigurable photonic bandgap integrated optical system, a multimode interference device, a micro-ring array switch, a digital optical switch, and so forth.

In the following sections, some devices are discussed in the context of a silica-in-silica waveguide system. This is done by way of example, and in no way is this intended to limit the scope of the invention to this particular waveguide system. The flexibility and control provided by the nonlinear nanocomposite described herein is appropriate for a variety of other waveguide systems (such as silicon in silica, silicon in air, InP, InGaAs, etc.), which may be more appropriate in certain applications and can be used for certain embodiments of the current invention. The particular choice of silica-in-silica is merely one preferred embodiment.

Nonlinear Directional Coupler

Figure 13:
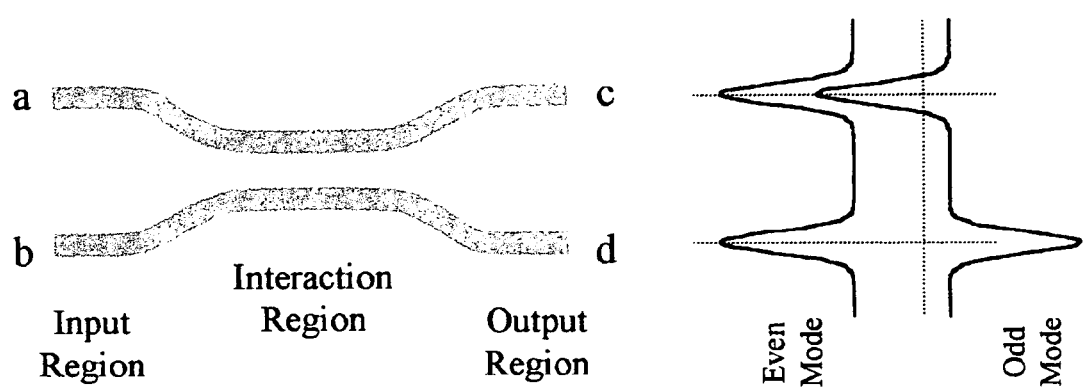
FIG. 13 illustrates a passive directional coupler known in the art.

The operation of a nonlinear directional coupler is best understood by examining the propagation of joint optical-modes of a combined two-waveguide structure, an example of which is illustrated in FIG. 13. In FIG. 13, the solid lines represent optical waveguides, with the interaction or coupling region representing a section of the device where the two waveguides are close enough together such that the optical field from one waveguide interacts with the other waveguide. The plots to the right represent field amplitude for odd and even modes in the interaction region of the directional coupler. Due to the difference in propagation of the odd and even modes, by choosing the appropriate length of the interaction region, an input in arm a can exit in either arm c or arm d or in both arm c and arm d.

An input to the directional coupler (arm a and/or arm b) can be represented using the joint waveguide modes as a basis. A beam input at arm a can be represented as the sum of the even and odd modes, while a beam input at arm b can be represented as the difference between the even and odd modes. When the separation between the waveguides is large, both even and odd modes propagate at the substantially the same rate. As the separation is decreased, however, the evanescent tails interact, causing the odd and even modes to propagate at different speeds. As the relative phases change, the intensity of the light in the interaction region modulates between the two waveguide cores.

If the length of the coupling region is such that the two joint waveguide modes are exactly out of phase at the end of the coupling region, the sum of the modes places the outgoing light in the opposite waveguide from the one in which it entered. This is the "full crossover" condition where a signal entering the coupler through arm a is transferred to arm d, and a signal input in arm b is transferred to arm c. If the coupling region is half the "crossover length", the input is evenly split between the two output waveguides. If the coupling region is twice the "crossover length", the signals rephase and interfere constructively to place the full output signal back into the originating waveguide. By adjusting the length of the coupling region, any split ratio can be achieved. Similarly, by changing the index of refraction of the space between the waveguides, the space around the waveguides, and/or the waveguides themselves, the evanescent coupling, and therefore the relative speed of the even and odd modes, can be changed. By varying the index, light can be switched from one output to the other without changing the physical coupling length or length of the device.

This description of the operation of a nonlinear directional coupler is merely one possible example of the true capabilities of a basic structure in which a data stream and a control stream are of the same wavelength (e.g., the data stream becomes the control stream). A nonlinear directional coupler can be designed that is more useful as an optical switch in the non-degenerate case (e.g., where control and data wavelengths are different) using a nonlinear nanocomposite material which has large index change due to control intensity variations while simultaneously having small index change due to data stream intensity variations.

Some embodiments of the current invention comprise a directional coupler with an engineered nonlinear nanocomposite material in and/or around the coupling region, capable of switching at speeds up to 10 THz. In one preferred aspect of this embodiment, the length of the coupling region is less than 1 cm, more preferably less than 1 mm, and most preferably less than 0.5 mm. Such short interaction lengths are allowed through use of an engineered nonlinear nanocomposite material of some embodiments of the present invention.

The arrangement described above is merely one possible planar incarnation for a directional coupler. Any arrangement (e.g., vertical displacement of waveguides) in which a relative phase shift between the even and odd modes is induced by a refractive index change of an engineered nonlinear nanocomposite material can be used.

In general, preferred characteristics include a substantially rectangular waveguide core with a height less than about 62.5 µm (preferably between approximately 2 µm and 15 µm and more preferably ~5–7 µm) and a width less than about 62.5 µm (preferably between approximately 2 µm and 10 µm, more preferably between approximately 4 µm and 6 µm). The separation between waveguides in the input and output regions is typically greater than about 10 µm, more preferably greater than 20 µm. In the coupling region, the separation is preferably between approximately 2 µm and 8 µm, more preferably between approximately 4 µm and 6 µm, which can vary depending on the width of the waveguide core. The active material comprising an engineered nonlinear nanocomposite material fills the space between the waveguides in the coupling region and can extend beyond the coupling region without significant change in width. The active material preferably extends at least about 50 microns on either end of the coupling region, more preferably at least about 500 microns. This allows for the possibility of collinear coupling of a control beam as well as minimizing any abrupt interface issues in the coupling region. The length of the coupling region is preferably between approximately 100 µm and 10000 µm, more preferably between approximately 500 µm and 5000 µm. To maximize the utilization of a finite nonlinear index change, the index of refraction of the engineered nonlinear nanocomposite material is preferably less than the index of refraction of the waveguide core, more preferably about halfway between the index of refraction of the waveguide core and the index of refraction of the cladding. The nonlinear nanocomposite material preferably has an index that remains lower than the indices of the waveguide cores even under exposure to the control beam in order to maintain some degree of guiding in the cores. For other applications, the index of refraction of the nonlinear nanocomposite material can be either greater than that of the core or less than that of the cladding.

In a particularly preferred embodiment, the nanocomposite material used is engineered such that the average index of refraction between the active (illuminated) and inactive (dark) states is placed about halfway between the index of the waveguide core and the index of the cladding.

The following examples constitute a subset of the preferred embodiments of a nonlinear directional coupler and are not meant to limit the scope of the present invention:

a) Example 1

Figure 14A:
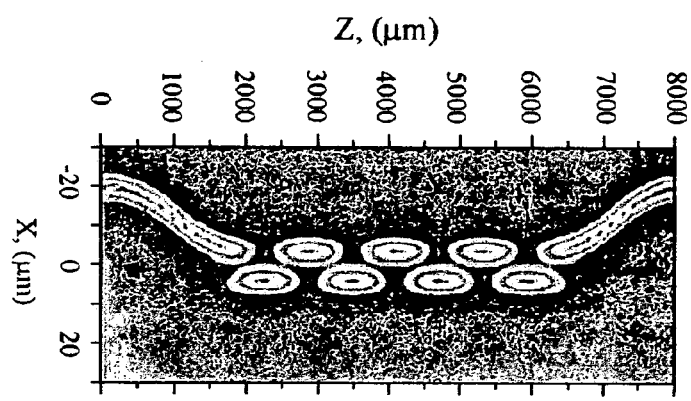
FIGS. 14(a), 14(b), 14(c), and 14(d) illustrate a simulation of switching in a directional coupler comprising an engineered nonlinear nanocomposite material, according to an embodiment of the invention.
Figure 14B:
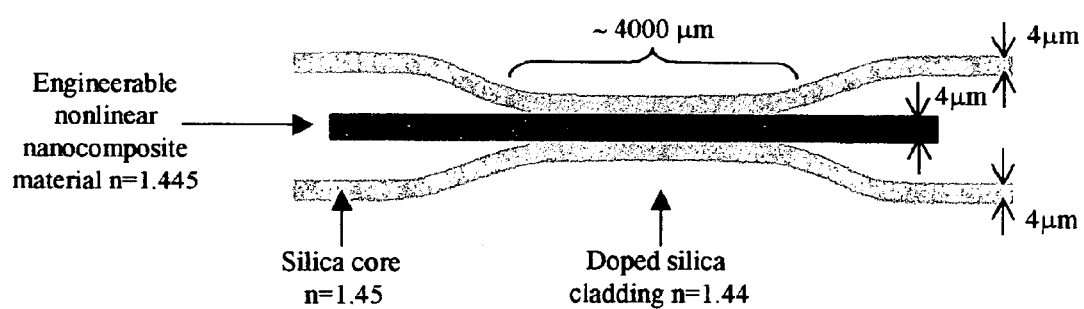
Figure 14C:
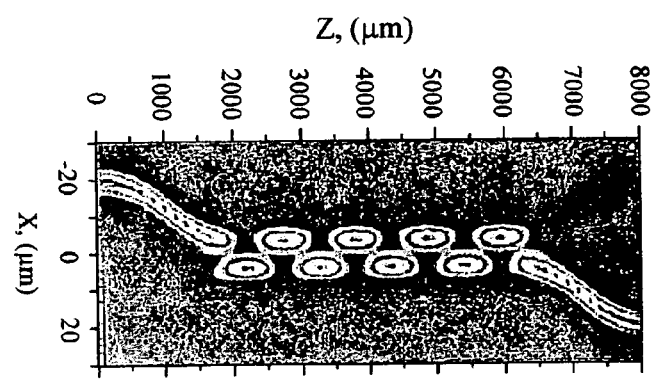
Figure 14D:
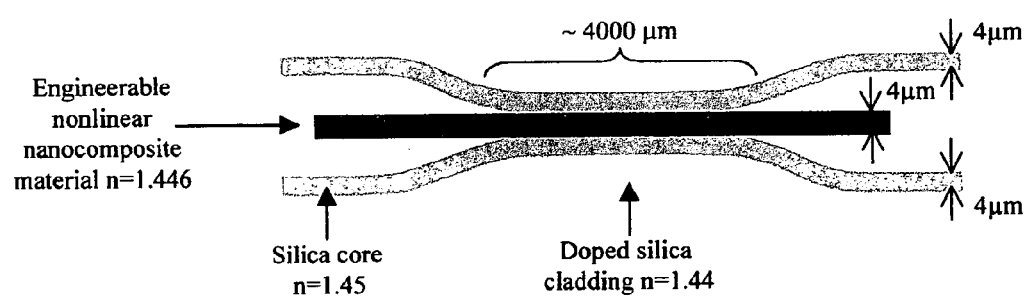

FIGS. 14(a) through 14(d) show a simulation of switching in one preferred embodiment of a directional coupler formed with an engineered nonlinear nanocomposite material wedged between waveguides in the plane. FIGS. 14(a) and 14(c) show field amplitudes in the directional coupler for a first switch state and a second switch state, respectively. The field amplitudes are shown by contour plots with the x and z axes representing dimensions of the device. FIGS. 14(b) and 14(d) illustrate the dimensions of the device and refractive indices used in the simulation. For FIG. 14(b), the device is in the first switch state with the index of refraction of the engineered nanocomposite material being 1.445. For FIG. 14(d), this index is changed from 1.445 to 1.446, thus producing a change to the second switch state.

b) Example 2

Directional coupler with nonlinear nanocomposite material placed between waveguides separated vertically c) Example 3

Directional coupler with nonlinear nanocomposite material surrounding the waveguide (either in the plane or three-dimensionally)

d) Example 4

Use of silicon or other high index materials for waveguide core material e) Example 5

Writing of waveguides directly into a nonlinear nanocomposite material layer and illuminating the entire coupling region for switching f) Example 6

Directional coupler with nonlinear nanocomposite material as a core

Nonlinear MZ-Interferometer

Figure 15:
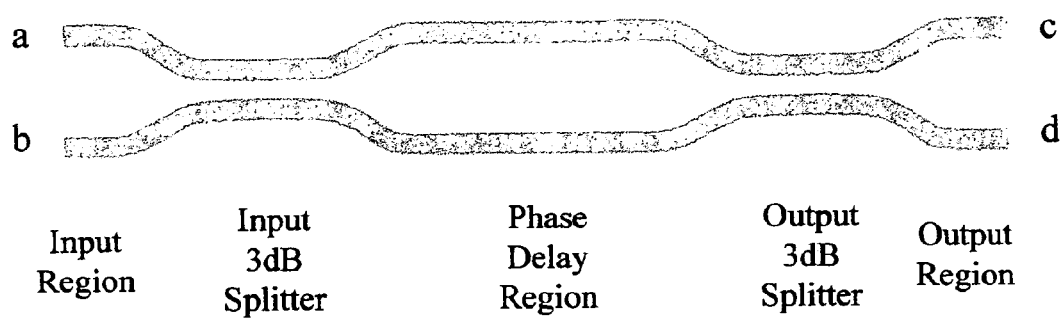
FIG. 15 illustrates a MZ interferometer known in the art.

A typical Mach-Zehnder switch comprises five regions, as illustrated in FIG. 15. In FIG. 15, the solid lines represent optical waveguides. In this case a beam is split and recombined by directional couplers. Alternatively, the beam can be split and recombined using Y-junctions. The input region forms the input to the switch. For a 2×2 cross connect, inputs (a) and (b) are both used (one for each input data stream). For a simple on/off switch, either input (a) or input (b) may be used as the input. The Input 3 dB Coupler ("splitter") effectively distributes the data signals between the two arms of the phase delay region (typically, but not necessarily, equally). Depending on the relative phase delay between the two arms, the signal entering the Output 3 dB Coupler can interfere constructively or destructively. Depending on the interference, the switch can be either straight (a⇌c, b⇌d), crossover (a⇌d, b⇌c), or anywhere in between. By modulating the index of refraction in one or both of the arms, it is possible to adjust the relative phase delay and therefore affect or control the output of the MZ interferometer.

One common embodiment of the Mach-Zehnder architecture is in thermo-optic switches, where index of refraction is modified as a function of temperature. Thermo-optic switches of this type have a switching speed of 1–3 ms, which is adequate for optical network protection and restoration purposes but not for high-speed switching applications.

Embodiments of the current invention provide a nonlinear MZ interferometer comprising a unique engineered nonlinear nanocomposite material and capable of functioning at speeds as high as 10 THz. The nanocomposite material is preferably incorporated into the core of one or both arms of the phase-delay region of a MZ interferometer (incorporating into both arms is particularly preferred as this can minimize the effects on the switch due to index modulations in the nonlinear nanocomposite material caused by an incoming data stream). Alternatively, or in conjunction, the nanocomposite material may be incorporated into the cladding of the phase delay region. A control beam induced nonlinearity, achieved by, for example, illuminating the nanocomposite material with a trigger pulse, is optionally used to introduce an index change seen by the data beam in the nonlinear nanocomposite material. The control beam need not be uniformly distributed over the nonlinear nanocomposite material. This index change may result from resonant, nonresonant, or near-resonant processes. In one preferred embodiment of the present invention, the active region of the MZ interferometer switch is less than about 5 mm in length, preferably less than about 1 mm, and more preferably less than about 0.5 mm. Such short active region lengths are orders of magnitude shorter than what has been previously typically available.

The quantum dot material and size used in the engineered nonlinear nanocomposite material can be selected to maximize nonlinearity and minimize loss in the wavelength range-of-interest. The concentration of quantum dots can be separately selected to match the refractive index requirements determined by the specific waveguide material and architecture. For a nanocomposite material incorporated into the waveguide core, the index of refraction is typically selected to be greater than the index of the cladding material and preferably equal to the index of the waveguide core material. Alternatively, the nanocomposite material may have an index of refraction that is greater than that of the waveguide core material but preferably less than about 1% greater in order to reduce waveguide core interface reflections. For a nanocomposite material incorporated into the cladding, the concentration is typically selected so the index of refraction of the nanocomposite material is less than the index of the waveguide core and preferably equal to the index of the cladding material. Alternatively, the nanocomposite material can have an index of refraction that is less than that of the cladding. Optionally, the nanocomposite material can have an index of refraction that is greater than that of the cladding.

No symmetry restrictions are typically required in this general MZ interferometer. In fact, the device may optionally use an asymmetric design to induce an effective index of refraction bias or phase bias between the two arms. For a planar waveguide device operating at wavelengths between 1500 nm and 1600 nm, the waveguide core material is preferably doped silica, and the cladding is preferably doped silica with an index difference less than 10%. One of ordinary skill in the art of silica waveguide manufacture will know the particular dopants and concentrations necessary to achieve these conditions. For one embodiment, the waveguide cross-section will preferably be substantially rectangular with a thickness less than about 62.5 µm (more preferably between approximately 2 µm and 15 µm, most preferably between approximately 5–7 µm) and a width less than about 62.5 µm (more preferably between approximately 2 and 10 µm, most preferably between approximately 4 µm to 6 µm). For another embodiment, the waveguide cross-section will preferably be substantially rectangular with thickness and width between approximately 2 µm and 10 µm (preferably with thickness from about 4–7 µm and width from about 4–6 µm). Typically, both input and output directional couplers will have a separation in the coupling region of less than about 8 µm (preferably between approximately 1 µm and 6 µm) and a length of the coupling region between approximately 100 µm and 3000 µm (preferably between approximately 200 µm and 2000 µm), with length depending on the core dimensions, waveguide separation, and core-cladding index difference. In regions outside the interaction regions, waveguide separation is preferably greater than about 10 µm, more preferably greater than about 30 µm. The minimum separation is a function of core-cladding index change and typically decreases with increasing index difference.

Alternatively, the nonlinear Mach-Zehnder interferometer structure can be created with MMI couplers (typically symmetric) as both input and output couplers, in which case the MMI dimensions are preferably between approximately 10 µm and 50 µm (more preferably between approximately 15 µm and 30 µm) in width and between approximately 100 µm and 1 mm (more preferably between approximately 200 µm and 600 µm) in length. In addition, one preferred embodiment of the nonlinear Mach-Zehnder incorporates MMI WDM couplers at each end of each phase delay region in order to facilitate coupling of the control light into the phase delay regions.

The length of the phase delay region is typically determined by the strength of the cross-phase modulation induced by the trigger signal. The length of the device is preferably long enough to permit a full π-phase change for the range of trigger signal intensities incident on the device ("π-length"). If the intensity of the control pulse is known for both pass-through and crossover conditions, an exact or approximate length of the interaction region can be determined from the dimensions of the waveguide cores, the optical properties of the engineered nonlinear nanocomposite material, the location of the nonlinear material within the MZ structure, and the intensity profile of the trigger pulse. Optionally, a plurality of trigger-pulse intensities can be used, in which case the active length of the device is preferably typically increased by at least about 20% over the π-length to provide dynamic reserve and to allow for trim capability.

The following examples constitute a subset of the preferred embodiments of a MZ interferometer switch and are not meant to limit the scope of the present invention:

a) Example 1

Figure 16A:
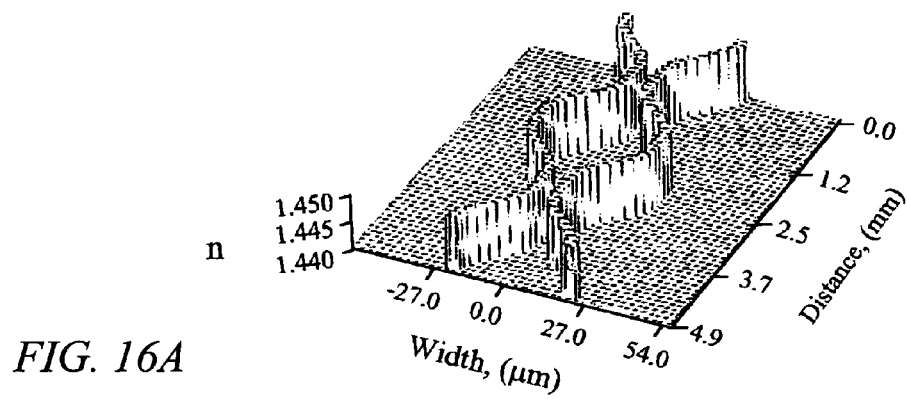
FIGS. 16(a), 16(b), 16(c), 16(d), and 16(e) illustrate a simulation of switching in a MZI switch comprising an engineered nonlinear nanocomposite material, according to an embodiment of the invention.
Figure 16B:
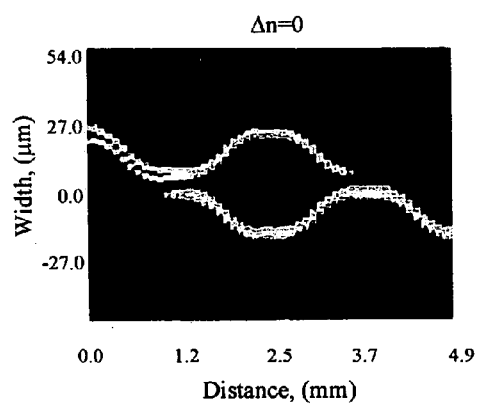
Figure 16C:
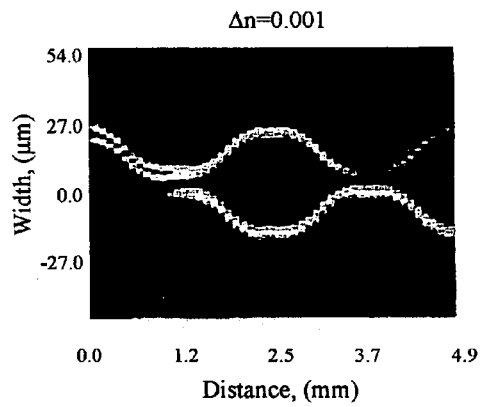
Figure 16D:
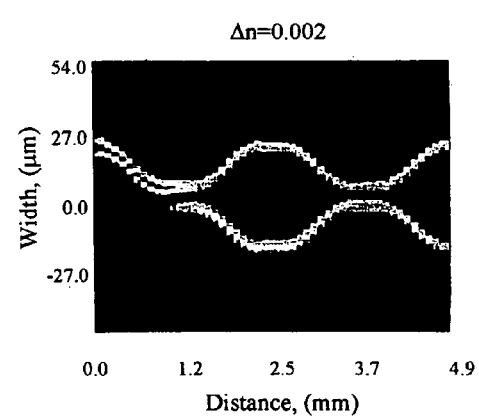
Figure 16E:
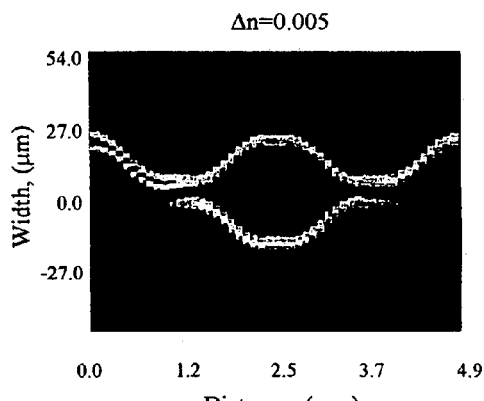

FIGS. 16(a) through 16(e) show a simulation for switching in a MZI switch comprising an engineered nonlinear nanocomposite material, according to an embodiment of the invention. FIG. 16(a) shows a relief plot of the index of refraction for a horizontal cross section through the MZI switch. In the plot shown, the index of both arms is the same, which in the present example corresponds to a condition when the nonlinear nanocomposite material remains inactive. FIG. 16(b) shows a vertical integral of the optical intensity within the device under the condition of FIG. 16(a). FIGS. 16(c) through 16(e) show vertical integrals of the optical intensity within the device when the two arms are modeled to have differences in the index of refraction of 0.001, 0.002, and 0.005, respectively. This can represent conditions where the nonlinear nanocomposite material in one of the arms is activated at different levels (e.g., the arm at −27 μm) and therefore has a larger index than the other arm.

b) Example 2

Active material in both cores (push-pull)

c) Example 3

Active material as core materials (trigger-pulse spot size defines active region or regions)

d) Example 4

Active material in a cladding (e.g., for arm 1 or 2 in the phase delay region)

e) Example 5

Active material in all cladding and with illumination of only the phase-delay region f) Example 6

More than one engineered nonlinear nanocomposite material at different locations (push-pull).

g) Example 7

Silicon or other high-index core h) Example 8

Writing of a waveguide directly into the nanocomposite material and illumination of the entire region for switching Optical Transistor One embodiment of the present invention relates to an optical transistor. In general, an optical transistor is an optical device that is analogous to an electrical transistor. An optical transistor comprises a "light ballast" that can function in the same capacity as the power or voltage supply for an electrical transistor. It also comprises a signal input and a signal output. In an electrical transistor, a small input signal can modulate the flow of current from the voltage-source (or ballast) to the output port, typically in a nonlinear manner. In an optical transistor, an input optical signal typically modulates the intensity of light released from the optical ballast to the optical output. This can also have a nonlinear relationship. As will be described below, an optical transistor can have many potential applications such as optical signal regeneration, wavelength conversion and amplification, as well as optical logic functions. Preferably, the optical transistor comprises an engineered nonlinear nanocomposite material as described herein. However, it should be recognized that the optical transistor may alternatively comprise other materials (e.g., other nonlinear materials).

Figure 17A:
FIGS. 17(a), 17(b), 17(c), 17(d), and 17(e) illustrate several possible embodiments of an optical transistor comprising an engineered nonlinear nanocomposite material.
Figure 17B:
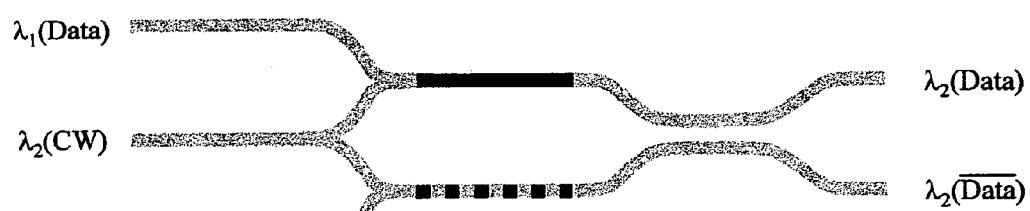
Figure 17C:
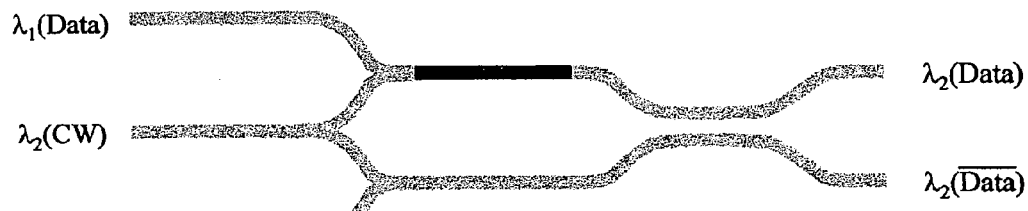
Figure 17D:
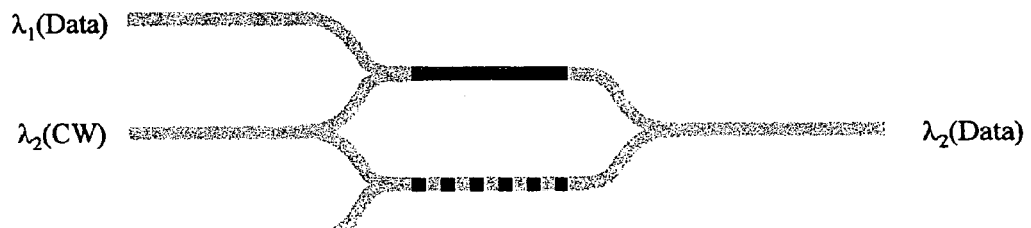
Figure 17E:
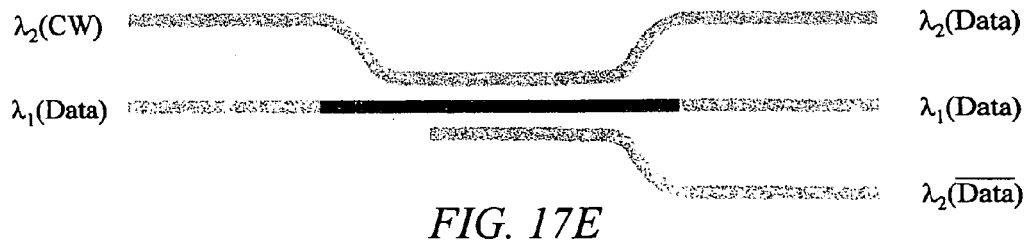

FIGS. 17(a) through 17(e) depict several preferred embodiments of an all-optical transistor comprising an engineered nonlinear nanocomposite material. Here, the solid lines represent optical waveguides, and the darkened regions indicate the locations of the nanocomposite material. The first four embodiments, which are shown in FIGS. 17(a) through 17(d), are variations on a MZ interferometer in which an input signal induces a relative phase difference between the two arms by a control beam induced optical nonlinearity (see description of MZ interferometer), resulting in a modulation of the transmission of a ballast signal to an optical output. The fifth embodiment, which is shown in FIG. 17(e), is a variation on a nonlinear directional coupler in which an input signal feeds a center nonlinear nanocomposite material (either from the top or along the nonlinear region as shown), modulating the output of a ballast signal. In all cases, the dynamic range and "gain" of the optical transistor can be controlled by the intensity of the light ballast.

For each of the embodiments shown in FIGS. 17(a) through 17(e), two inputs are provided. The first input is the data input. In this case, the input signal is also the trigger-signal. The second input is a CW signal, corresponding to the ballast signal. Alternatively, either the input signal or the ballast signal or both may be pulsed. The wavelengths of the input and ballast signals can be the same or different. The response time of the optical transistors are optionally as fast or faster than about 60 fs.

In each of these embodiments, the design parameters are preferably similar to those described in the preceding sections for each individual component. Many alternative embodiments can be envisioned using various devices and materials, as will be recognized by one of ordinary skill in the art.

Figure 17F:
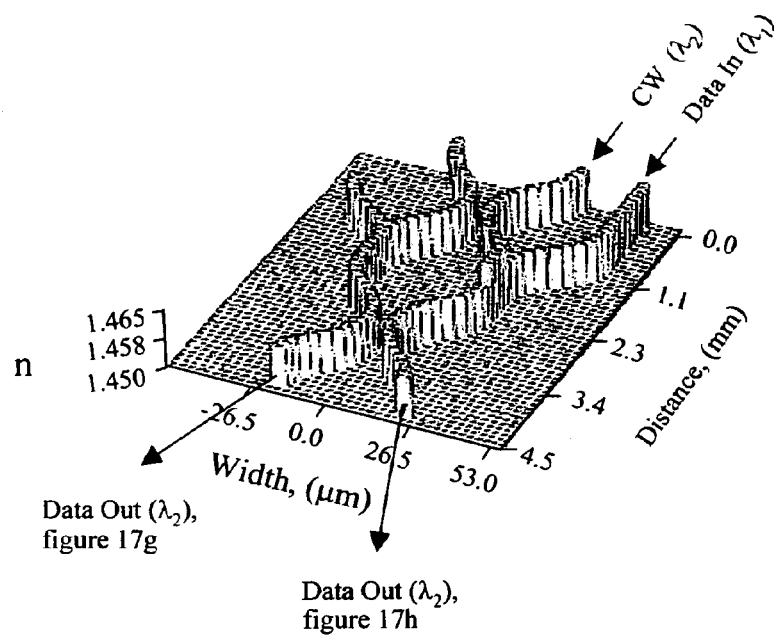
FIGS. 17(f), 17(g), 17(h), and 17(i) illustrate a simulation for an optical transistor comprising an engineered nonlinear nanocomposite material, according to an embodiment of the invention.
Figure 17G:
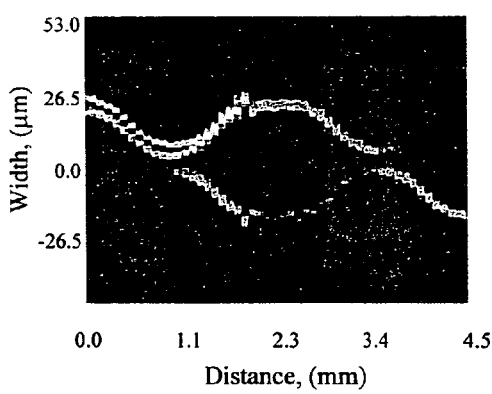
Figure 17H:
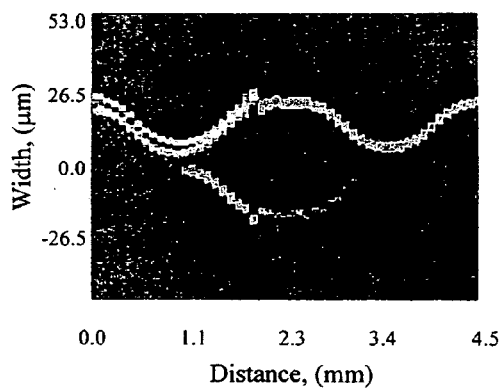
Figure 17I:
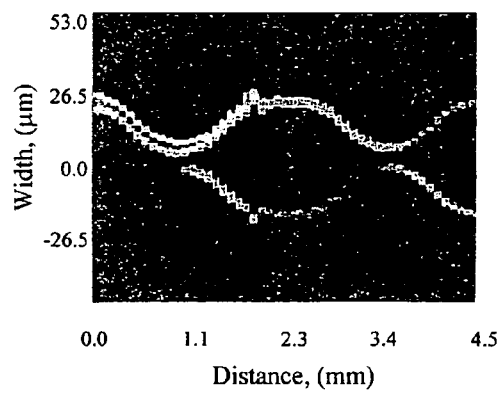

FIGS. 17(f) through 17(i) show a simulation of an optical transistor comprising an engineered nonlinear nanocomposite material, according to an embodiment of the invention. FIG. 17(f) shows a relief plot of the index of refraction for a horizontal cross section through the optical transistor. FIG. 17(g) shows a vertical integral of the optical intensity within the device under the condition of FIG. 17(f). For FIGS. 17(h) and 17(i), the relative index of the arms of the device were changed. By adjusting the relative index, a "data out" signal (at wavelength $\lambda_2$) can be guided to exit in the lower arm as shown in FIG. 17(g), in the upper arm as shown in FIG. 17(h), or in both arms as shown in FIG. 17(i). FIGS. 17(g), 17(h), and 17(i) can represent conditions when the nonlinear nanocomposite material is activated at different levels, thus resulting in different index increases.

Wavelength Converter

In general, wavelength converters can allow higher efficiency in the use of the wavelength resources of an optical network by enabling a substantial increase in re-configurability. They typically have the ability to convert data at one wavelength into a different distinct wavelength in the optical domain. Presently, first generation designs typically implement opto-electronic wavelength conversion through signal detection and regeneration at a different wavelength. Embodiments of the current invention comprise methods and devices for performing all-optical wavelength conversion at speeds up to about 10 THz using an engineered nonlinear nanocomposite material.

The wavelength converters of some embodiments of the present invention comprise an optical transistor and represent a significant improvement over previous wavelength converters. Preferably, the wavelength converters comprise an engineered nonlinear nanocomposite material as described herein. However, it should be recognized that the wavelength converters may alternatively comprise other materials (e.g., other nonlinear materials).

In one preferred embodiment of the present invention, a wavelength converter comprises an optical transistor with different input and ballast wavelengths. In this case, the output signal is modulated from zero to some finite signal as a function of the input signal intensity. A series of data pulses at $\lambda_1$ can result in a substantially identical series of output pulses at $\lambda_2$. By modifying the optical transistors of FIGS. 17(a) through 17(e) to use input and ballast signals at different wavelengths, several preferred embodiments of an all-optical wavelength converter can be produced. The first four embodiments, as shown in FIGS. 17(a) through 17(d), are variations on a MZ interferometer in which an incoming data stream at $\lambda_1$ induces a relative phase difference between the two arms by cross phase modulation (see description of MZ). The fifth embodiment, as shown in FIG. 17(e), is a variation on a nonlinear directional coupler in which a data stream feeds the center nonlinear nanocomposite material (either from the top or along the nonlinear region as shown).

For each of the preceding embodiments, two inputs are provided. The first input is a data-signal at wavelength ($\lambda_1$) that is to be converted to a different wavelength ($\lambda_2$). In this case, the data-signal is also the trigger-signal. The second input is a CW signal at $\lambda_2$ that is modulated by the data-signal. Alternatively, the second signal is a pulsed signal that can be synchronized to the data-signal frequency.

In each of these embodiments, the design parameters are preferably similar to those described in the preceding sections for each of the individual components. Many alternative embodiments can be envisioned using various devices and materials, as will be recognized by one of ordinary skill in the art.

Optical Regeneration System

With current WDM systems, optical regeneration (either 2R (reamplification and reshaping) or 3R (2R with retiming)) is primarily performed using optical to electronic conversion. After this conversion, a signal can be retransmitted (via an electronic to optical conversion) at the appropriate amplitude (reamplification) once the signal has been reformed with the appropriate characteristics (reshaping) and phase-locked to the local oscillator (retiming).

The optical transistor of embodiments of the present invention can be configured to provide 2R and/or 3R regeneration. Preferably, optical regeneration systems comprise an engineered nonlinear nanocomposite material as described herein. However, it should be recognized that the optical regeneration systems may alternatively comprise other materials (e.g., other nonlinear materials).

In one preferred embodiment of the present invention, an optical regeneration system comprises an optical transistor with input and ballast wavelengths either the same or different (in the case of different wavelengths, the regeneration system also acts as a wavelength converter). In either case, the ballast signal is typically pulsed and synchronized with the local clock (for retiming). The pulse width of the ballast signal is typically selected to match the desired output pulse shape (reshaping). The input signal is the data signal to be regenerated. The intensity of the ballast signal is preferably about 10 times higher than that of the data signal, more preferably about 100 times higher than the data signal, and can be selected depending on the desired output signal (reamplification). The data signal is optionally pulsed.

Wavelength Conversion Comprising Four-Wave Mixing (Nonresonant Nonlinearity)

Wavelength conversion can also be achieved through four-wave mixing using engineered nonlinear nanocomposite materials of some embodiments of the present invention. A device can use the high optical nonlinearity of the nanocomposite materials to provide efficient frequency conversion of a data signal using non-degenerate four-wave mixing. During this process, the data signal with carrier frequency $f_1$ interacts with a control beam of frequency $f_2$ in an engineered nonlinear nanocomposite material to form beams with frequencies $2 f_1 - f_2$ and $2 f_2 - f_1$ in addition to the incident frequencies. This allows one to generate a frequency shifted data beam in any other of the ITU grid frequencies by appropriately tuning the control beam frequency. The undesired beam can then be separated from the new data beam using appropriate frequency splinters and/or filters. Since the intensity of the frequency-shifted beam typically depends on the nonlinearity of the nanocomposite material (such as in the form of a film), it is desirable to engineer a nonlinear nanocomposite material with as large nonlinearity as possible. In addition, it is also desirable to reduce Fresnel losses in the film by having the linear index of the film to be as low as possible or be matched to the index of the waveguide material transporting the beams to the film. These factors desirably should be optimized such that the net output at the desired frequency is maximized.

Optical Limiter

An embodiment of an optical limiter uses the nonlinear optical absorption of nanocomposite materials of some embodiments of the present invention to limit the optical power that passes through the nanocomposite material. This represents a different use of a nonlinear optical material, where induced absorptive losses can be advantageous. For ultrafast (e.g., <1 ps) optical limiters, a large two-photon absorption (TPA) provided by the quantum dots of the present material can be utilized. Alternatively (or perhaps in combination with TPA), scattering losses can be enhanced under higher intensity illumination (due to increased index change) caused by aggregates of quantum dots of a size comparable to the wavelength of light in question. Ideally, a matrix material is such that its index matches the groups of quantum dots, so that there are initially no or little scattering losses. Finally, the use of nonlinear refraction could be used to form an induced lens in the nonlinear optical material as a means of reducing the throughput through an aperture with increasing intensity. This may either be ultrafast (e.g., if no thermal effects are present) or relatively slow, depending on whether significant optical absorption occurs to heat the material and induce thermal lensing (e.g., via the thermo-optic effect).

A 1×N Controllable/Configurable Switch Comprising a Saturable Absorber

This device uses linear optical properties (absorption in particular) of engineered nonlinear nanocomposite materials of some embodiments of the present invention to provide a saturable absorber, i.e., a material whose absorption can be "bleached" with an appropriate optical intensity (i.e., fluence in a period that is shorter than an excitation lifetime in quantum dots). A switch using such a saturable absorber is optimized such that a beam of light used for transmitting data is absorbed to a level that is below the threshold for detection. A control beam, of either the same or different wavelength, with pulses that are either just sufficient for saturation (e.g., for the same wavelength) or are greater than or equal to the saturation threshold (e.g., for different wavelengths) impinging on the same spot as the data beam would allow transmission of the data beam. If different wavelengths are used, the control beam can be filtered out. Besides the switching function, this device can act as an optical AND logic gate. By splitting a data stream N ways using either a demultiplexer (e.g., for different wavelengths) or a power splitter (e.g., for broadcasting purposes) and having one switch per N routes, one can create a 1×N controllable/configurable switch.

Optical Spatial Light Modulator

Embodiments of the present invention can also be used to create a novel and surprisingly fast optically addressable spatial light modulator. This can be achieved through optically induced phase shift that can be created in spatial locations on a nanocomposite material (e.g., in the form of a film) where a control beam is incident on the film. The spatial configuration of the phase shift can then be specified by an array of lasers that is imaged onto the nanocomposite material, thus providing a phase shifting spatial light modulator that is optically addressed, with all of the bulky electronics and lasers desirably being placed remotely from the modulator element itself. This can be made into an amplitude modulator by placing the nanocomposite material in an interferometer. Such a spatial light modulator can operate at speeds as fast as about 10 THz.

Tunable Waveguide Bragg Gratings and Filters

By taking advantage of the fast response time, high nonlinearity, and ease of processing of nanocomposite materials, a novel class of devices can be provided, utilizing the index change caused by light interacting with an engineered nonlinear nanocomposite material to allow for either the modulation of an effective grating period or the complete formation and/or erasure of a Bragg grating in a waveguide. This functionality allows for either tunable filters or optical modulators. In some embodiments of the invention, light, rather than an electric field, is used to modulate the index. The result is a surprising improvement in switching speeds, up to about 10 THz. In addition, previously used liquid crystal technology typically cannot produce a tunable Bragg-grating that can be easily achieved in embodiments of the present invention by adjusting the arrangement of the optical interference which creates the grating.

Figure 18:
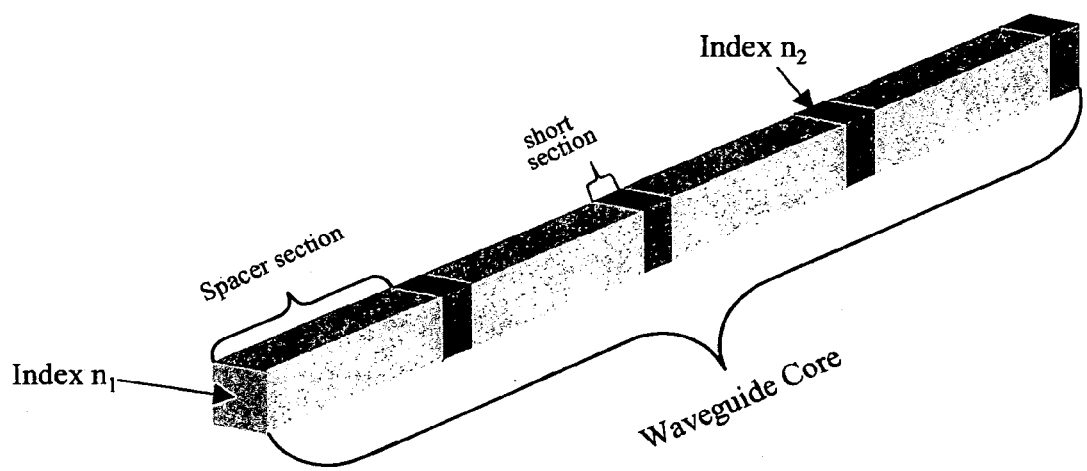
FIG. 18 illustrates a waveguide Bragg-reflector known in the art.

A waveguide Bragg-grating, as known in the art, can be described as a waveguide core comprising alternating sections of high and low index of refraction sections or portions, as illustrated in FIG. 18. Typically, a series of short sections of one index are separated by long sections of a second index. Here, the terms "short" and "long" are used here to distinguish two different regions of the grating and do not imply that one of these sections is necessarily shorter or longer than the other. If desired, these sections are optionally the same length. The short sections of a waveguide Bragg-grating will herein be referred to as "short sections" and the long sections will be referred to as "spacer sections". The high index material can be in either the short sections or the spacer sections. Alternatively, a multi-layer stack within the waveguide core can comprise a plurality of indices and a plurality of lengths.

Figure 19A:
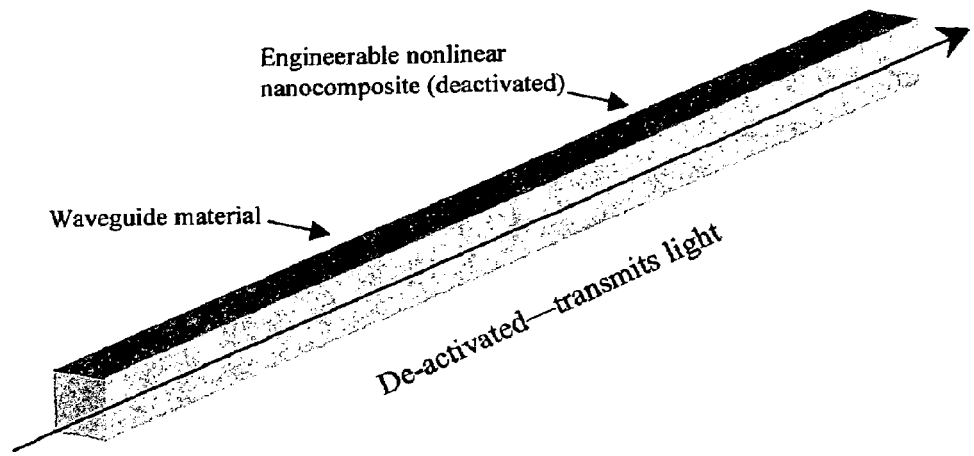
FIGS. 19(a) and 19(b) illustrate an activatable nonlinear waveguide Bragg-reflector comprising an engineered nonlinear nanocomposite material in de-activated and activated states, according to an embodiment of the invention.
Figure 19B:
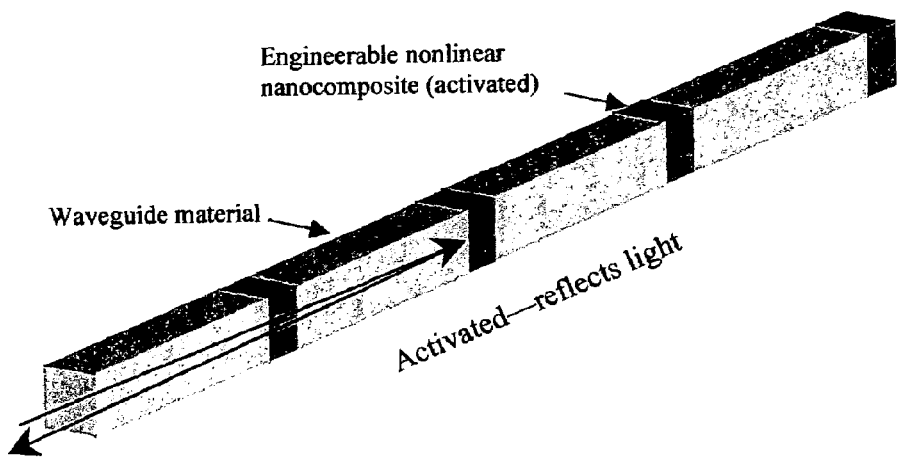

In a preferred embodiment of the present invention, a waveguide grating is formed by removing sections (e.g., equal length sections) of an optical waveguide core. Each section can correspond to a short section of a waveguide Bragg-grating. The removed sections are then replaced with an index matched engineered nonlinear nanocomposite material (or any other index-matched nonlinear material). In the absence of a trigger-signal, light passing through the modified portion of the waveguide experiences no or little change in index and passes through unimpeded as shown in FIG. 19(a). In particular, in the deactivated state as shown in FIG. 19(a), the sections of nonlinear material have substantially the same refractive index as the other sections. In the presence of a trigger-signal, a periodic index change is formed, and a fiber Bragg-grating appears, thus manipulating (e.g., reflecting) the signal light as shown in FIG. 19(b). In particular, in the activated state as shown in FIG. 19(b), the sections of nonlinear material have a slightly different refractive index compared to the other sections, thus forming a Bragg grating.

The spectral characteristics of the grating can be tailored by selecting the specific series of lengths and spacings of the waveguide core material and the engineered nonlinear nanocomposite material. The length of the thin sections, as well as the length of the spacers can be chosen to create any dielectric stack. The stack can be either periodic or nonperiodic and can have all layers with the same or different lengths. It is also possible to configure the device such that the grating is present in the absence of a pulse-signal and disappears when the trigger is present.

In an alternative embodiment, a grating is formed with the engineered nonlinear nanocomposite material comprising spacer sections. In this case, modulating the index of the spacer sections reduces the speed with which light travels through the waveguide, creating an effective change in the distance between the short sections. The result is that the wavelength characteristics of the Bragg-grating will typically be dependent on the change in index and therefore the intensity of the trigger-pulse. In this embodiment, a wavelength-tunable, optically controlled waveguide Bragg grating is formed. In particular, the sections of nonlinear material have a refractive index that can be continuously tuned to the appropriate value for a desired wavelength (or band of wavelengths) to be transmitted.

Embodiments of the invention also provide a method for illuminating a tunable waveguide Bragg-grating with a trigger-pulse. Preferred methods include:

a) Transverse illumination of the entire Bragg grating structure.
b) Longitudinal illumination through the waveguide, where the trigger-pulse can be either broad in duration relative to the transit time of the data-signal or where the trigger-pulse can be synchronized with the data-signal.
c) Transverse illumination with only part of the grating illuminated and/or different parts illuminated under different conditions to create a chirped grating out of a normal grating, e.g., create a nonuniform grating with optical path length that varies nominally linearly along the length of the grating, thereby forming a "chirped" grating.
d) Transverse or longitudinal illumination of the entire grating with the initial grating structure formed intrinsically chirped.

Figure 20A:
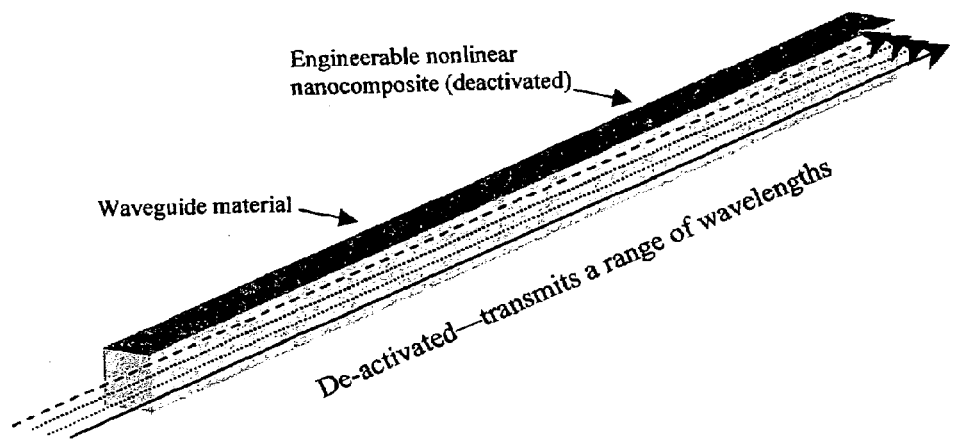
FIGS. 20(a) and 20(b) illustrate a tunable nonlinear waveguide Bragg-reflector in de-activated and activated states, according to an embodiment of the invention.
Figure 20B:
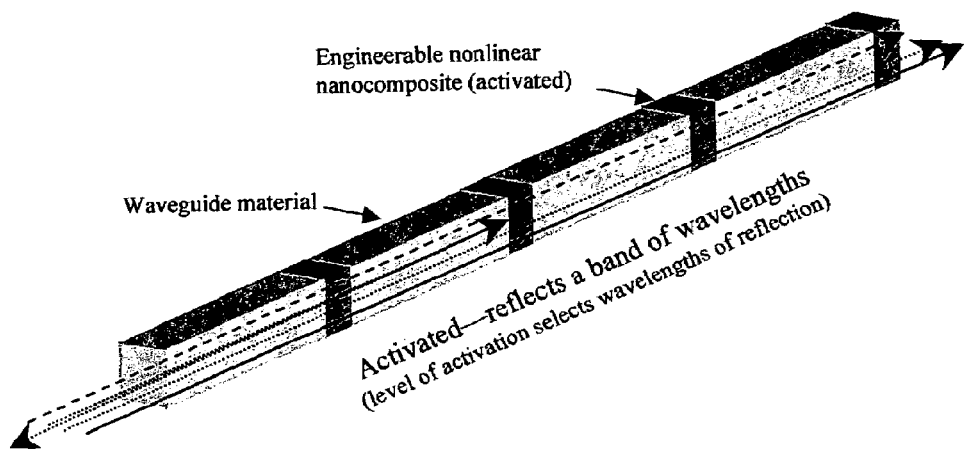

Possible applications of a tunable waveguide Bragg-grating include:

a) All-optical switching—modulate between the Bragg diffracting state and the non-diffracting state using a trigger pulse.
b) Tunable grating—vary the intensity of a trigger-signal to tune the spectral response of the Bragg-grating. FIGS. 20(a) and 20(b) illustrate a tunable nonlinear waveguide Bragg-reflector in de-activated and activated states, according to an embodiment of the invention. In this case, sections of a nonlinear material have a refractive index that can be continuously tuned to an appropriate value for a desired wavelength (or band of wavelengths) to be transmitted or reflected.

c) Wavelength converter—combination of 1 and 2 above: Multiple wavelengths enter the waveguide, but all are reflected. The data-pulse triggers the formation of a Bragg-grating, and the intensity selects the wavelength that is transmitted.
d) Variable optical attenuator.
e) Tunable dispersion compensation using chirped Bragg gratings—selectively adjust sections of a chirped Bragg grating to fine tune the appropriate dispersion characteristics to compensate for PMD, chromatic dispersion, and so forth.

Reconfigurable Integrated Optical System

Another device is a reconfigurable integrated optical system. A reconfigurable integrated optical system comprises a thin film of an engineered nonlinear nanocomposite material, typically sandwiched between two dielectric layers with linear indices of refraction that are typically lower than that of the nanocomposite material. Optionally, one of the dielectric layers comprises a patterned array of surface emitting lasers. The surface emitting lasers are optionally separated from the nanocomposite layer by an additional layer or layers of dielectric materials, one or more of which may optionally have an index of refraction that is substantially the same as the dielectric layer on the other side of the nanocomposite layer.

Light guided into the nanocomposite layer from the edge of the film is trapped within the nanocomposite layer by total internal reflection. By illuminating the film in a 2D pattern of a desired waveguide, an index change can be created via the optical nonlinearity. By selecting the correct illumination pattern, various temporary waveguide structure can be patterned into the nanocomposite layer. For optical switching applications, light guided into the temporary waveguide can be directed to any output location that would be accessible by a traditionally formed waveguide.

Figure 21A:
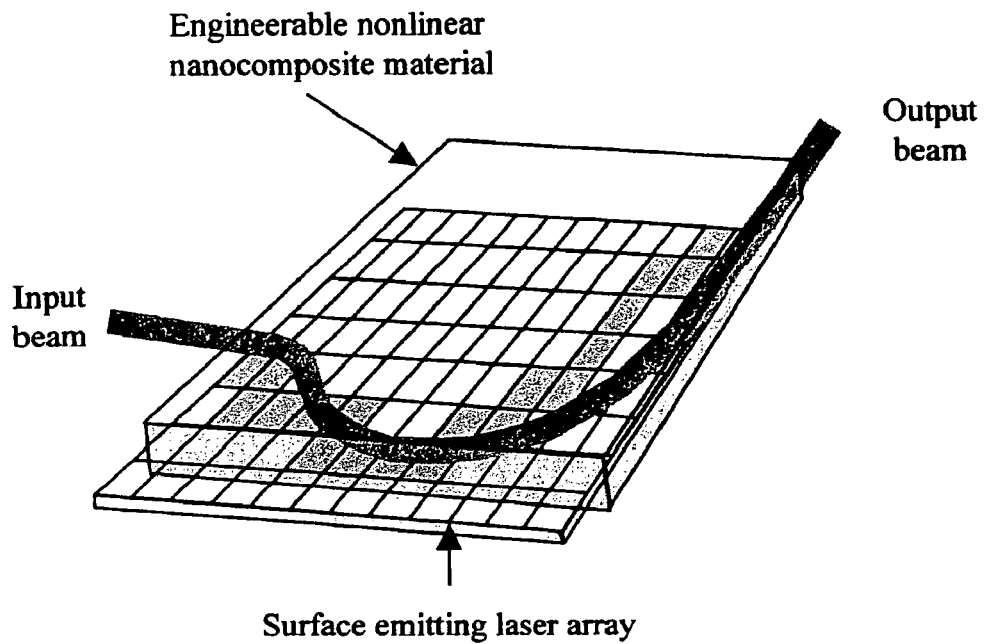
FIGS. 21(a) and 21(b) illustrate two preferred embodiments of Reconfigurable Integrated Optical Systems, where lasers are used to induce an index increase in order to define transient optical waveguides, according to some embodiments of the invention.
Figure 21B:
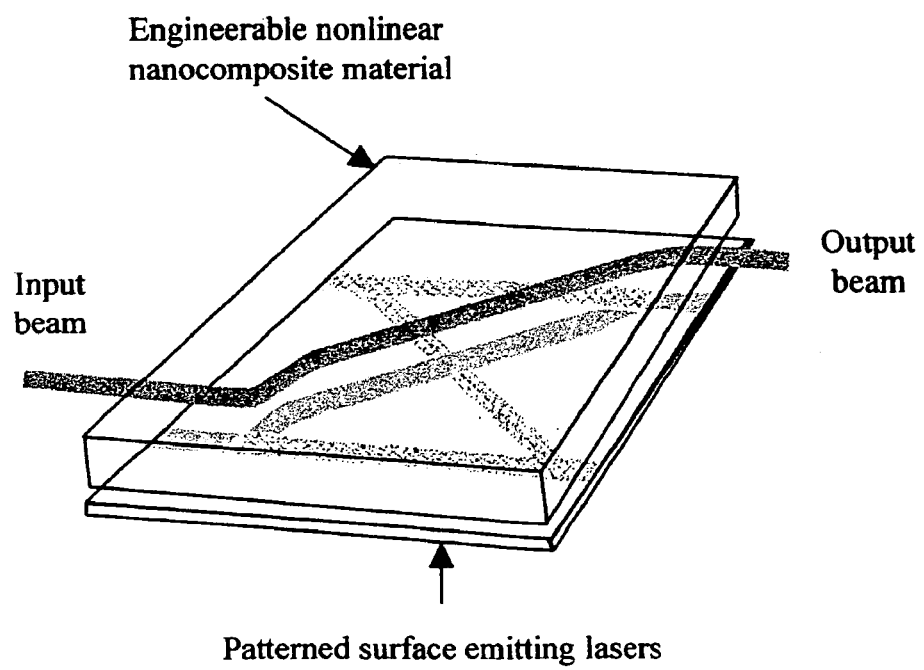

The system may be reconfigured by electronically changing the pattern of illumination. The illumination pattern can be generated by the surface emitting lasers or by an external light source. FIGS. 21(a) and 21(b) show embodiments of reconfigurable integrated optical systems along with optical patterns of surface emitting lasers and one possible light-path through each device. In FIG. 21(a), appropriate VCSELs are turned on to illuminate a film in such a pattern so as to define an optical path from an input beam path to an appropriate output beam path. In FIG. 21(b), a VCSEL array is patterned beforehand in order to define a set number of optical paths in a film.

Reconfigurable Photonic Bandgap Integrated Optical System

A photonic crystal is a material with a periodic index modulation that restricts the transmission of light to a defined set of wavevectors or "bands". This is similar in nature to the periodic arrangement of ions in a lattice that gives rise to the energy band structure of semiconductors and controls the movement of electrons through a crystal. In a photonic crystal, the periodic arrangement of refractive index variation controls how photons move through the crystal.

Photonic bandgap crystals were first predicted in 1987 by Eli Yablonovitch and Sajeev John. An array of 1 mm holes milled into a slab of material of refractive index 3.6 was found to prevent microwaves from propagating in any direction. This was analogous to how electrons cannot travel through a material if their energy does not match that of the electronic bandgap.

Breaking the periodicity of a photonic crystal by enlarging, reducing, or removing some of the voids introduces new energy levels within the bandgap (similar to dopant atoms adding energy levels within the electronic bandgap of a semiconductor). This creates photonic crystals that propagate light in only very specific ways.

Many structures can be realized in photonic crystals by modifying the pattern of defects and breaking the symmetry of the pseudo-crystal. For instance, waveguides can be formed by modifying a series of adjacent defects. With the proper defect pattern, light can be guided around corners at very nearly right angles. Wavelength selective structures can also be formed with the careful selection of symmetry and spacing.

Figure 22:
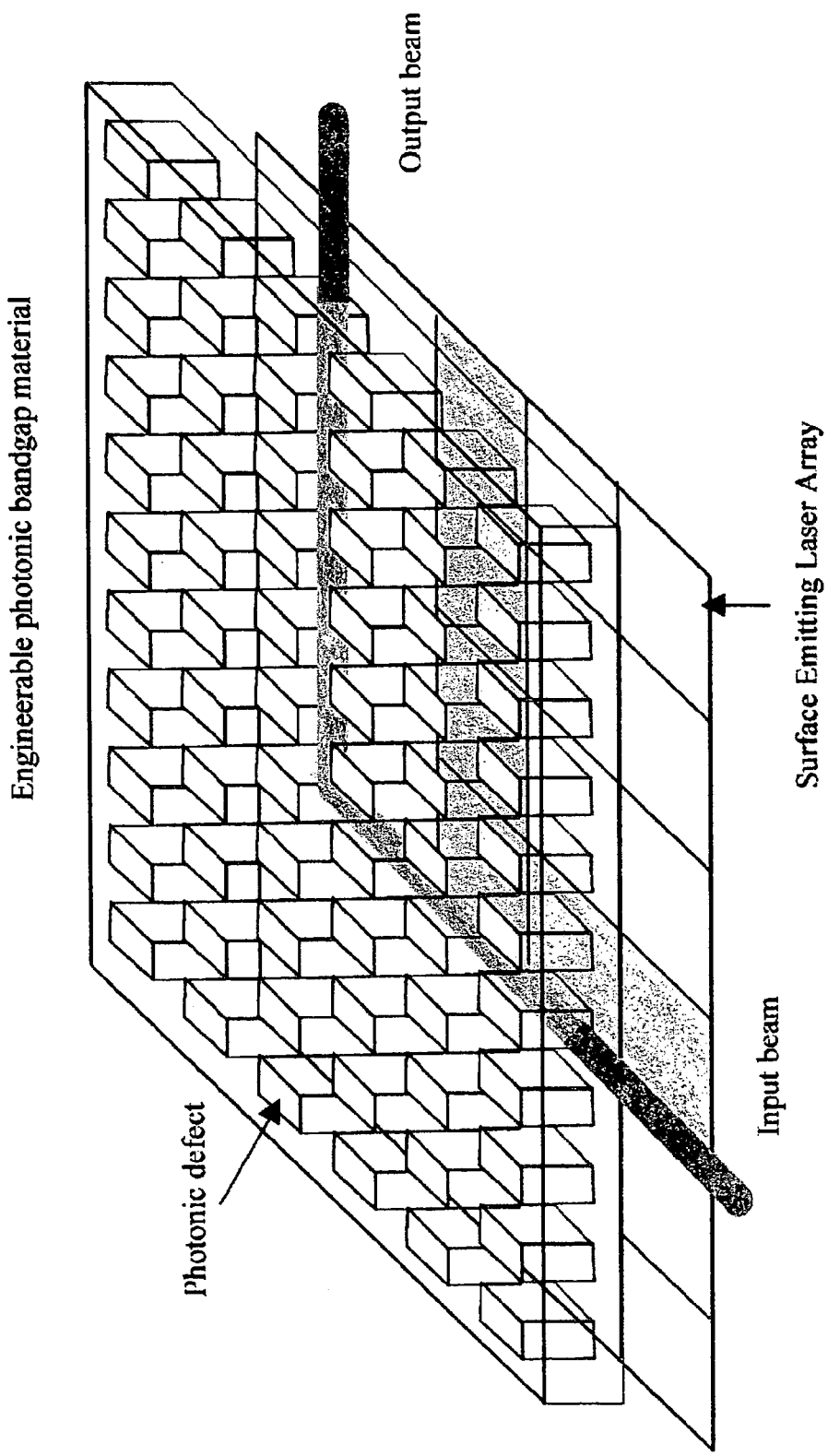
FIG. 22 illustrates one preferred embodiment of a reconfigurable photonic bandgap integrated optical system.

A device of some embodiments of the present invention is a reconfigurable photonic bandgap material in which a periodic lattice of index modulations can be electronically controlled to allow creation or modification of defects at any desired location. Such a device, as shown in FIG. 22, comprises a photonic bandgap structure (here, a 2D structure) created (at least in part) from an engineered nonlinear nanocomposite material. The nanocomposite material may be restricted to either the high or low index regions of the lattice. Optionally, the nanocomposite material can fill the entire region, and an illumination pattern can define the index modulations necessary. Alternatively, two or more different nanocomposite materials with differing optical properties can be used. In this embodiment, the nanocomposite materials may optionally react to incident light in an opposing fashion (e.g., incident light increases the index of refraction of one material but decreases the index of refraction of the other).

The 2D photonic bandgap material shown in FIG. 22 can be sandwiched between two dielectric layers such that light entering from the edge of the photonic bandgap material is guided within the 2D structure. Optionally, one or both of the dielectric layers can comprise a patterned array of surface emitting lasers for modifying the nonlinear material through a control beam induced optical nonlinearity.

Optical nonlinearity in the nanocomposite materials, induced by the surface emitting lasers or an external light source, leads to a change in the index of refraction at different locations within the photonic bandgap material. As a result, the structure of defects changes, affecting the photonic properties of the device. By separately varying the intensity of each source element, the photonic structure can be selectively modified, and the function of the device can be controlled with great precision. By changing the pattern of illumination, it is possible to arbitrarily control the path of light guided into the device.

In an alternative embodiment, the photonic bandgap material of the present invention can be a 3D photonic bandgap comprising an engineered nonlinear nanocomposite material. Illumination of the periodic index modulations changes the 3D photonic characteristics. Illumination in the case of a 3D photonic bandgap material can be performed using one or more confocal optical systems.

Systems Comprising an Engineered Nonlinear Nanocomposite Material

The devices and structures formed of materials of embodiments of the current invention can be further combined to produce a variety of novel optical systems and sub-systems capable of high speed optical processing. Using small devices based on nonlinear nanocomposite materials (as described above) can significantly improve the ability to implement these systems on a single waveguide chip.

N×M High-Speed Optical Cross-Connect

All-optical cross-connects are critical for high-speed data transmission through an optical network. Currently, cross-connects function with switching times on the order of milliseconds, appropriate for reconfiguring fixed pathways but not for dynamic data-packet switching. By combining the devices of embodiments the current invention, a novel high-speed optical cross-connect can be made, allowing all-optical reconfiguration or switching at speeds greater than about 10 THz.

Two particularly preferred configurations are Benes and Spanke-Benes architectures; however, many other potential architectures can be used and will be apparent to one of ordinary skill in the art. A list of alternative architectures can be found in R. Ramaswami and K. N. Sivarajan, *Optical Networks: A Practical Perspective* (Morgan Kaufmann Publishers, San Francisco, 2002), which is incorporated herein by reference in its entirety.

An embodiment of the present invention relates to a 2×2 optical cross-connect comprising a MZ interferometer switch or a directional coupler of embodiments of the present invention. The device is preferably embodied in a planar waveguide, more preferably a monolithic waveguide (optionally pseudo-monolithic, comprising several die) with silica or doped silica as the waveguide core material.

A further embodiment of the present invention is an N×M optical cross-connect comprising a plurality of 2×2 optical switches in one of the architectures described above. This cross-connect can be operated at speeds as fast as the individual switches (up to about 10 THz). In this case, N and M preferably range independently between 1 and 10000, more preferably 1 and 1000, most preferably between 1 and 100. One or more switches can be fabricated on a single substrate to form an entire switching network on a chip. In a preferred embodiment, the current invention comprises a 2×2 cross-connect fabricated on a single chip. In alternative preferred embodiments, the invention comprises a 4×4, an 8×8, a 16×16, a 32×32, or a 64×64 cross-connect fabricated on a single chip. Optionally, one or more chips can be combined to further increase the node cross-connect size and dimensions accessible. Each multi-switch structure preferably comprises a nonlinear directional coupler, a MZ interferometer, or a combination thereof.

N×M×λ High-Speed Wavelength Converting Optical Cross-Connect

An embodiment of the invention relates to an all-optical wavelength converting cross-connect. A wavelength converting optical cross-connect typically comprises a plurality of high-speed optical cross-connects with a plurality of high-speed wavelength converters. The materials and devices of embodiments of the present invention can be used to form this device. The specific embodiment of each component can be selected from a list of those described above.

Figure 23:
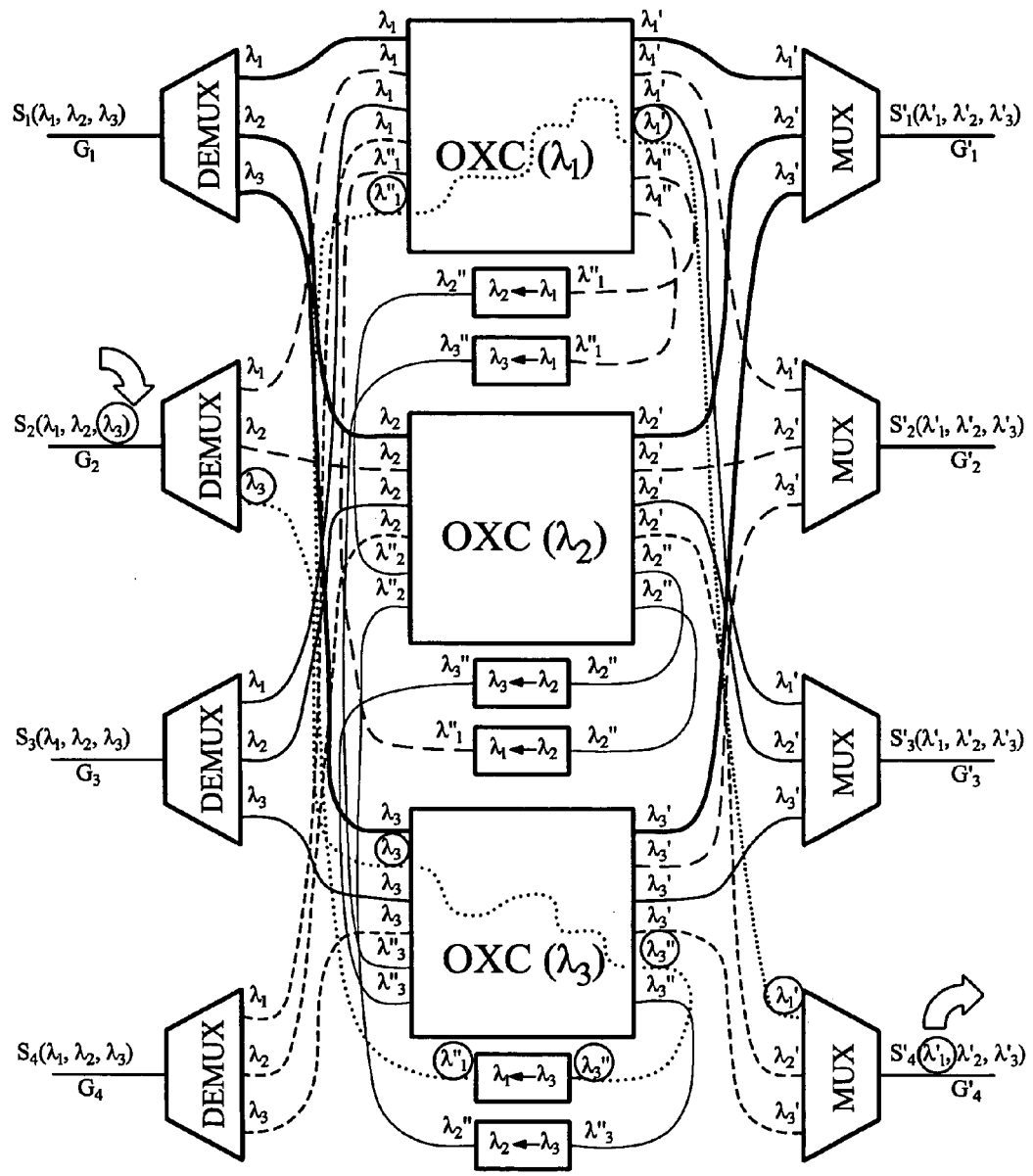
FIG. 23 illustrates a wavelength converting optical cross-connect (OXC) subsystem in accordance with an embodiment of the invention.

In a preferred embodiment, multiple WDM signals $S_1, S_2, S_3 \ldots S_N$ arrive at the wavelength converting optical cross-connect along multiple different waveguides ($G_1, G_2, G_3 \ldots G_N$). Each signal comprises multiple wavelengths ($\lambda_1, \lambda_2, \lambda_2 \ldots \lambda_M$) carrying data. FIG. 23 shows an embodiment of a wavelength converting optical cross-connect capable of switching between 3 wavelengths, 4 inputs, and 4 outputs. One of ordinary skill in the art will recognize that similar sub-systems can be created that are capable of processing higher numbers of wavelengths, inputs, and/or outputs. Similarly, while the embodiment of FIG. 23 is an N×N×λ cross-connect, it will be apparent that an N×O×λ device can also be designed, with N being different than O.

Each signal ($S_n$) from each fiber ($G_n$) can be demultiplexed into the component single-wavelength signals ($\lambda_{n,1}, \lambda_{n,2}, \lambda_{n,3} \ldots \lambda_{n,M}$). Each of the M individual wavelengths is input into a different (M+N−1)×(M+N−1) optical cross-connect (OXC$_1$, OXC$_2$, OXC$_3$ ... OXC$_M$), such that the first N inputs of cross-connect OXC$_1$ receive input signals ($\lambda_{1,1}, \lambda_{2,1}, \lambda_{3,1} \ldots \lambda_{N,1}$) from waveguides $G_1, G_2, G_3 \ldots G_N$, the first N inputs of OXC$_2$ receive input signal from ($\lambda_{1,2}, \lambda_{2,2}, \lambda_{3,2} \ldots \lambda_{N,2}$) from waveguides $G_1, G_2, G_3 \ldots G_N$, and so forth. Note that in this particular design, the signals arriving at each individual optical cross-connect have the same wavelength.

The first N output ports of each cross-connect follow the inverse path as the input ports. Signals from the first output port of cross-connects OXC$_1$–OXC$_M$ ($\lambda'_{1,1}, \lambda'_{1,2}, \lambda'_{1,3} \ldots \lambda'_{1,M}$) are combined into output guide G'$_1$, and the same is repeated for each output port 2-N to output guide G'$_2$–G'$_N$. This allows any single wavelength in input $G_1$–$G_N$ to be switched to any-single output G'$_1$–G'$_N$.

To facilitate transparent wavelength conversion, the remainder of the M+N−1 inputs and outputs are used to change the wavelength. A signal to be wavelength converted is switched to an output port for the appropriate wavelength converter. After conversion, the signal is transported to the appropriate cross-connect for the new wavelength. For instance, output port N+1 of OXC$_1$ may take a signal with wavelength $\lambda_1$ to a $\lambda_1 \rightarrow \lambda_3$ wavelength converter. The output of the converter is then routed to input N+1 of OXC$_3$. The signal can then be switched to any output port. The same is repeated for the remaining M−1 output ports and for each cross-connect.

As an example of how data is transmitted through a wavelength converting cross-connect, consider the case shown in FIG. 23 in which data of wavelength $\lambda_3$ arrives by input guide $G_2$ (left-hand arrow) and is to be converted to wavelength $\lambda'_1$ and switched to output guide G'$_4$. The following actions are required: $S_2$ in $G_2$ is demultiplexed and separated into individual component wavelengths ($\lambda_{2,1}, \lambda_{2,2}, \lambda_{2,3} \ldots \lambda_{2,M}$). Wavelength component $\lambda_{2,3}$ is routed to port 2 of cross-connect OXC$_3$. Through the appropriate interconnections of the cross-connect, the signal $\lambda_{2,3}$ is routed to output port 5, which is connected to a $\lambda_3 \rightarrow \lambda_1$ wavelength converter. The output of the wavelength converter leads to input 6 of cross-connect OXC$_1$. The signal (now $\lambda''_{2,1}$) is routed to output 4 and is then multiplexed into G'$_4$. The total conversion $\lambda_{2,3} \rightarrow \lambda'_{4,1}$ is complete. A similar procedure can be used to convert and/or connect any other input signal to any output signal. It will be apparent to one of ordinary skill in the art that the specific labels and locations of the input and output ports of the current embodiment are arbitrary labels, and that a plurality of alternative configurations are possible while maintaining the functionality of the embodiment of FIG. 23. This figure is presented for illustrative purposes only and is not meant to limit the scope of the current invention.

In an alternative embodiment, some or all of the components of the above embodiment can be incorporated into a single chip. For instance, a first chip may comprise all of the circuits for wavelength conversion to $\lambda_1$, a second chip could then comprise all of the circuits for wavelength conversion to $\lambda_2$, and so forth. Alternatively, all wavelength conversion can be contained within a single structure, as can all of the cross-connects. Similarly, wavelength conversion and cross-connects can be incorporated into a single chip, as can the entire device. It should be recognized that various other configurations can be used.

Terahertz TDM Mux/Demux

The use of Time Division Multiplexing (TDM) in communication systems can be used to combine several low-bandwidth data streams into a single high-bandwidth data stream. Currently, multiplexers and demultiplexers for TDM are often limited by the available speed of switching and are therefore limited in the bandwidth that they can provide.

One embodiment of the current invention relates to a high-speed optical TDM communication system operating at speeds up to about 10 THz. The basic system comprises a 'TDM mux' to bit-interleave several lower-data-rate sources into one higher data rate signal for aggregate transmission over an optical fiber to a 'TDM demux' that then de-interleaves the pulses and bit-fills down to the lower data rate. Both the TDM mux and demux can comprise the materials and devices of embodiments of the present invention.

Figure 24:
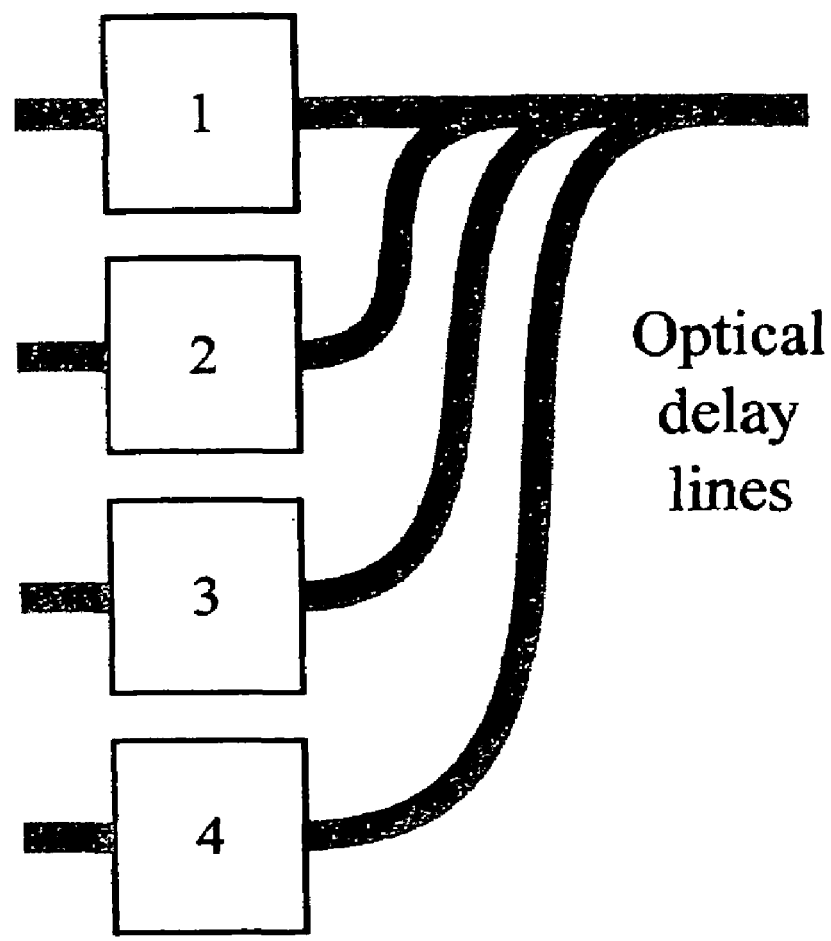
FIG. 24 illustrates an all-optical TDM multiplexer in accordance with an embodiment of the invention.

As shown in FIG. 24, the TDM mux has two parts: the first part is a bank of All-Optical Data Samplers that sample the edge of slow optical data streams (e.g., in parallel), resulting in a short duration pulse that is synchronous with the data edge. The second part is a series of optical delay lines that serve to interleave the fast pulses created by the bank of optical edge-samplers. The number of channels that can be interleaved is determined by the shortest pulse that can be generated by the all-optical samplers.

Two embodiments of an all-optical sampler can be used in the TDM mux and are discussed as follows. One preferred embodiment is a MZ structure as discussed previously (either symmetric or asymmetric), optionally followed by an all-optical switch as discussed previously to remove the after-pulse (in the operation of the demux, an output typically occurs where there is a mismatch in phase between the arms of the MZ; as a consequence, gating can occur in the desired time at the leading edge of the control pulses and at the trailing edge, leading to an after-pulse). A second preferred embodiment is an asymmetric ring resonator comprising an engineered nonlinear nanocomposite material.

Figure 25:
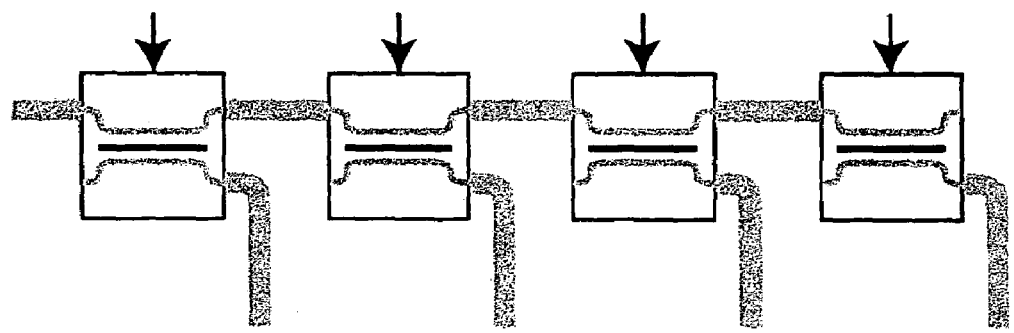
FIG. 25 illustrates an all-optical TDM demultiplexer in accordance with an embodiment of the invention.

There are several ways to implement a novel TDM demultiplexer using the materials and devices of embodiments of the present invention. One preferred embodiment, which is illustrated in FIG. 25, is a synchronous readout from a block of nonlinear switches as shown. The operation of this device is much the same as a shift register with parallel readout. The high-speed data-stream passes into the block of switches. When external timing determines that the data frame is fully within the system (or about to be), the control pulse fires, and the fast bits can be de-interleaved in parallel.

Pulse-Narrowing and CW-to-Pulsed Conversion

Another system that can incorporate the materials and devices of embodiments of the current invention is one that reduces the pulse width of an optical signal. Such devices are often required for converting slow, broad optical pulses to fast, narrow pulses prior to TDM multiplexing or for regeneration, retiming, and pulse reshaping. Output pulses of less than 100 fs are achievable in accordance with embodiments of the invention.

Using a MZ interferometer or directional coupler as described above, a signal to be pulse-narrowed can be input into one of the input waveguides substantially simultaneously with a synchronous trigger-pulse applied to the active region. The input signal, modulated by the trigger, is output containing the same or substantially the same data-stream but with pulse-widths comparable to those of the trigger-pulse. The output pulse width is determined by the trigger-pulse width and can be varied from CW to <100 fs. Utilizing this effect allows for pulse narrowing. Since the wavelengths of the data and trigger-pulses need not be the same, the same device can perform pulse narrowing along with wavelength conversion if the data and trigger pulses are of different wavelengths.

The same device can also be used to convert a CW signal into a pulsed signal, with a pulse width comparable to that of the trigger-pulse width.

According to some embodiments of the invention, pulse narrowing devices and CW-pulsed conversion devices have the capacity to function at rates as high as about 10 THz.

Methods of Introducing a Trigger-Pulse.

Having an active device remotely located from the optical circuit can lead to significant manufacturing advantages, such as easily replaceable laser control units to enhance product yield and improve field serviceability.

There are a variety of methods for introducing a trigger-signal to the nonlinear optical material of embodiments of the current invention. One method is to launch a switch signal down one of two waveguides such that it reaches the interaction region substantially simultaneously with the signal pulse to be switched. This method is described in detail in U.S. Pat. No. 5,642,453 to Margulis et al., entitled "Enhancing the nonlinearity of an optical waveguide" and issued on Jun. 24, 1997, the disclosure of which is incorporated herein by reference in its entirety. The evanescent illumination of a nonlinear material by the switching pulse as it travels through the interaction region can be enough to activate the switch. Due to the relatively high intensity of the evanescent field at distances as much as 1 to 2 microns beyond the waveguide interface, such illumination results in high-intensity, uniform illumination across the entire interaction length, yielding efficient switching. A potential disadvantage of this method of illumination is that the switching pulse travels between the two waveguides substantially at the same time as the signal pulse, potentially contaminating the signal data-stream. In the case where the switching pulse is nearly the same wavelength as used in a WDM signal, this can interfere with the data being transferred. In the case where the switching wavelength is selected to be a specific "header" wavelength, leakage into the pulse train can disrupt the timing of future switching for this particular data-stream. Either way, it is desirable to minimize or reduce the amount of switching light that is allowed to contaminate the signal pulse.

Figure 26A:
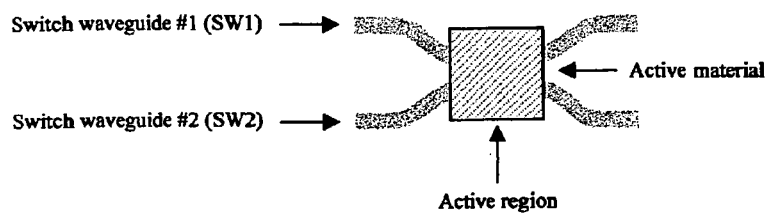
FIGS. 26(a), 26(b), 26(c), 26(d), 26(e), and 26(f) illustrate various configurations for introducing trigger pulses into optical devices, according to some embodiments of the invention.

An alternative method of illumination is to use a third beam-path that results in orthogonal illumination of the interaction region, for instance, from above or from the side. Such method is described in U.S. Pat. No. 5,136,669 to Gerdt, entitled "Variable ratio fiber optic coupler optical signal processing element" and issued on Aug. 4, 1992, the disclosure of which is incorporated herein by reference in its entirety. By illuminating from a direction that is perpendicular to the waveguide, as for example shown in FIG. 26(a), intense illumination of the interaction region can be achieved without coupling directly into the guided modes of the switch. As a result, minimal cross-talk occurs. While cross-talk is minimized in this configuration, a disadvantage is that considerable optical power is often required to produce the relatively high intensity illumination required over the entire interaction region. In addition, complicated beam-shaping optics may be required if homogeneous illumination is desired over the entire interaction length (rather than, for instance, Gaussian illumination).

Uniform, high-intensity illumination of an active region of a nonlinear waveguide switch will further reduce the required interaction lengths of embodiments of the current invention, resulting in smaller switches and lower activation intensities. This could eventually lead to telecommunication devices capable of direct-switching using an optical header-pulse as well as all-optical logic circuits functioning as speeds up to about 10 THz. This solves the existing problems related to efficient switching of light in a non-linear waveguide switch. Combined with the use of an engineered nonlinear nanocomposite material, such illumination can substantially improve the performance characteristics of future all-optical switches.

Figure 26B:
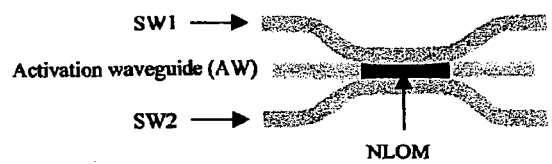
Figure 26C:

Described herein are several improved methods of activating a nonlinear material in a nonlinear waveguide switch such that the activation is substantially uniform, high-intensity, and with minimal or reduced cross-talk between the activation pulse and the data-stream. These methods are not limited to devices comprising an engineered nonlinear nanocomposite material and can be used to activate a variety of optical devices (e.g., any $\lambda^{(3)}$ based optical device).

a) In a first preferred embodiment, uniform, high-intensity illumination of the nonlinear material between the switching waveguides is produced by illuminating longitudinally through the material. For instance, activation light can be applied through an activation waveguide that is substantially parallel to the switch waveguides and in substantially the same plane as the active material. In this case, the active material can simply replace the waveguide material within the interaction region. This configuration is illustrated in FIGS. 26(b) and 26(c), where FIG. 26(b) is a top view, and FIG. 26(c) is a perspective view.

One primary requirement for a waveguide structure is that the light within the waveguide desirably should be total internally reflected at the interface between the waveguide core and the material surrounding it. This requirement can be met in the case where the index of refraction of the waveguide material is greater than that of the surrounding material. This is true of a typical waveguide structure, which has a core region fabricated from a material with a higher index of refraction than the cladding.

Figure 26D:
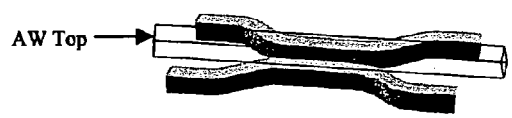

This desirably should remain true within the interaction region in order for the switch to function properly as a waveguide. In this case, one requirement for an acceptable active region is that the index of refraction of the active material is desirably less than that of the waveguide. Given this condition, activation light launched through the center of the active region, parallel to the waveguides, can experience an opposite relative index interface. As such, light launched into the active region can leak strongly into the waveguides, producing an undesired response.

b) In an alternative preferred embodiment, which is shown in FIG. 26(d), a trigger-signal is introduced along an activation waveguide that is substantially parallel to the interacting waveguides but located above or below a plane of the active material. In this case, activation is similar to that for light launched through the waveguides of the switch (e.g., evanescent, uniform, and intense) but typically and desirably does not couple efficiently into the switch waveguides, which are oriented substantially orthogonal to the dielectric interface between the activation waveguide and the active material.

Due to the relatively long wavelength of light used in telecommunications (e.g., ~1500 nm), the penetration depth of the activation light within such a structure can be as much as 1–2 microns at high intensity. This activation could be further increased by incorporating a taper (e.g., a vertical taper) to the activation waveguide, as for example illustrated in FIG. 26(f). The result of such a taper region can be to increase the coupling, and therefore intensity, of the activation light into the activation region.

In one preferred embodiment, a device comprises an optical-coupler waveguide switch as described above with a third activation waveguide core located above the active region and substantially parallel to the switch waveguides as shown in FIG. 26(d). This activation waveguide core may comprise the same material used in the switch waveguides, or it may comprise a different material. The core material of the activation waveguide is preferably $SiO_2$ or may preferably be Si (e.g., either crystalline, polycrystalline, or amorphous), or can be any combination therebetween (e.g., $SiO_{2-x}$). The activation-core-material preferably has an index of refraction that is greater than the index of refraction of the active material and is preferably between approximately 1.45 and 4.0.

As will be appreciated by those skilled in the art, the dimensions of the activation waveguide can be selected depending on the specific choice of core and active material indices of refraction. In many cases, the core will have an index of refraction of between approximately 1.45 and 1.55. In this case, the waveguide will preferably have a substantially rectangular cross-section with a height and width less than about 50 microns, more preferably less than about 20 microns, and most preferably less than about 10 microns. The height and width can either be the same or different. In many preferred embodiments, the height will be less than the width. In one preferred embodiment, the width will be between approximately 3 microns and 6 microns, while the height will be between approximately 1 micron and 3 microns.

Figure 26E:
Figure 26F:
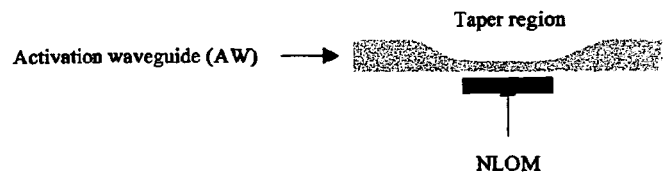

In an alternative embodiment, further improvements can be achieved by incorporating a second activation waveguide, positioned substantially parallel to the first activation waveguide but on the opposite side of the active region from the first activation waveguide. This configuration, which is illustrated in FIG. 26(e), allows the activation light to travel between the two waveguides, increasing the penetration of the activation light to about 1–2 microns within each of the waveguides (i.e., activating from both sides). In such a configuration, much of the active region of the switch can be efficiently illuminated in a substantially uniform and intense manner across substantially the entire length of the active region. In this embodiment, the activation waveguides typically should be spaced apart by a distance between approximately 1 micron and 20 microns, more preferably between approximately 1 micron and 10 microns, and most preferably between approximately 4 microns and 10 microns. In a preferred embodiment, the activation waveguides are spaced apart by a distance equal to or greater than the width of the signal-waveguides. The two activation waveguides are preferably mirror images of each other. Alternatively, each activation waveguide can be configured differently. If desired, one or both of the activation waveguides can include a taper region.

It is not necessary that the activation waveguide(s) be-oriented in any particular way relative to the switch waveguides, merely that the evanescent electromagnetic field extending from the core of one or both of the activation waveguides sufficiently interacts with the nonlinear material in the active region. Such a structure can be made in a variety of ways, including both symmetric and asymmetric configurations, with regard to the location of the activation waveguides, the active region, and the switch waveguides. It is preferable, however, that the coupling region between the activation waveguides and the active material (or each other) be oriented substantially orthogonal to the interaction direction between the switch waveguides.

In a preferred embodiment, a trigger signal can be a header-pulse split from a data-stream for optical routing. Alternatively, this pulse can be any type of optical pulse traveling between switches in an optical network.

Alternatively, the activation light, which is not substantially attenuated during the transit across the active region, can be recovered after switching and either be recombined with the data-packet or be routed to activate an additional switch.

c) In an alternative embodiment, a trigger signal can be provided by a light-source such as a diode or laser resulting in an illumination of the nonlinear material of the switch from the top, bottom, or sides. The timing and sequence of the trigger-pulse are controlled by logical electronic signals.

In one preferred embodiment, the light-source is a VCSEL (vertical cavity surface emitting laser). In a particularly preferred embodiment, the VCSEL is fabricated on a substrate separate from the waveguide. The VCSEL substrate is then positioned upside down over the optical switch, such that the VCSEL is located over the active region. Alternatively, the VCSEL may be fabricated and the optical switch fabricated directly on top of it (e.g., with the VCSEL as the substrate).

Alternatively, embodiments can comprise an array of VCSELs and an array of switches (n×m where n denotes the number of inputs and m denotes the number of outputs) such that an entire optical circuit can be created. In this implementation, the location of the switching elements in the array and the VCSELs in the array are positioned such that one or more of the VCSELs can illuminate an active region from the top or bottom. Each VCSEL can be activated independently or together and can be controlled by logical signals to create the desired optical path. The implementation of these arrays of both the active regions and the VCSELs can be application specific.

A similar design can be used with a variety of devices and systems, such that each individual device can be combined with 1 or more VCSELs to act as the trigger-pulse.

In the above embodiments, it is possible to provide feedback to the VCSELs such that dynamic trimming and control are provided. For instance, a switch could be designed to incorporate a photodiode at one or both outputs of the device such that a small amount of the light passing out one or both outputs is detected. This could be achieved by using a 99:1 splitter in front of the photodiode. If the relative signal along one of the outputs is higher than the other, feedback can be applied to the VCSEL such that the intensity is modulated to maximize the signal in that output or minimize the signal in the other. On the other hand, if the signal in the other output is higher, the signal can be optimized the other way around. In this way, the exact intensity of the VCSEL for each switch position does not need to be known before hand and can be determined at the time the switch is used. Alternatively, part of the assembly process can be to run every switch in both positions and manually or automatically tune the VCSEL for optimum discrimination at each position. This would only need to be done once. Using this procedure, an identical set of switches can each be independently tuned for desirable function at a variety of different wavelengths.

Generic Optical Device

Another device that can be made from the materials of embodiments of the present invention is a device that acts as an arbitrary, generically configurable switch. This is typically a single optical component that can be fabricated on a large scale and then be used in a variety of different ways to produce different devices. By having a single generic device, significant savings are realized in keeping appropriate levels of stock available for every part of an optical network.

The generic device comprises a generalized MZ switch, comprising two multi-mode-interaction devices (MMIs). The device comprises N single-mode input waveguides that lead into a first MMI at different locations along one side. On the opposite side of the first MMI, M single-mode connecting waveguides lead from the first MMI to a second MMI, each entering at different locations along one wall of the second MMI. Finally, on the opposite wall of the second MMI, O single mode output waveguides lead away from the device. N, M and O, as well as any combination thereof, may be equal or unequal in value. The widths of the input, connecting, and output waveguides may be equal or unequal, as can the waveguides within each category. The lengths of the connecting waveguides may be the same or different.

In a preferred embodiment, an engineered nonlinear nanocomposite material is placed within at least one segment of one or more of the connecting waveguides. Alternatively, the nanocomposite material may be placed around one or more of the connecting waveguides. Optionally, the nanocomposite material may be placed within at least a portion of the first MMI, second MMI, or both.

By selecting the lengths and spacing of the MMIs and the connecting waveguides, it is possible to create a generic device capable of acting as an N×O cross-connect, an optical filter, a wavelength demultiplexer, and a variety of other devices. Control of the device can be achieved by illuminating the active material in any one or all of the connecting waveguides and modulating the interference of the different outputs into the second MMI. The effective length of the first and/or second MMI can be changed by illuminating the active material in those regions.

By sending a single multi-wavelength signal into one of the input waveguides, the wavelengths can be separated in a way similar to an Arrayed Wave Guide (AWG). Rather than using differences in connecting length, differences in illumination intensity in the connecting region can be substituted. By connecting only one of the output waveguide to an outside device, modulation of the phase in the connecting regions can be used to control which wavelength is routed to the active output waveguide. In this way, the system acts as a tunable optical filter.

By sending a single wavelength into one input waveguide, the single wavelength can be modulated to any combination of output waveguides by controlling the phases in the connection region. Similarly, multiple signals can be sent to two or more of the input waveguides and switched to any one or more of the output waveguides in a similar manner. By independently controlling the index of refraction in the MMI regions and in the connecting regions, it is possible to create an arbitrary configuration for this generic optical device.

FIGS. 27(a) through 27(d) illustrate generic optical devices according to some embodiments of the invention. The lines represent optical waveguides, and the squares represent multimode interferometers (MMIs), where multiple optical modes can propagate and interfere with each other. The darkened sections represent locations including an engineered nonlinear nanocomposite material. In FIG. 27(a), the nanocomposite material is placed in connecting waveguides. In FIG. 27(b), the nanocomposite material is placed in a cladding in a connection region. In FIG. 27(c), the nanocomposite material is placed in MMIs and in connecting waveguides. In FIG. 27(d), the device illustrated in FIG. 27(c) is illuminated with one possible illumination pattern, where the light sections represent illuminated sections of the nanocomposite material.

Tunable Waveguide Filter

The above-defined generic device can also be designed with a single input to act as a wavelength demultiplexer. The operation of a AWG is based on the recombination of phased versions of equal splits of the input signal. Full control of the phase of each individual split (in the phased array) is typically sufficient to separate one single wavelength from the rest at the output free propagation region.

Optical Regenerator

Another device utilizes the intensity dependence of spectral broadening due to self-phase modulation to perform optical reshaping. Assuming the majority of a pulse energy is in the undistorted portion of a data pulse, one can use a high-pass (or low-pass) filter to separate the self-phase modulation shifted spectra due to the desired portion of the data pulse and block less-shifted spectral components due to the lower intensity distortions in the data pulse.

One method of producing this self-phase modulation is to utilize long lengths of silica fiber after amplification. Due to the relatively low $n_2$ at typical intensities used in telecommunications, this requires relatively long lengths of the fiber (typically kilometers of the fiber are required to produce a desirable effect). Using an engineered nonlinear nanocomposite material, one can increase $n_2$ and thus decrease the length of nonlinear material required to produce self-phase modulation. Thus, this type of signal regenerator can be incorporated into photonic integrated circuits. A preferred planar waveguide self-phase modulation device comprising an engineered nonlinear nanocomposite material thus represents a substantial improvement. Even in a fiber-optic based self-phase modulation device, lengths can be dramatically reduced.

Micro-Ring Array Switches

Another device utilizes field enhancement due to constructive interference of fields and an effective interaction length enhancement using a micro-ring structure to make all-optical switching using quantum dots more effective. The enhancement is primarily due to multiple round trips (cavity lifetime) in a ring resonator. Use of nonlinear optical materials with large nonlinearities (e.g., $n_2$) will allow the resonator size to become smaller, thereby improving the temporal response of the all-optical switch, which is typically determined by the number of round trips. In addition, smaller devices allow for integration of devices of multiple functionality.

In an alternative embodiment, a micro-ring can be combined with an engineered nonlinear nanocomposite material to form a tunable filter. This device comprises a micro-ring with an engineered nonlinear nanocomposite material incorporated into a coupling region between a transmission waveguide and the micro-ring. Alternatively, an engineered nonlinear nanocomposite material can additionally be incorporated into the ring itself. In this case, the nanocomposite material may either be located within the waveguide core of the ring or in the ring cladding. By changing the index of refraction of the nanocomposite material in the coupling region, the finesse of the ring can be modified, increasing or decreasing the bandwidth of the optical filter. By changing the index of the nanocomposite material within the ring, the effective ring-size is changed, adjusting the center wavelength of the filter.

Digital Optical Switch

Due to the inherent sensitivity of interferometers, they typically tend to be wavelength, polarization, temperature, and dimension sensitive. An alternative is to use a digital optical switch, i.e. a switch that is ideally fully or substantially on with the application of an input signal. In general, this class of switch typically requires more switching power (or the devices are longer) and may be higher loss than interferometric optical switches due to the need for adiabatically coupling light from one waveguide to another. One example is to use an adiabatic Y-branch, where an appropriate index increase at the junction can cause light to propagate into one of two waveguides after the junction. Another example is to use an asymmetric nonlinear directional coupler, where one arm of the nonlinear directional coupler experiences an increase in index that makes that arm preferentially guiding. Both of these examples typically require illumination of the nonlinear optical material from the top. As a result, there is little leakage of light. Alternatively, a control pulse can be brought in with a waveguide in close enough proximity to the Y-branch such that the evanescent tails of the control beam can affect a cladding layer of one arm of the Y-branch so as to cause preferential guiding into the appropriate arm. A similar approach involves using an arrayed waveguide by affecting a cladding of one of the arms to cause switching.

Absorptive Modulator

Quantum dots can have extremely large intraband absorption cross-sections. An intraband transition typically occurs when a quantum dot is resonantly excited, and the resulting electron-hole pair can be subsequently excited by a photon into a higher excited state. Due to the quantized nature of the excited states in quantum dots, the materials described herein can be used to make a novel type of tunable absorptive modulator. This modulator can have an extremely large dynamic range that represents a substantial and surprising improvement.

One embodiment of the current invention relates to using resonant optical excitation to modulate the level of absorption of a light beam. In this embodiment, photons that are higher in energy than the bandgap of the engineered nanocomposite material are used to excite electron-hole pairs that subsequently absorb photons at the wavelength of a second beam. The size and material of the quantum dots used can be selected so as to minimize or reduce direct absorption of the second beam by quantum dots in the ground-state. As the intensity of the resonant excitation increases, the level of absorption of the second beam typically increases. Due to the extremely large intraband cross-sections that can exist, extremely large modulations are obtainable. In a preferred embodiment, the engineered nanocomposite material is selected such that the energy of at least one intraband transition from the lowest excited state substantially matches that of the wavelength range-of-interest for the second beam. Optionally, the size distribution can be selected such that the distribution of intraband transition energies covers a large wavelength range-of-interest, preferably greater than 100 nm around 1550 nm or 1300 nm. Alternatively, the size distribution is optionally selected such that only a small subset of wavelengths are absorbed, preferably less than 50 nm, more preferably less than 25 nm around 1550 nm or 1300 nm.

In one embodiment, the engineered nanocomposite material is incorporated into a waveguide core such that a second beam transmitted along the core is attenuated in the presence of a resonant beam, with the level of attenuation related to the intensity of the resonant beam. Optionally, the second beam is not significantly attenuated in the absence of a trigger signal, preferably less than about 10% attenuation, and more preferably less than about 5% attenuation.

In an alternative embodiment, the nanocomposite material is incorporated into an optical fiber core. Alternatively, the material is incorporated into a cladding of a waveguide or fiber optic. Alternatively, the material is incorporated into a free-space optical system.

In a preferred embodiment, a resonant light and a second beam are independently selectable from the list of a trigger signal, a data signal, and another signal. The resonant and/or second beam are independently selectable from the list of a CW signal, a non CW signal, and a pulsed signal. In a particularly preferred embodiment, the device corresponds to a wavelength converter, e.g., the data on a control beam of one wavelength is substantially imprinted on a signal beam at another wavelength.

Preferably, a resonant beam is of shorter wavelength than a second beam. Optionally the wavelength of the resonant and second beam are the same. Alternatively, the resonant beam is of longer wavelength than the second beam, such that the resonant beam undergoes significant 2-photon absorption in the active material.

Alternatively, quantum dots within the engineered nanocomposite material are excited electrically, such that attenuation of a second beam is related to the level of quantum dot charging within the nanocomposite material. Optionally, a matrix material of the engineered nanocomposite material comprises a conducting material. Conducting matrix materials include, but are not limited to, conducting polymers, conducting glasses, semiconductors, metals, or clear conductors such as indium tin oxide.

Alternatively, quantum dots are excited thermally, resulting in attenuation of a second beam. Optionally, the quantum dots are excited by cathodo-excitation. Alternatively, the quantum dots are excited chemically.

Integrated Optical Pump for Quantum Dot Lasers and Amplifiers

Conventional quantum dot based lasers and amplifiers typically suffer from a lack of an efficient means of electrical excitation. One means around this problem is to find an efficient and inexpensive method of optically exciting quantum dots for use as lasers and amplifiers. A novel type of SOA comprises a pump laser (e.g., a 980 nm pump lasers for EDFAs), a device configured to focus a pump beam, and a nanocomposite material according to some embodiments of the invention. This configuration could potentially find application wherever SOAs are currently being considered (e.g., inexpensive multi-wavelength amplifiers, all-optical switches, and wavelength converters, etc.). Additionally, an optically pumped quantum dot laser would require a pulsed laser source (to overcome fast Auger recombination) and a device for producing a laser cavity.

Resonant Index Change

Many optical switching applications for a engineered nonlinear nanocomposite material can be used close to a one-photon resonance as well. However, losses due to absorption can occur. One way around this is to utilize the nonlinearity in the presence of gain, e.g., use inverted quantum dots. Ideally, an efficient method of injecting and extracting charge from the quantum dots is used. This may be performed by altering the surface chemistry by, for example, attaching conducting polymers or molecular wires to the quantum dots. Alternatively, optical excitation may be used to utilize the resonant index change.

Preferred Waveguide Structures

The following devices and structures are structures for use in optical waveguides:

2D and 3D Tapered Waveguides

In order for a waveguide system to be coupled into an optical network, it is generally desirable to attach a traditional cylindrical fiber to the edge of the planar circuit. To minimize or reduce coupling losses between the cylindrical fiber modes and the rectangular waveguide modes, the planar waveguide at the interface is preferably substantially square-shaped with dimensions similar to that of the fiber (the absolute dimensions for optimal coupling typically depend on the index difference between the waveguide core and cladding). For telecom single mode fiber (with core diameter between approximately 8 μm and 9 μm) and a typical planar waveguide index difference of ~0.7%, an optimal waveguide dimension to match the fiber is around 6 μm×6 μm.

In many devices, device length is typically the fundamental limit to the number of devices that can be fit on a single chip (and hence sets the maximum optical circuit complexity that can be achieved). Depending on the structures used, waveguide width can have a dramatic impact on device length, as it significantly impacts the amount of evanescent coupling into a surrounding cladding. A directional coupler created with 6 μm wide waveguide cores will typically be more than twice as long as one made with 4 μm wide waveguide cores (assuming a uniform core height of 6 μm and separation distance of 4 μm).

Another important factor for devices based on engineered nonlinear nanocomposite materials is the fact that smaller waveguides typically concentrate optical energy, thus increasing intensity and enhancing the nonlinear response of the devices.

To address this situation, embodiments of the invention relate to a waveguide structure that comprises a waveguide taper (e.g., a region in which the waveguide dimensions are slowly (e.g., adiabatically) transitioned from one set of dimensions to another). Horizontal tapers can be manufactured using standard lithographic techniques. Vertical tapers, however, are another matter.

One embodiment of the present invention relates to a vertical taper and methods for formation thereof. Other embodiments of the present invention relate to a 3D taper comprising a vertical taper, a horizontal taper, and methods of fabrication thereof.

In a preferred embodiment, a vertical taper is fabricated by imprinting a tapered resist mask onto a waveguide and then transferring it into silica to create a vertically tapered waveguide. In combination with a vertical resist taper in the resist mask and a lateral taper in the resist mask, a 3D tapered waveguide is formed.

In this preferred embodiment, vertical tapers are manufactured using a "graded etch" where a layer of photoresist is partially exposed such that it will have higher resistance to etching in areas that should be thicker. A graded etch can be achieved by exposing resist through an aperture grid, with the aperture size and/or grid spacing defining the grade and exposure levels. In this embodiment, the mask may optionally be defocused to create a uniform gradation between the apertures. Then, a substantially uniform etching process will remove more material from regions in which the resist is less resistant, leading to horizontal gradients in layer thickness.

In yet another preferred embodiment, a standard resist is used with a mask with a variable density of non-imaging structures in a waveguide area. This results in a difference in the photon flux reaching the resist, yielding a differential rate of dissolution in the developer. The result is a taper in the vertical direction. This taper can then be transferred to the underlying silica using, for example, etch techniques or implant etch techniques. In the etch technique, the etch rate of the photoresist and the underlying silica are adjusted to be substantially equal using various process parameters that may include but are not limited to pressure, composition, power, and temperature. Hence, when this stack is etched under the above conditions, a tapered waveguide is formed. Using an implant technique, a taper is used to implant a species to different depths within a layer. Subsequently the layer is etched, and the taper of the mask is transferred to the underlying silica.

Tapered & Graded Claddings

Transitioning from one cladding material to another can be important in many devices. For instance, a doped silica cladding can be used for efficient coupling at a fiber-waveguide interface and then be transitioned to an air cladding in order to minimize or reduce losses due to tight waveguide bends. This cladding may then transition to a third material comprising an active material for a device. Abrupt transitions in index of refraction in either the cladding or waveguide core can lead to excitation of higher-order optical-modes that can degrade the performance of many integrated optical devices. Current fabrication techniques typically make it difficult to introduce a longitudinal gradient in the index of refraction of the cladding.

Figure 28A:
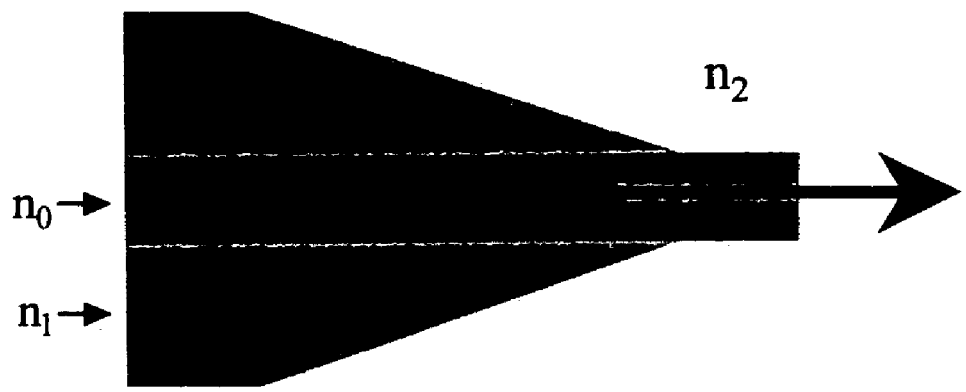
FIGS. 28(a) and 28(b) illustrate tapered claddings in accordance with some embodiments of the invention.
Figure 28B:
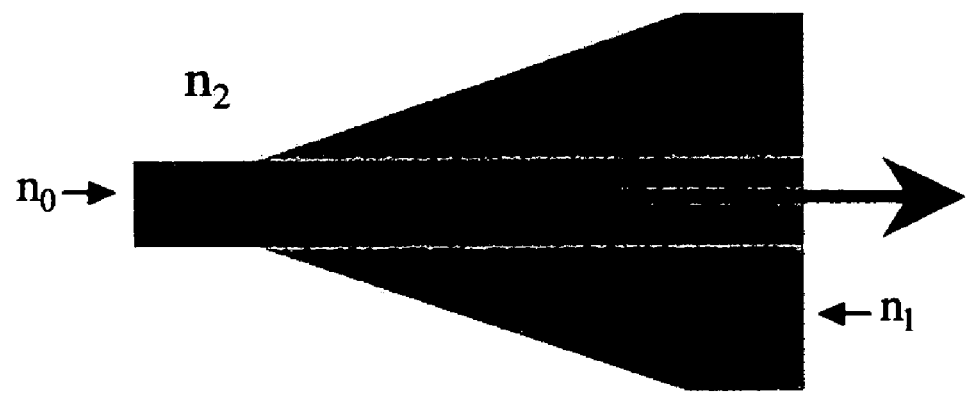

To facilitate such transition, embodiments of the invention relate to a waveguide structure including a tapered cladding to transition between cladding regions of different materials. FIGS. 28(a) and 28(b) illustrate two examples of tapered cladding according to an embodiment of the invention. Here, the arrow signifies the direction of propagation of light. The region of index no represents an optical waveguide, while regions of index n, and $n_2$ represent the cladding regions surrounding the waveguide. The direction of the taper is typically chosen such that the lower index cladding resides farthest away from the core. The taper desirably should be sufficiently long for adiabatic coupling (e.g., between approximately 200 μm and 10000 μm, preferably $\geq$500 μm). Vertical cladding tapers may be achieved using the same techniques described for vertical waveguide core tapers above. Neither the waveguide nor the taper need be straight; however, it is preferred that the taper thickness be varied substantially monotonically with distance.

Alternatively, it is possible to combine cladding tapers with waveguide core tapers to facilitate shorter taper lengths while retaining an adiabatic transition. By properly selecting the initial and final waveguide sizes, the initial and final cladding indices of refraction, and using a tapering of the core and cladding (e.g., a simultaneous tapering of the core and cladding), a substantially adiabatic transition can be created over distances vertically and laterally shorter (sometimes significantly shorter) than are achievable using either a waveguide core taper or cladding taper alone. In a preferred embodiment, the tapered core and cladding are designed so that the evanescent leakage of an optical mode within the core remains substantially unchanged as light travels from one end of the taper region to the other. In one embodiment, the transition can be substantially abrupt.

A Bragg Antireflective Waveguide Grating

There are many benefits of using silicon as a waveguide core material. The primary advantage is that sharper (sometimes much sharper) bends are possible with minimal or reduced losses. This results in substantially smaller devices, and thus a higher level of integration is possible, e.g., on a chip. One potential problem is that a signal will usually originate from a silica-core fiber. The Fresnel-reflection from a silica/silicon dielectric interface ($n_{SiO2}$:$n_{Si}$=1.45:3.4) is equal to $[(3.4-1.45)/(3.4+1.45)]^2$=16%. This can be prohibitive if multiple switches are to be interconnected by silica fibers.

To reduce reflection losses, an antireflective coating can be formed at the silica/silicon interface by creating a Bragg grating in the silicon waveguide just inside the interface. In a preferred embodiment, such a Bragg-grating can be formed by creating a periodic spacing that creates an antireflective coating for the wavelength range-of-interest by etching and filling the waveguide with a series of lower- or higher-index layers. This is similar to what is described for the tunable waveguide grating above; however, it is may be unnecessary to use a nonlinear material. For instance, it may be possible to simply oxidize alternating sections of a silicon waveguide core to form the short- or spacer-sections of an antireflective waveguide core.

In another embodiment, tapering of the silica waveguide can increase coupling with the optical fiber. A Bragg grating can be used to transition the silicon waveguide to provide higher levels of integration and then transition back to silica waveguide for coupling to an optical fiber at the other end.

Monolithic Micro-Optical-Bench

Another device according to some embodiments of the current invention is a micro-scale, free-space optical bench fabricated from monolithic silicon. This device comprises a piece of monolithic silicon or other substrate material that can be anisotropically etched. By etching into the substrate, 3D structures can be formed by creating a plurality of angles and shapes, each potentially forming an individual optical component. The material of the substrate is optionally reflective in the wavelength range-of-interest and optionally can be coated selectively to produce reflectivity with desired properties on specific structures. In certain cases it is desirable for the material to be transparent to the wavelength desired, and when a coating of the appropriate thickness is applied, various ratios of the reflected to transmitted beam can be realized, including but not limited to a 3 dB splitter. By combining the elements of the micro-optical bench, a plurality of free-space optical configurations can be created, including but not limited to an anti-resonant ring.

Linear Arrayed Wave Guide

Another device according to some embodiments of the present invention is a novel arrayed waveguide device in which the lengths of two or more (e.g., all) connecting waveguides can be the same. For a typical arrayed waveguide, the lengths of the connecting waveguides are varied to create phase differences in each waveguide. In some embodiments, different effective lengths can be created within same or substantially same length waveguide cores by inserting different lengths of a second index of refraction. By substituting a segment of each waveguide with a higher index material, the effective length is changed. To replicate the phase change of a standard arrayed waveguide, segments of different lengths can be inserted into each waveguide, such that the effective lengths of the waveguides match the actual lengths in a traditional arrayed waveguide device. For other embodiments, a nonlinear material can be incorporated in a cladding and/or in two or more connecting waveguides, and the nonlinear material can be irradiated to create different effective lengths. In one preferred embodiment, as illustrated in FIG. 29(a), this is achieved by incorporating a nonlinear material in a cladding in the connection region and illuminating the cladding in a pattern, such that, for example, the largest illuminated segment is adjacent the top waveguide, the next largest illuminated segment is adjacent the second waveguide, and so forth. In another preferred embodiment, as illustrated in FIG. 29(b), this is achieved by doping the waveguides with a material such as germanium and illuminating a defined region of each waveguide, such that, for example, the largest illuminated segment is in the top waveguide, the next longest is in the second waveguide, and so forth. Alternatively, as illustrated in FIG. 29(c), a segment of silicon can be inserted into a silica waveguide structure in order to reduce the length of the device. In this case, reflection loss may occur due to the index change at each interface; however, the loss along each channel is the substantially the same, yielding a device with the substantially the same performance as a traditional device.

One of skill in the art will recognize that there are a variety of ways in which to modify the index of refraction such that the length of the connecting waveguide remains the substantially the same, but the effective lengths are different. With such a device, it is possible to make an arrayed waveguide device that is substantially shorter and can be fabricated in a substantially straight line within an optical circuit.

Additional Devices

Figure 30:
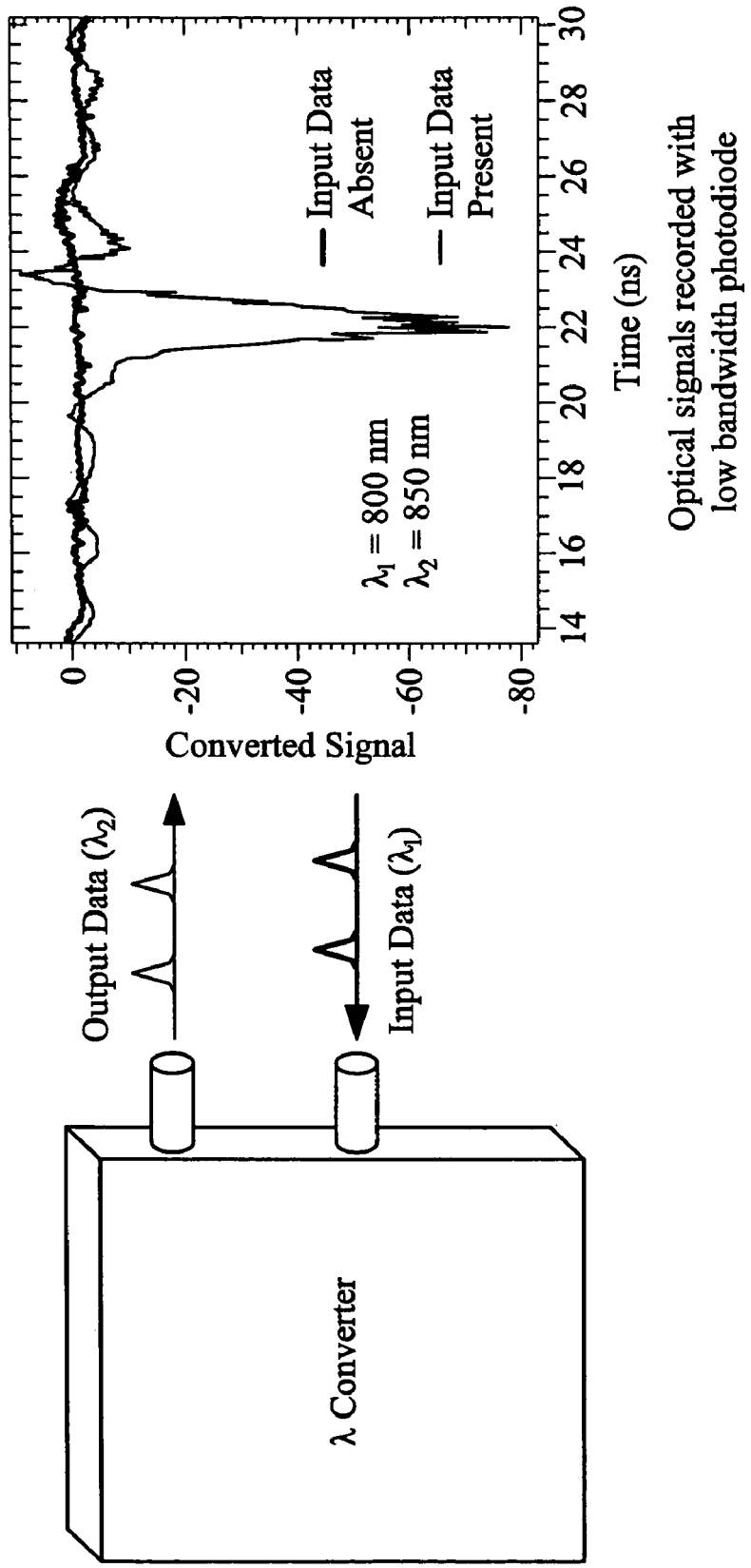
FIG. 30 illustrates all-optical wavelength conversion using an engineered nonlinear nanocomposite material of an embodiment of the invention.

FIG. 30 illustrates all-optical wavelength conversion using an engineered nonlinear nanocomposite material of an embodiment of the invention. In the plot, the vertical axis represents photodiode signal of detected light that has passed through an appropriate filter, and the horizontal axis represents real time.

Figure 31:
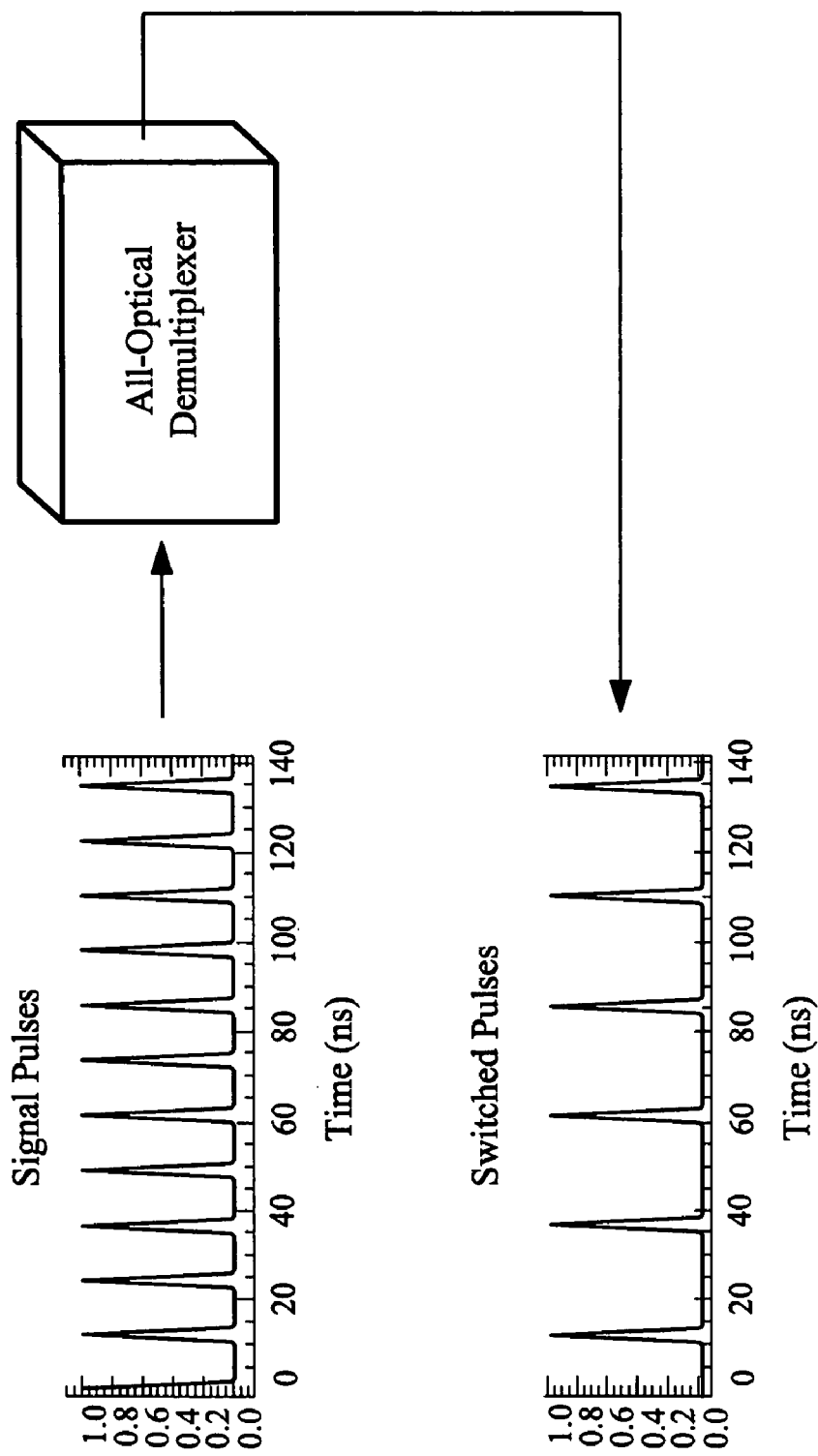
FIG. 31 illustrates all-optical demultiplexing for TDM systems using an engineered nonlinear nanocomposite material of an embodiment of the invention.

FIG. 31 illustrates all-optical demultiplexing for TDM systems using an engineered nonlinear nanocomposite material of an embodiment of the invention. In the plots, the vertical axis represents photodiode signal of detected light, and the horizontal axis represents real time. FIG. 31 represents a passive demultiplexer, e.g., no control beam is required.

Figure 32:
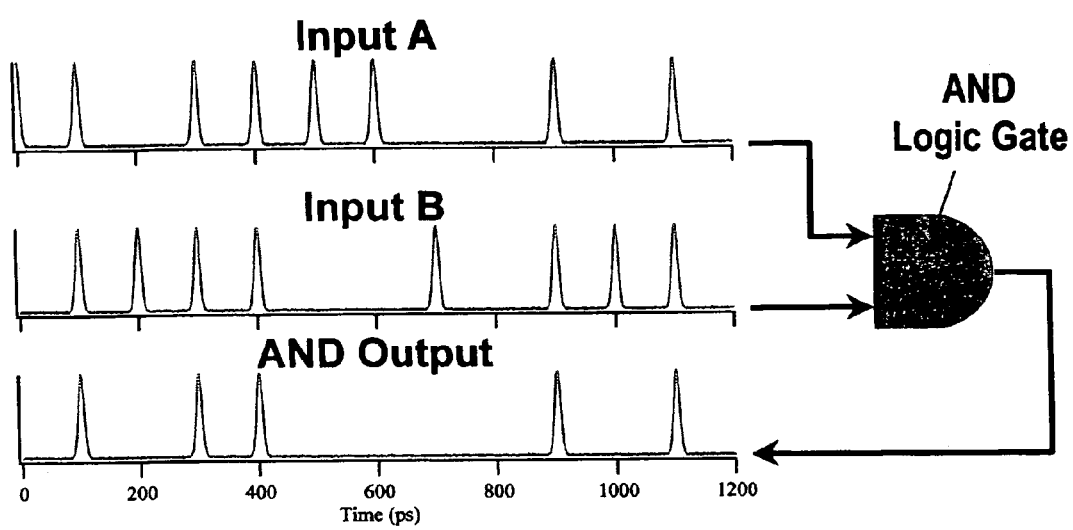
FIG. 32 illustrates an all-optical AND logic gate (also wavelength converter) using an engineered nonlinear nanocomposite material of an embodiment of the invention.

FIG. 32 illustrates an all-optical AND logic gate (also wavelength converter) using an engineered nonlinear nanocomposite material of an embodiment of the invention. In the plots, the vertical axis represents photodiode signal of detected light, and the horizontal axis represents real time.

At this point, one of ordinary skill in the art will recognize various advantages associated with some embodiments of the invention. Embodiments of this invention provide a method of synthesizing nanocrystalline materials. Embodiments of the invention also provide a method of synthesis that produces quantum dots with organically functionalized surfaces and a method of synthesis that produces quantum dots with surfaces passivated with oxide. Embodiments of the invention provide a method of synthesis that is safe, energy efficient, scalable, and cost-effective. Embodiments of this invention also provide a method of synthesis that employs environmentally benign starting materials or commercially available or readily prepared materials. Advantageously, embodiments of this invention provide a method of synthesis that results in high yield and a method of synthesis that results in very soluble and processable products. Also, embodiments of the invention provide a method of synthesis that results in highly crystalline material and that yields quantum dots with a narrow size distribution, such as with a dispersion of the size distribution is less than 15% rms. Embodiments of this invention provide a method of synthesis that yields quantum dots with narrow shape distribution and a method of synthesis that produces quantum dots that are uniform in composition. In addition, embodiments of the invention provide a method of synthesis that produces quantum dots that are uniform in surface chemistry.

Each of the patent applications, patents, publications, and other published documents mentioned or referred to in this specification is herein incorporated by reference in its entirety, to the same extent as if each individual patent application, patent, publication, and other published document was specifically and individually indicated to be incorporated by reference.

While the present invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process step or steps, to the objective, spirit and scope of the present invention. All such modifications are intended to be within the scope of the claims appended hereto. In particular, while the methods disclosed herein have been described with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

What is claimed is:

1. An optical device comprising:
    a waveguide core including a portion formed of a nanocomposite material, said nanocomposite material including:
    a matrix material; and
    a plurality of quantum dots dispersed in said matrix material, a quantum dot of said plurality of quantum dots including a substantially crystalline core that includes a semiconductor material selected from the group consisting of Si and Ge, said quantum dot being substantially defect free such that said quantum dot exhibits photoluminescence with a quantum efficiency that is greater than 10 percent.

2. The optical device of claim 1, further comprising a cladding surrounding said waveguide core.

3. The optical device of claim 1, wherein said waveguide core includes a plurality of portions positioned at respective locations along a longitudinal axis of said waveguide core, said plurality of portions being formed of said nanocomposite material.

4. The optical device of claim 1, wherein said waveguide core is a first waveguide core, said optical device further comprising a second waveguide core optically coupled to said first waveguide core.

5. The optical device of claim 1, wherein said nanocomposite material has a nonlinear index of refraction $\gamma$ that is at least $10^{-9}$ cm$^2$/W when irradiated with light having a wavelength $\lambda$ between approximately $3 \times 10^{-5}$ cm and $2 \times 10^{-4}$ cm.

6. The optical device of claim 5, wherein $\gamma$ is at least $10^{-8}$ cm$^2$/W.

7. The optical device of claim 5, wherein said nanocomposite material has a figure-of-merit that is at least 1, said figure-of-merit being defined as $2\gamma/\beta\lambda$, where $\beta$ is a two-photon absorption coefficient of said nanocomposite material expressed in cm/W.

8. The optical device of claim 7, wherein said figure-of-merit is at least 1.5.

9. The optical device of claim 1, wherein said matrix material is selected from the group consisting of polymers and glasses.

10. The optical device of claim 1, wherein said nanocomposite material comprises more than 10 percent by weight of said plurality of quantum dots.

11. The optical device of claim 1, wherein said nanocomposite material comprises at least 40 percent by weight of said plurality of quantum dots.

12. The optical device of claim 1, wherein said plurality of quantum dots have a peak size between approximately 1 nm and 100 nm.

13. The optical device of claim 1, wherein said quantum dot further includes a shell surrounding said substantially crystalline core.

14. The optical device of claim 1, wherein said semiconductor material is Si, said shell including an oxide $SiO_n$ with n being between approximately 0 and 2.

15. The optical device of claim 1, wherein said semiconductor material is Ge, said shell including an oxide $GeO_n$ with n being between approximately 0 and 2.

16. The optical device of claim 1, wherein said quantum dot further includes a ligand layer surrounding said substantially crystalline core, said ligand layer including a plurality of surface ligands.

17. The optical device of claim 16, wherein a surface ligand of said plurality of surface ligands includes a first portion and a second portion, said first portion being coupled to said substantially crystalline core, said second portion being chemically compatible with said matrix material to facilitate dispersing said quantum dot in said matrix material.

18. The optical device of claim 1, wherein said quantum efficiency is at least 20 percent.

19. The optical device of claim 1, wherein said quantum efficiency is at least 50 percent.

20. The optical device of claim 1, wherein said semiconductor material is Si, said substantially crystalline core having a diameter between approximately 1 nm and 20 nm.

21. The optical device of claim 1, wherein said semiconductor material is Ge, said substantially crystalline core having a diameter between approximately 1 nm and 50 nm.

* * * * *